United States Patent
Snead et al.

(10) Patent No.: US 6,333,741 B1
(45) Date of Patent: Dec. 25, 2001

(54) BOOLEAN LAYER COMPARISON SLICE

(75) Inventors: David E. Snead, Canyon Country; Dennis R. Smalley, Baldwin Park; Adam L. Cohen, Los Angeles; Joseph W. Allison, Valencia; Thomas J. Vorgitch, Simi Valley; Thomas P. Chen, Saugus, all of CA (US)

(73) Assignee: 3D Systems, Inc., Valencia, CA (US)

( * ) Notice: Subject to any disclaimer, the term of this patent is extended or adjusted under 35 U.S.C. 154(b) by 0 days.

(21) Appl. No.: 09/215,793

(22) Filed: Dec. 18, 1998

Related U.S. Application Data

(63) Continuation of application No. 08/475,730, filed on Jun. 7, 1995, now Pat. No. 5,854,748, which is a continuation of application No. 08/259,333, filed on Jun. 13, 1994, now Pat. No. 5,481,470, which is a continuation of application No. 07/606,191, filed on Oct. 30, 1990, now Pat. No. 5,321,622, which is a continuation-in-part of application No. 07/331,644, filed on Mar. 31, 1989, now Pat. No. 5,184,307, which is a continuation-in-part of application No. 07/269,801, filed on Nov. 8, 1988, now abandoned, which is a continuation-in-part of application No. 07/182,830, filed on Apr. 18, 1988, now Pat. No. 5,059,359.

(51) Int. Cl.[7] .................................................. G06T 17/00
(52) U.S. Cl. ............................................. 345/423; 345/419
(58) Field of Search ...................................... 345/418, 419, 345/420, 421, 422, 423, 427, 428

(56) References Cited

U.S. PATENT DOCUMENTS

| | | | | |
|---|---|---|---|---|
| 5,604,849 | * | 2/1997 | Artwick et al. | 345/423 |
| 5,831,623 | * | 11/1998 | Negishi et al. | 345/424 |
| 5,883,630 | * | 3/1999 | O'Donnell et al. | 345/420 |
| 6,222,553 | * | 4/2001 | DeRose et al. | 345/423 |

\* cited by examiner

Primary Examiner—Cliff N. Vo
(74) Attorney, Agent, or Firm—Ralph D'Alessandro; Laura Bishop

(57) ABSTRACT

A method of and apparatus for slicing a three-dimensional object representation into a plurality of layer representations is described, wherein the layer representations are subsequently used to form the object layer-by-layer according to the principles of stereolithography. If not already provided in the object representation, a plurality of layer boundary representations are first formed, and then the boolean difference of successive layer boundary representations are computed to derive boundaries of up and down-facing regions, enabling different cure parameters to be specified for these different regions.

22 Claims, 30 Drawing Sheets

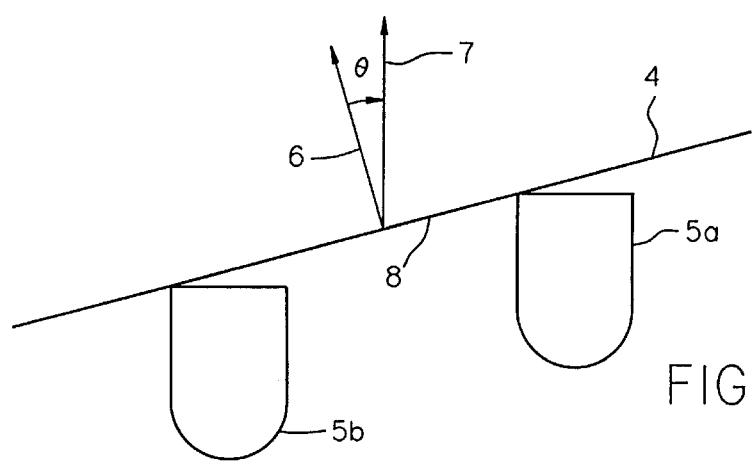
FIG. 2
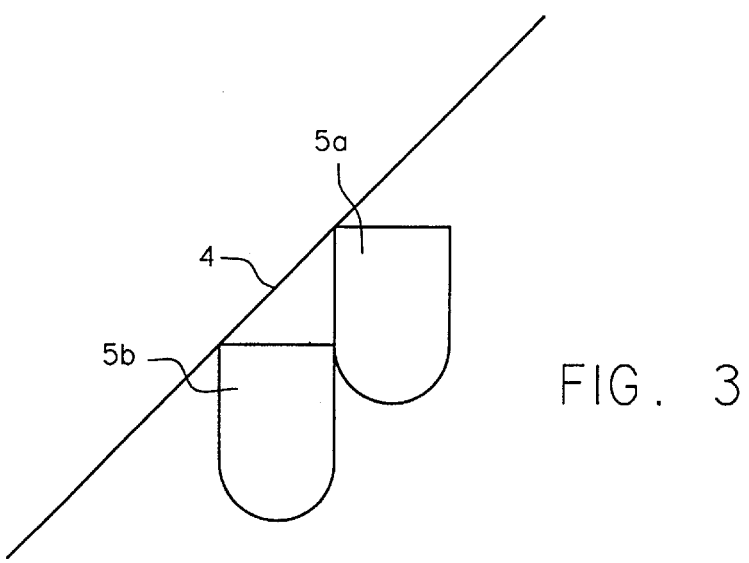
FIG. 3
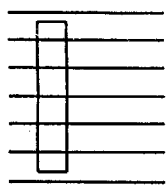 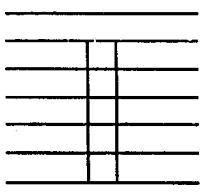 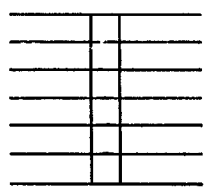 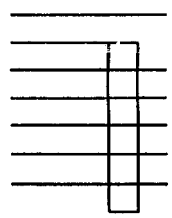
FIG. 4a　FIG. 4b　FIG. 4c　FIG. 4d

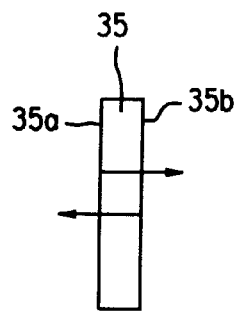
FIG. 14a    FIG. 14b
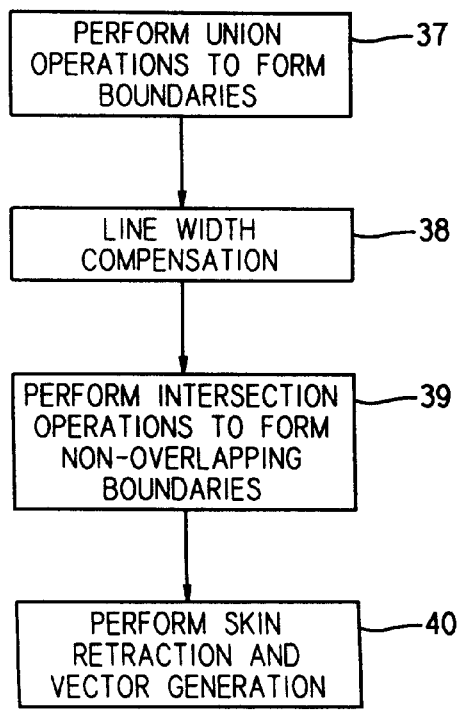
FIG. 15

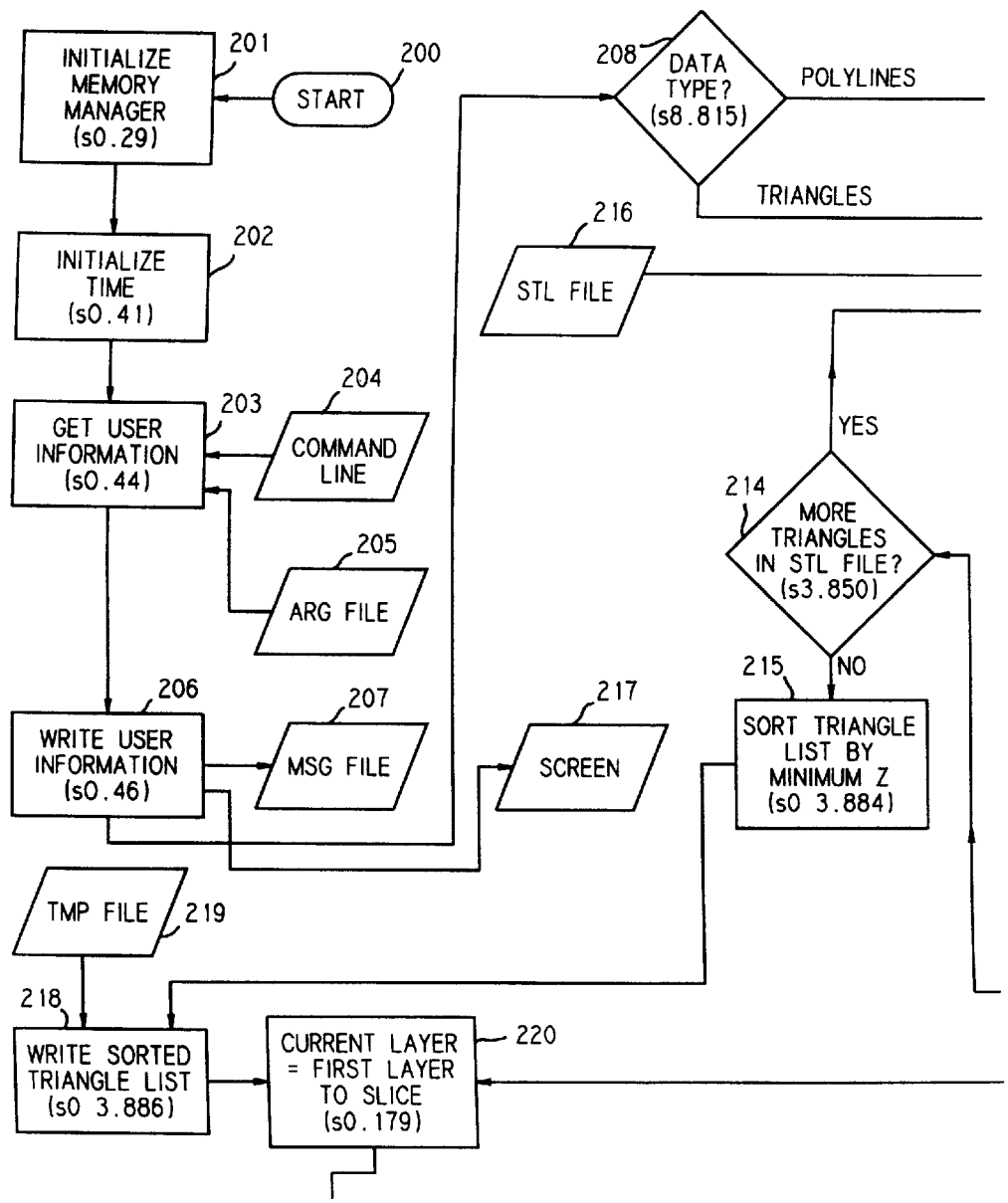

BOOLEAN LAYER COMPARISON SLICE

This application is a continuation of U.S. patent application Ser. No. 08/475,730, filed on Jun. 7, 1995, now U.S. Pat. No. 5,854,748, which is a continuation of U.S. patent application Ser. No. 08/259,333, filed on Jun. 13, 1994, now U.S. Pat. No. 5,481,470, which is a continuation of U.S. patent application Ser. No. 07/606,191, filed on Oct. 30, 1990, now U.S. Pat. No. 5,321,622, which is a continuation-in-part of U.S. patent application Ser. No. 07/331,644, filed on Mar. 31, 1989, now U.S. Pat. No. 5,184,307, which is a continuation-in-part of U.S. patent application Ser. No. 07/269,801, filed on Nov. 8, 1988, now abandoned, which is a continuation-in-part of U.S. patent application Ser. No. 07/182,830, filed on Apr. 18, 1988, now U.S. Pat. No. 5,059,359.

APPENDICES

The following two appendices are affixed to this application and are hereby fully incorporated by reference herein as though set forth in full:

Appendix A: A User's Manual for SLICE Version 46

Appendix B: A Software Source Code Listing for SLICE Version 47, comprising the following software modules: S0.C, S1.C, S2.C, S3.C, S4.C, S5.C, S6.C, S.H, SCHIRIS.MAK, and SMAKE.

BACKGROUND OF THE INVENTION

I. Field of the Invention

This invention relates generally to the slicing of a three-dimensional object representation into layer representations for subsequent use in the stepwise layer-by-layer formation of the three-dimensional object through application of the principles of stereolithography, and more specifically, to the slicing of the object representation into the layer representations utilizing boolean comparisons between the borders of successive layers.

II. Background of the Invention

Several building techniques have recently become available for building three-dimensional objects in layers. One such technique is stereolithography, which is described in U.S. Pat. Nos. 4,575,330 and 4,929,402 (hereinafter the '330 and the '402 patents), the disclosures of which are hereby fully incorporated by reference herein as though set forth in full. According to the principles of stereolithography, a three-dimensional object is formed layer-by-layer in a stepwise fashion out of a material capable of physical transformation upon exposure to synergistic stimulation. In one embodiment of stereolithography, layers of untransformed material such as liquid photopolymer or the like are successively formed at the working surface of a volume of the liquid photopolymer contained in a container. The untransformed layers are successively formed over untransformed material and previously-transformed material. The process of forming these untransformed layers is known as a recoating step, and is described in detail in Ser. No. 515,479 now U.S. Pat No. 5,174,931.

These layers are then selectively exposed to the synergistic stimulation to form successive object cross-sections. Moreover, upon transformation into the object cross-sections, the transformed material typically adheres to the previously-formed cross-sections through the natural adhesive properties of the photopolymer upon solidification. Additional details about stereolithography are available in the following co-pending U.S. patent applications, all of which, including appendices, are hereby fully incorporated by reference herein as though set forth in full:

| | | | |
|---|---|---|---|
| 186/175 | U.S. 415,168 | September 29, 1989 | Sekowski et al. |
| 186/168 | U.S. 429,911 | October 27, 1989 | Spence et al. |
| 186/171 | U.S. 427,885 | October 27, 1989 | Spence et al. |
| 188/275 | U.S. 428,492 | October 27, 1989 | Vorgitch et al. |
| 188/254 | U.S. 429,435 | October 30, 1989 | Hull et al. |
| 186/173 | U.S.S.N. not yet available | October 30, 1989 | Lewis et al. |
| 187/268 | U.S. 495,791 | March 19, 1990 | Jacobs et al. |
| 190/179 | U.S. 516,145 | April 27, 1990 | Allison et al. |
| 188/189 | U.S. 515,479 | April 27, 1990 | Almquist et al. |
| 187/296 | U.S. 545,517 | June 28, 1990 | Cohen |

Additional details of stereolithography are also available in two related applications which are being filed concurrently herewith. The disclosures of these two additional applications are hereby fully incorporated by reference herein as though set forth in full.

The first of these concurrently-filed applications is U.S. patent application Ser. No. 07/606,802, now U.S. Pat. No. 5,192,469, entitled "Simultaneous Multiple Layer Curing for Forming Three-Dimensional Objects," filed by Smalley et al. This application describes methods of building high resolution objects from traditionally low-resolution combinations of building materials and synergistic stimulation, which combinations result in a minimum effective cure depth which is typically too deep to form the thin layers required for high resolution objects. This objective is accomplished by delaying the exposure of those areas on a particular cross-section that would negatively impact resolution if those areas were immediately cured upon formation of the cross-section. Resolution may be negatively impacted, for example, if, because of the cure depth involved, material below this cross-section is inadvertently cured upon exposure of these areas. Therefore, to preserve resolution, exposure of these areas is delayed, and corresponding areas which are above these areas on higher cross-sections are instead subsequently exposed, after a delay if necessary, which higher cross-sections are chosen such that the cure depth is deep enough to cure the desired areas without inadvertently curing material on lower cross-sections.

The second of these concurrently-filed applications is U.S. patent application Ser. No. 07/605,979, now U.S. Pat. No. 5,209,878, entitled "Improved Surface Resolution in Three-Dimensional Objects by Inclusion of Thin Fill Layers," filed by Smalley et al. This application describes methods for forming high resolution objects by filling the surface discontinuities inherent in three-dimensional objects formed from stereolithography with thin fill layers. applications is Lyon & Lyon Docket 192/71 entitled "Stereolithographic Curl Balancing," filed by Vinson et al. This application discloses a method for reducing curl distortion by balancing normal curl with reverse curl. This referenced application discloses use of non-traditional cure depths and layer (or portion thereof) forming order to minimize curl distortion. The teachings of curl balancing can be applied to the instant invention as an example of other regions or block types that might be readily determined by the layer comparison Other embodiments of stereolithography employ materials besides photopolymers such as powdered materials, thermoplastics, dry film photoresists, non-reactive pre-formed films or sheets, all of which share the common characteristics that they are capable of physical transformation upon exposure to an appropriate form of synergistic stimulation. Moreover, a variety of types of synergistic stimulation are possible, other than UV radiation from a laser, including infrared or $CO_2$ laser radiation, visible radiation, particle beam radiation, reactive chemical agents dispensed from ink jet type printing heads (e.g., binders and initiators) and the like. In addition, various means for selectively exposing the untransformed layers of material are possible, including rotatable scanning mirrors or the like for directing a beam of the synergistic stimulation to trace out the shape of the object layers on the untransformed layers, means such as a mask for selectively applying flood exposure to the untransformed layers, means such as a light valve, imaging system or the like, and xy tables for translating a dispenser for chemical synergistic stimulation or the like.

Various means of performing the recoating process are possible. The '330 patent describes the use of a platform coupled to a Z-stage elevator to overdip a previously-formed layer beyond the working surface as an expeditious means to perform recoating. U.S. patent application Ser. No. 07/515, 479, now U.S. Pat. No. 5,174,931, describes the use of a doctor blade to speed up the recoating process. U.S. patent application Ser. No. 07/495,791 now abandoned describes the use of vibrational forces to speed up the recoating process. Additional approaches, which are possible, include dispensing pre-formed sheets or films over a previously-formed layer from a roll or cartridge dispenser. Also, various means of moving the partially-formed part relative to the working surface, besides a platform coupled to a z-stage elevator, are possible, including means for adding or extracting material from the container, or means for moving the container relative to the partially-formed part. Also, various other means of adhering the layers together besides the natural adhesive properties of the material being used are also possible, including pressure or heat sensitive adhesives or the like.

As can be seen from the above description, a wide variety of embodiments are included within the term "stereolithography," all having the common characteristic of being capable of forming a three-dimensional object in a step-wise layer-by-layer fashion.

As described in U.S. Pat. No. 5,184,307, a stereolithography system will typically form a three-dimensional object in accordance with a corresponding object representation, which representation may be formed in a CAD system or the like. Before such a representation can be used, however, as described in Ser. No. 331,644, it must be sliced into a plurality of layer representations. The stereolithography system will then, in the course of building up the object in a stepwise layer-by-layer manner, selectively expose the untransformed layers of material in accordance with the layer representations to form the object layers, and thus, the object itself.

Previous methods of forming the layer representations suffered from a number of disadvantages, however.

First, these methods typically do not make direct use of an object representation generated from a CAD system. Instead, these methods typically require that the object representation be placed into an intermediate format, i.e., a tesselated triangle format, before being useful to the stereolithography system. Because of this limitation, these methods do not have wide applicability, and can only be used with those CAD systems which have the capability of formatting the object representation appropriately. As a result, they are not presently capable of directly utilizing object representations such as CAT scans or the like, which may originate from systems presently incapable of formatting the object representations into the required format.

A second problem with these methods is that they typically assume, in furtherance of achieving computational simplicity, that all portions of a layer will overlap, and therefore, adhere to a previous layer. Therefore, because it is advantageous to slightly overcure these overlapping areas by about 6 mils beyond the specified layer thickness, these methods will overcure all portions of a layer, even those portions that do not overlap previous layers, such as down-facing regions. The result is that part accuracy, and part aesthetics, are negatively impacted, especially at the down-facing regions.

A third problem with these methods is that they are typically inflexible, being capable of specifying either an oversized object or an undersized object, but not both.[1] However, for certain objects, only one of these techniques will be possible. For example, for a complex object, it may be impossible to sand certain, inaccessible areas, so that the undersized technique is the only reasonable one. Therefore, for these objects, past methods have not provided necessary flexibility.

[1] As explained in Ser. No. 331,644, building an oversized or an undersized object enables the surface discontinuities inherent to stereolithography to be smoothed out in a subsequent post-processing step.

A fourth problem with these methods is that they sometimes introduce a vertical registration problem into a part. As explained in U.S. Pat. No. 5,184,307, in furtherance of the interest of computational simplicity, these methods generally create the borders of each layer representation at a vertical position slightly offset from the rest of the layer representation.[2] By doing so, each object layer, once built, will be offset one layer thickness downwards from the corresponding object representation. That is, it will not be correctly vertically registered with the part. Normally, this misregistration will not be a problem if the layer thickness for all object layers is the same, since all object layers will be shifted downwards by the same amount. However, if two object representations are sliced with two different layer thicknesses and then merged and built simultaneously, then each individual object will be vertically shifted downwards by a different amount causing these individual objects to become incorrectly vertically registered relative to each other.

[2] This ensures that the correct number of layer representations are formed. If the borders were to be created at the same vertical level as the rest of the layer, then one too many layer representations would generally be formed.

This problem can be explained more fully with the aid of FIGS. 1a–1b. FIG. 1a shows object representation 1a, and leg representations 1b and 1c. It is assumed that the object representation will be sliced at a smaller layer thickness than the layer thickness used to slice the legs.

FIG. 1a also shows the object and leg representations being sliced by slicing layers 2a–2g into object layer representations 3a–3f. The number of object layer representations is (correctly) one less than the number of slicing layers.

As mentioned earlier, the object layers formed from each layer representation will be displaced one layer thickness downwards from the corresponding layer representation. FIG. 1b shows object (and leg) layers 3a'–3f', each of which is offset one layer thickness downwards from the corresponding layer representations 3a–3f shown in FIG. 1a.

As indicated, layers 3e' and 3f' have been moved downwards farther than layers 3a'–3d', with the result that these layers are no longer in physical contact with each other. This exemplifies the vertical misregistration problem referred to above.

A fifth problem with these methods is that they do not always generate near-flat skins (described in U.S. Pat. No. 5,184,307 in those instances where they would improve surface resolution. Instead, these methods typically only generate near-flat skins to avoid material leakage, with the result that these methods sometimes avoid creating near-flat skins which could contribute to part accuracy.

This problem can be illustrated with the aid of FIG. 2, which shows an envelope 4 of an object representation, cross-sectional outline 5a of a first object layer, and cross-sectional outline 5b of a second underlying object layer.

As indicated, there is a gap 8 between the layers which could allow leakage of untransformed material unless the gap were to be plugged with near-flat skin.

The decision whether to generate near-flat skin will be based on a comparison between normal 6, the vertical axis 7, the angle between the normal 6 and the vertical axis 7, and the minimum surface angle ("MSA").[3/] If this angle is less than the minimum surface angle, then near-flat skins will be generated to close the gap.

[3/] The MSA is the minimum angle between normal 6 and the vertical 7 which will guarantee that the cross-sections 5a and 5b will touch, closing gap 8, and preventing material from leaking out of the gap.

Therefore, in the usual case, near-flat skins will not be generated when the cross-sections 5a and 5b are touching, as shown in FIG. 3. However, even in this instance, the addition of near-flat skins would still provide a surface which more appropriately represents the object representation 4, thereby ensuring appropriate formation of an oversized or undersized object.

A sixth problem with these methods is that it is difficult to utilize techniques for achieving enhanced surface resolution, including simultaneous multiple layer transformation, described in U.S. Pat. application Ser. No. 07/606,802 now U.S. Pat. No. 5,192,469 filed concurrently herewith, or generation of extra fill layers, as described in U.S. patent application Ser. No. 07/605,976, now U.S. Pat. No. 5,209,878, also filed concurrently herewith, with these methods. This is because the methods and techniques in these referenced applications inherently involve the comparison of cross-sectional information between two or more layers. Without a generalized layer comparison capability, the required comparisons (for the referenced applications) must be separately developed for each particular case and for each particular operation that will be performed.

A seventh problem with the vector-based implementations of these methods is that they typically overcure intersection points between border vectors describing the borders of the layers, and hatch or skin vectors describing the interior portions of the layers. Because of this overcuring, a significant distortion may be introduced at the intersection points, both because the cure depth of these points will be too deep, but also since the cure width, which increases proportionally to the cure depth, will also be too large.

Therefore, it is an object of the present invention to provide a slicing apparatus and method which is less dependent on a particular input format, and which is therefore compatible with a wider range of systems generating object representations, including CAT scan systems or the like, or CAD systems which do not necessarily provide the tesselated triangular format.

It is a further object to provide a slicing apparatus and method which distinguishes more fully between down-facing regions and the remaining areas encompassed by the layer borders, so that the overcure of the down-facing regions can be prevented.

It is a further object to provide a slicing apparatus and method which generates layer borders from portions of the object representation which are not vertically offset from those portions used to generate the interior portions of the layers.

A further object is to provide a slicing apparatus and method which is more flexible in switching between providing oversized, undersized, and average-sized parts, as well as other sizing schemes.

A further object is to provide a slicing apparatus and method which reduces or eliminates the vertical registration problem.

A further object is to provide a slicing apparatus and method which generally produces near-flat skins when they would improve the surface resolution of the object.

A further object is to provide a slicing apparatus and method which is more compatible-with additional processes for improving surface resolution, including simultaneous multiple layer transformation, and the generation of thin fill layers.

A further object is to provide a slicing apparatus and method which retracts skin and/or hatch vectors from intersection points with border vectors, thereby reducing unintended overexposure of material at the intersection points.

Additional objects and advantages will be set forth in the description which follows or will be apparent to those of ordinary skill in the art who practice the invention.

SUMMARY OF THE INVENTION

To achieve the foregoing objects, and in accordance with the purpose of the invention as embodied and broadly described herein, there is provided an apparatus for and methods of slicing a three-dimensional object representation into a plurality of layer representations, comprising the steps of: overlaying the object representation with a plurality of slicing planes spaced along a slicing dimension, wherein any two successive slicing planes of the plurality bounds a layer of the object representation, the bounded layers also being successively spaced along the slicing dimension; associating each bounded layer of the object representation with the two successive slicing planes bounding the layer, the two successive planes comprising first and second slicing planes, the first slicing plane being situated lower along the slicing dimension than the second slicing plane; forming intersection segments for each bounded-layer of the object representation comprising intersections between the object representation and a first selected one of the first and second slicing planes bounding the layer; forming projection segments for each bounded layer of the object representation comprising projections, onto a second selected one of the first and second slicing planes bounding the layer, of intersections between the object representation and a third selected one of the first and second slicing planes bounding the layer, which is different from the second selected one; forming a layer boundary representation for each bounded layer of the object representation comprising a boolean union of the intersection segments and the projection segments for that bounded layer; and introducing the layer boundary representation for each bounded layer into the layer representation for that layer.

BRIEF DESCRIPTION OF THE DRAWINGS

FIGS. 2–3 illustrates the use of the MSA in generating near-flat skin;

FIG. 4 illustrates how rounding of vertices can improve resolution;

FIGS. 14a–14b illustrate the detection of an area too small to benefit from the generation of skin vectors;

FIG. 15 is a flowchart of the method of implementing the first embodiment;

FIGS. 31a–31d is a flowchart of a second embodiment of the subject invention;

DESCRIPTION OF THE PREFERRED EMBODIMENTS

An overview of a first embodiment of the subject invention will now be provided. This embodiment normally builds oversized parts, but provides the capability of rapidly and flexibly building undersized parts, or average-sized parts. Moreover, this embodiment still requires that the object representation be converted into the intermediate format of tesselated triangles. However, as will be seen in the following discussions, this embodiment is still much less dependent on the triangular representation than previous slicing methods, enabling it to be used with other data formats with simple modifications. These simple modifications will also be pointed out in the following description. Also, if a tesselated triangle representation is input to this embodiment of the invention, this embodiment will round all triangle vertices to slicing layers. Rounding of triangle vertices is described in U.S. Pat. No. 5,184,307. Rounding of triangle vertices may appear, at first glance, to actually introduce distortion, and therefore, not be a desirable option. However, more thorough consideration reveals that this rounding actually preserves object features which would otherwise be lost by the slicing process. Therefore, since the enhancement to object resolution resulting from preserving object features is believed to outweigh the detrimental impact that rounding may have on resolution, rounding of vertices is performed in this embodiment.

Alternative embodiments can use non-rounded vertices if appropriate care is taken to deal with cases where features terminate between layers.

The loss of object features in the absence of rounding can be illustrated with the aid of FIGS. 4a–4d. FIG. 4a illustrates an object representation which is not rounded prior to slicing, and FIG. 4b illustrates the resultant object. As indicated, the resultant object is almost a full layer thickness shorter than the object representation, and is therefore significantly distorted.

FIG. 4c, however, illustrates the object representation after rounding, and FIG. 4d illustrates the resultant object. A comparison of FIGS. 4a and 4d shows that the resultant object is only slightly larger than the object representation before rounding, and therefore, has higher accuracy.

Figure 1A:
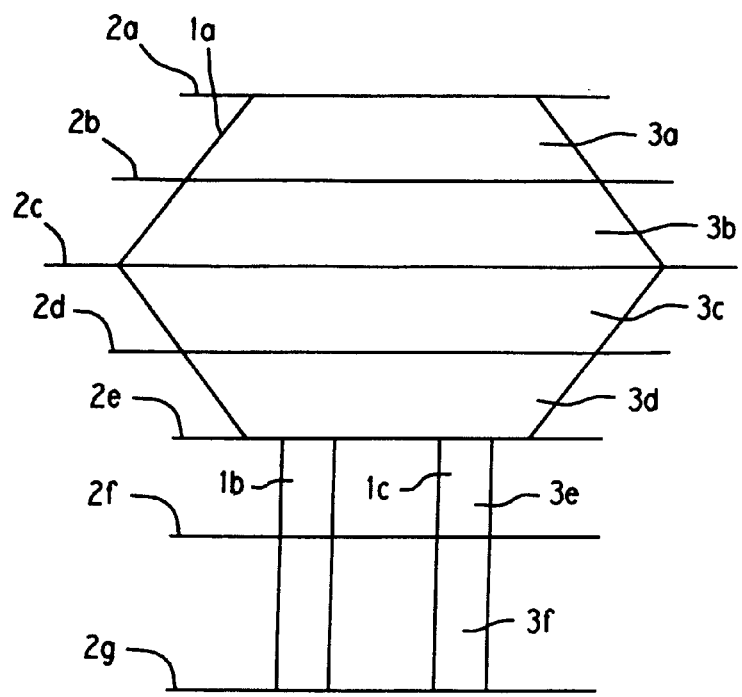
FIGS. 1a–1b illustrate the vertical misregistration problem.
Figure 1B:
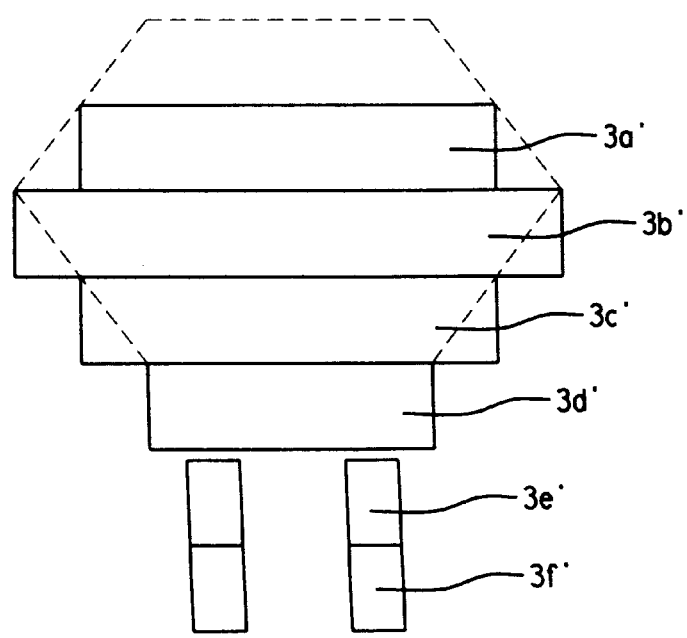
Figure 5A:
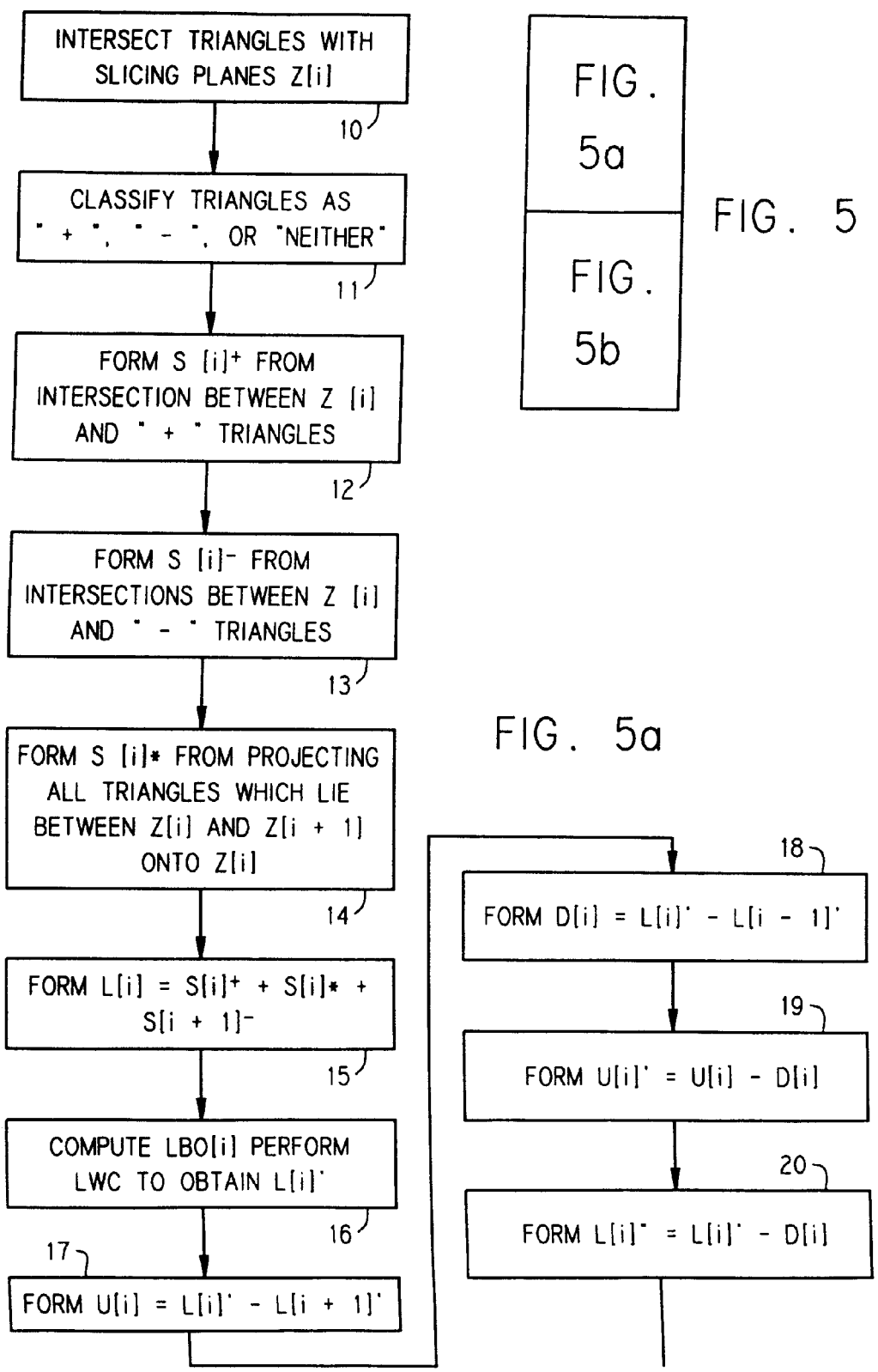
FIGS. 5a–5b is a flowchart of a first embodiment of the subject invention.
Figure 5B:
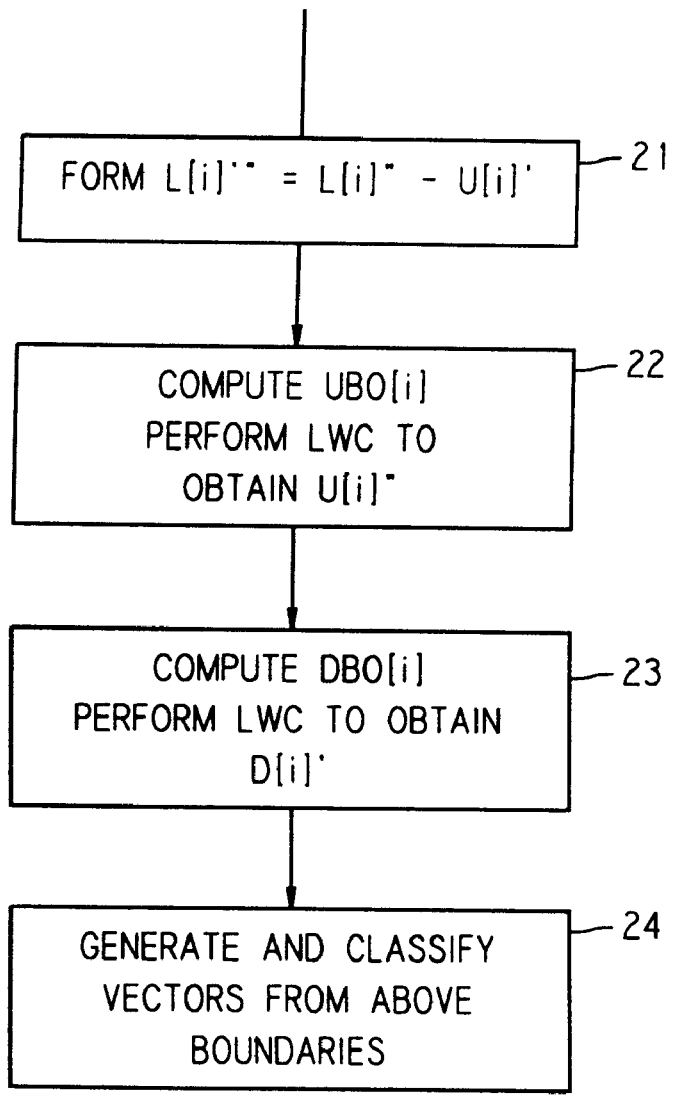

An overall flowchart for the method of the first embodiment is illustrated in FIG. 5. The first step is step 10, wherein the triangular representation is overlayed with a plurality of slicing layers z[i], spaced along a z-axis. This is conceptually shown in FIG. 6, which shows object representation 25 interlaced with slicing layers z[1]–z[6] spaced along the z-axis. Turning back to FIG. 5, in step 11, each of the tesselated triangles of the object representation intersecting a slicing layer is then classified into "+" triangles, "−" triangles, or "neither" triangles. For a slicing plane z[i], "+" triangles are defined as those triangles which pass through the slicing plane, extending upwards, or which begin at the slicing plane, and extend upwards; "−" triangles are those triangles which pass through the slicing plane, extending downwards, or which end at the slicing plane and extend downwards; if a triangle is neither a "+" or a "−" triangle, it falls into the "neither" category. Many triangles are both "+" and "−" triangles, Turning to FIG. 7, for example, triangles 26a–26h are shown, all of which intersect slicing plane z[i] at one or more points.

Triangle 26a will neither classify as a + or a − triangle, since it is entirely within the slicing plane and does not extend above or below it. It is therefore a "neither" triangle. Triangles 26b and 26c are both + triangles, since both begin at the slicing layer, at a line segment and a point, respectively, and extend upward. Triangle 26f is both a "+" and a "−" triangle since it fits the definition of both categories: it is a "+" triangle since it passes upwards through the slicing plane (intersecting it at a line segment), and it is a "−" triangle since it also passes downward through the slicing plane. Triangles 26g and 26h are both "−" triangles since both end at the slicing plane, at a line segment and a point, respectively, and extend downward.

Turning back to FIG. 5, in step 12, for each slicing plane z[i], the method will form a border, known as S[i]+, from the intersections between the "+" triangles and the slicing plane. The process of forming a border from the intersections between triangles and planes, such as slicing planes (sometime known as slicing layers) and the like, is described in detail.

In step 13, for each slicing plane z[i], the algorithm will also form a border, known as S[i]−, from the intersections between the "−" triangles and the slicing planes. Again, this process is described in detail in Ser. No. 331,644.

Figure 8:
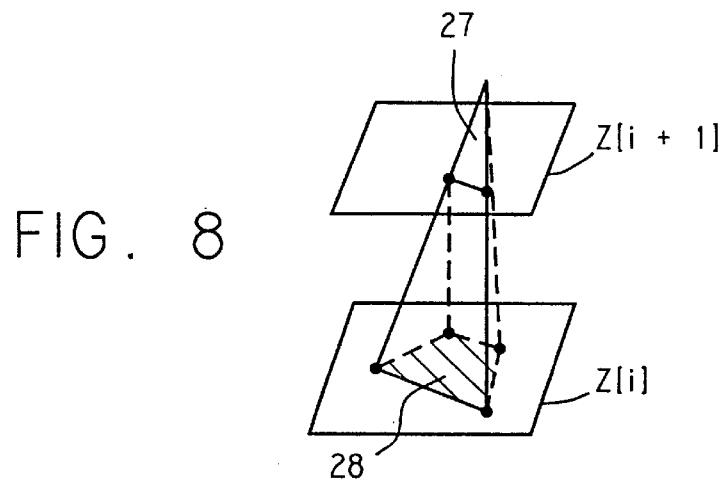
FIG. 8 illustrates the generation of projection regions.

In step 14, for each slicing plane z[i], the algorithm will determine the projection of all triangle areas between z[i] and z[i+1] onto z[i]. The projection is defined as S[i]*. Turning to FIG. 8, this figure shows triangle 27, which is one of the triangles situated between slicing planes z[i] and z[i+1]. As shown, the projection of triangle 27 onto slicing plane z[i] is identified with reference numeral 28. Once the projections are determined, the boundaries of the projection will be determined in a manner analogous to the generation of near-flat boundaries described in detail in U.S. Pat. No. 5,184,307, which are also determined from triangular projections. These boundaries also are known as S[i]*.

Note that each object cross-section, CR[i], which is planned to be formed, corresponds with the data between two successive slicing planes z[i] and z[i+1]. This correspondence will guarantee that the correct number of cross-sections, which should equal the number of slicing planes minus one, also formed.

Figure 9:
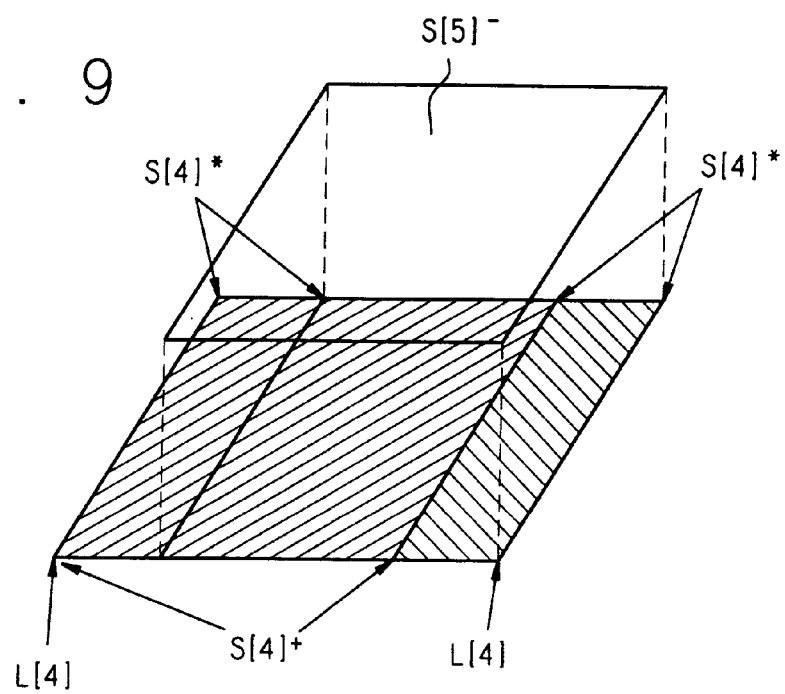
FIG. 9 illustrates the relationships between S[i]+, S[i]*, and S[i+1]−.

Turning back to FIG. 5, in step 15, for each cross-section, CR[i], layer boundary data, L[i], is formed, by taking the boolean union of S[i]+, S[i]*, and S[i+1]−. Turning to FIG. 9, which is a perspective view of plane 9—9 from FIG. 6, the generation of L[4] is shown. First, S[4]+, S[S]−, and S[4]* are generated, as shown, and then the union of these three areas is taken to determine L[4], as shown. If the above-described downshift is to be avoided, then the above data should be associated with CR[i+1] since it is used to form the portion of the object between z[i+1] and z[i].

Figure 6:
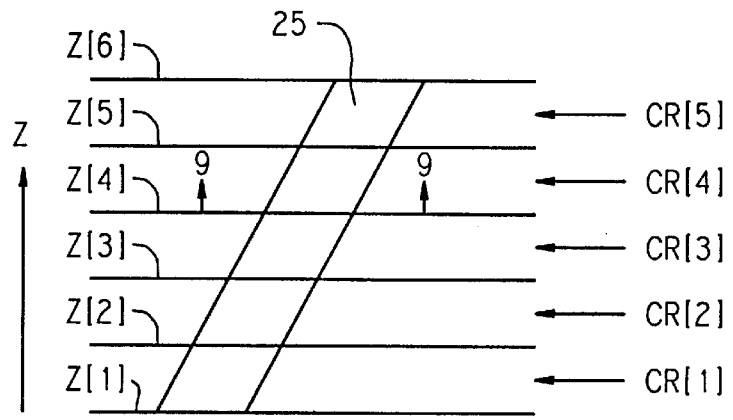
FIG. 6 illustrates the correspondence between slicing planes and cross-sections.
Figure 7:
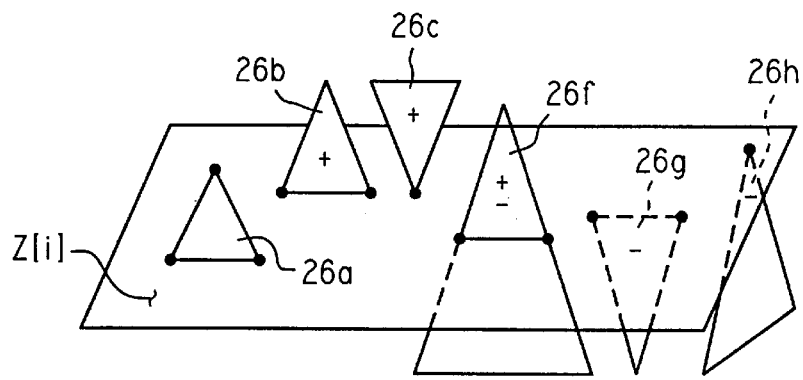
FIG. 7 illustrates the classification of triangles.

It may seem that S[4]* is simply redundant to S[4]+ and S[5]− and therefore, is not necessary in order to form L[4]. However, in certain instances, this information is not redundant, and is required to form the layer boundaries. For example, in the case where the object 25 in FIG. 6 is tilted more radically, then there is a chance S[4]+ will not intersect S[5]− at all, so that the simple union of these two areas would be two separate non-connected regions. To avoid this occurrence, S[4]* is generated to act as a transition between S[4]+ and S[5]−, and ensure that the union of these areas will include any areas of the transition region.

Note that step 15 deliberately creates a layer boundary which is always oversized compared to the original object representation. In FIG. 9, for example, the most accurate representation of the object at slicing plane z[4] is actually S[4]+, which is smaller than L[4]. Therefore, the final object, once built, will be oversized compared to the object representation; but, as described in U.S. Pat. No. 5,184,307 this allows the object to be sanded down in-a post-processing step in a way which eliminates the stairstep surface discontinuities inherent in an object formed through stereolithography. Therefore, the final object will closely approximate the original representation. The generation of undersized and average sized objects in this first embodiment will be described later on.

Turning back to FIG. 5, in step 16, line width compensation ("LWC") is performed, according to which the layer boundaries L[i], generated in step 15, are compensated for the finite cure width of the material after it transforms. Essentially, in this step, the layer boundaries are displaced inwards (towards the solid region which is being bounded) by about one-half of the cure width associated with the appropriate cure depth, so that when the beam of synergistic stimulation is directed to trace the object boundaries, and material at the boundary is transformed, the object will be the correct size. If LWC were not performed, the xy dimensions of the object would be oversized by about one cure width. LWC is explained in more detail further on. Performing LWC at this stage of processing implicitly assumes that the various types of boundaries that will be formed at later stages of the processing can all be adequately compensated by this single adjustment. Alternatively, it is possible to do additional compensating for one or more of the boundary types at a later stage. This additional compensation can be either of a positive or negative nature.

The amount of offset for the layer boundary is known as the layer boundary offset (LBO). The amount of offset is not simply one-half the beam width, but instead is one-half the cure width, which is the width of transformed material after exposure to the beam. In general, the cure width will be different from the beam width, since the cure width is dependent on cure depth, as explained in detail in U.S. Pat. No. 5,184,307. That is, as the cure depth increases, so does the cure width.

Therefore, the LBO may be different from layer to layer, since the layer thickness, and hence cure depth, may vary from layer to layer. The LBO for layer i is designated as LBO[i].

To determine the LBO for a particular layer, the desired layer thickness is first determined (determined from the difference between successive slice planes z[i] to z[i+1] or the like) and the overcure amount, typically 6 mils, is then added. The result is the expected cure depth for the layer. As described in U.S. Pat. No. 5,184,307, the overcure amount is the designated amount by which one layer is designated to penetrate into, and therefore overlap, the layer below it in order to ensure good adhesion between the layers. Once the cure depth for the layer has been determined, the program will then determine the estimated cure width based on the cure depth, and set the LBO to one-half that amount. Optionally, the down-facing regions, which will be later determined for layer i, can be given a slight negative compensation (their areas will grow) to compensate for any decrease in cure width due to a somewhat smaller cure depth.

To estimate the cure width, the plurality of previously determined data pairs may be utilized, each pair comprising an empirically measured cure depth and its corresponding cure width. As described in U.S. Pat. No. 5,184,307, these data pairs can be empirically determined from banjotops or the like. Assuming that the expected cure depth does not fall exactly on one of the cure depths in the data pairs, but instead falls between the cure depths in two successive data pairs, the cure width will be estimated simply by interpolating this value from the cure widths in the two successive data pairs. Alternatively, cure depths and widths can be determined from beam profile data and known properties of the building material.

Once the LBO has been determined, the layer boundaries are adjusted by this value. The compensated layer boundaries are designated as L[i]'.

In step 17, the process of generating up-facing boundaries for each layer is performed. As explained in U.S. Pat. No. 5,184,307, these are boundaries within the layer boundaries which encircle up-facing surfaces that happen to fall on that layer. To begin the process for each layer, the boolean subtraction between that layer and a successive higher layer is performed, which essentially determines the area on the layer which is not overlapped by the successive higher layer. The non-overlapping areas are designated as U[i].

To perform the boolean subtraction, utilization is made of a mathematical identity which results in computational efficiency. As is known, the boolean subtraction between two areas, A and B, is equal to the intersection between area A and the complement of area B:

$$A-B=A \cap (-B)$$

Therefore, to perform the boolean subtraction referred to earlier, the following computation is performed in step 17:

$$U[i]=L[i]'-L[i+1]'=L[i]' \cap (-L[i+1]')$$

Figure 10:
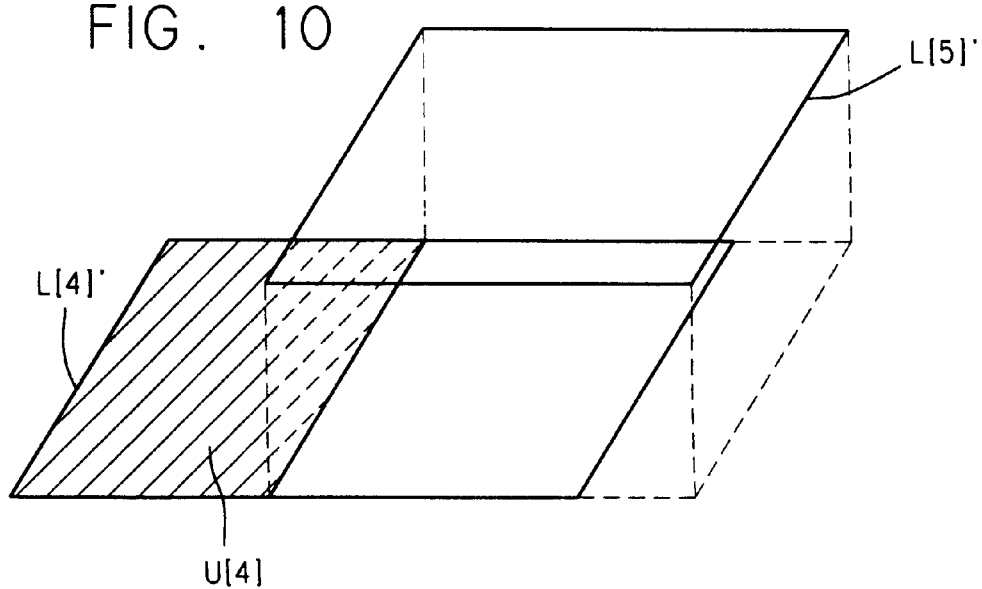
FIG. 10 illustrates the formation of U[i] from L[i+1] and L'[i+1]

As an example of this computation, FIG. 10 shows the derivation of U[4] from L[4]' and L[5]', which are taken from the example of FIG. 6. U[4] is the shaded area in FIG. 10 The complement of is everything but the area enclosed by therefore, the intersection between this complement and 4 is the area enclosed by L[4] excluding that portion that is also enclosed by L[5].

Figure 11:
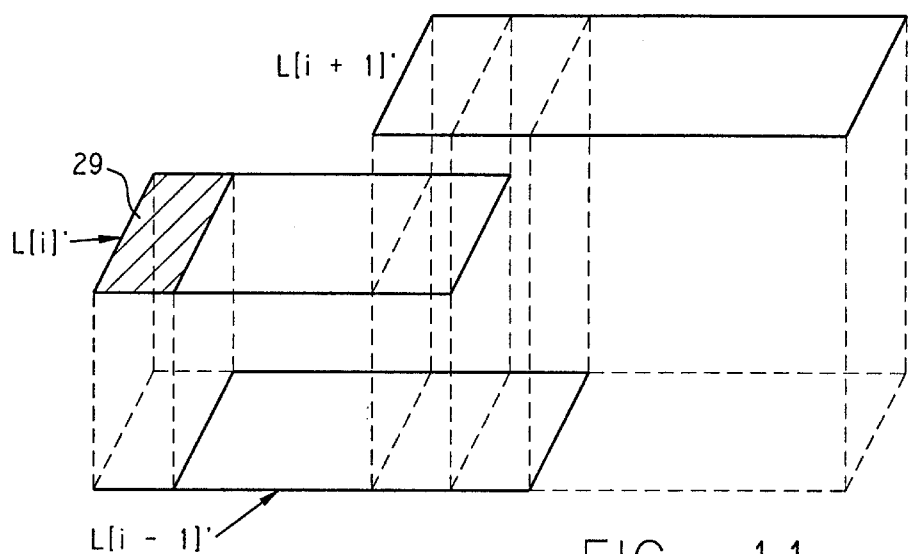
FIG. 11 illustrates the overlap between up and down-facing regions.

Note that U[4] represents only the first step in the determination of the up-facing areas. This is because the areas defined by U[i] might actually include down-facing areas as well as up-facing areas. Therefore, an adjustment needs to be made to U[i] to exclude down-facing areas. (As mentioned previously, it is important to distinguish down-facing areas from all other areas since they will generally not be overcured.) FIG. 11 shows an example where the area designated by numeral 29 would be included in U[i], but which should be excluded since it is also a down-facing region. This area is a down-facing region since L[i]' does not overlap L[i-1]', the next lower layer, in this region. As indicated earlier, the down-facing regions need to be excluded, since they do not overlap the next lower layers, and will not therefore be adhered to it, and therefore, and should not be over-cured. The next two steps accomplish this. Alternatively, areas that are both up-facing and down-facing can be labeled as down-facing, as is done in this embodiment, or they may be given a different designation so that areas that are only down-facing can be cured differently from those that are both up-facing and down-facing. co-pending U.S. patent application Ser. No. now abandoned discloses the use of different cures for down-facing regions depending on whether they are also up-facing or not.

Turning back to FIG. 5, in step 18, the down-facing borders, D[i], are determined for each layer by taking the boolean difference between the compensated layer boundaries for that layer, L[i]', and the compensated layer boundaries for the previous layer boundary, L[i-1]'. In the manner indicated previously this is accomplished by taking the intersection between L[i]' and the complement of L[i-1]', according to the following formula:

$$D[i]=L[i]'-L[i-1]'=L[i]' \cap (-L[i-1]')$$

Next, in step 19, the up-facing boundaries computed in step 17, U[i], are compensated to subtract out any down-facing regions which may also be present in the up-facing regions. This is accomplished by taking, for each layer, the boolean difference between U[i] and D[i]. In the manner indicated previously, this difference is determined by taking the intersection between U[i] and the complement of D[i] as per the following formula, to compute the adjusted up-facing boundaries, U[i]':

$$U[i]'=U[i]-D[i]=U[i] \cap (-D[i])$$

Note that any region which is simultaneously both a down-facing and an up-facing region is always classified as a down-facing region. This is preferable, since this avoids overcuring these regions.

Note that, at this point, the adjusted layer boundaries, L[i]', still encompass the up-facing and down-facing regions, D[i] and U[i]'. Therefore, these two areas need to be subtracted from the layer boundaries. This is accomplished in the next two steps in FIG. 5.

In step 20, the layer boundaries are adjusted again to subtract out the down-facing regions. The twice-adjusted layer boundaries, L[i]", are computed by taking the boolean difference between the compensated layer boundaries, L[i]', and the down-facing boundaries, D[i] (again, the mathematical identity discussed earlier is utilized for this purpose). In step 21, the layer boundaries are adjusted a third time to subtract out the up-facing regions. The thrice-adjusted layer boundaries, L[i]''', are computed by taking the boolean difference between the twice-adjusted layer boundaries, L[i]", and the adjusted up-facing boundaries, U[i]'. As before, boolean differences are preferably computed using the previously-discussed mathematical identity. Note that, at this point, the following mutually exclusive, descriptive information has been computed for each cross-section: L'''[i], D[i], and U'[i].

Note that it is still desirable to separate out the up-facing boundaries from the layer boundaries and obtain mutually exclusive data even though up-facing regions will typically be cured with the same 6 mil overcure as other regions within the layer boundaries. This is desirable since separating out these areas will eliminate redundant data and thereby reduce overcure. If the up-facing boundaries were allowed to remain within the layer boundaries, then the areas within the layer boundaries would be redundantly defined. As a result, these areas may be traced more than once by the synergistic stimulation, and therefore overcured, resulting in possible distortion either through undesirable increases in the cure depth or the cure width at these areas.

Figure 12:
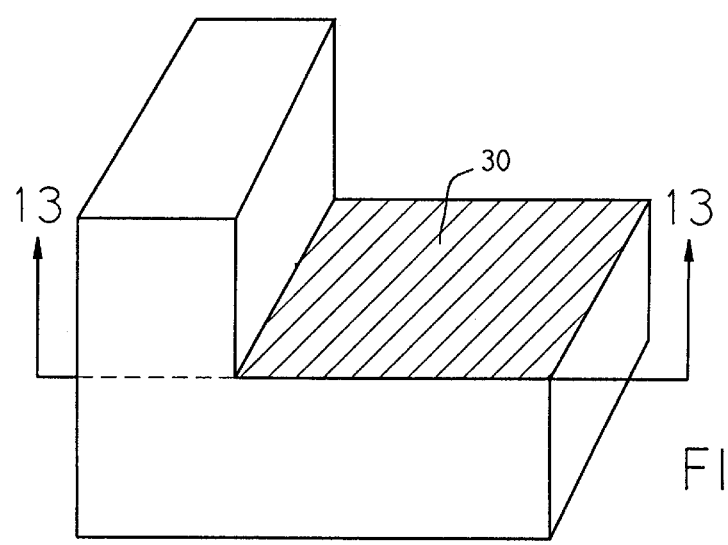
FIGS. 12–13 illustrate adjustments to up- and down-facing borders to prevent over-exposure.
Figure 13:
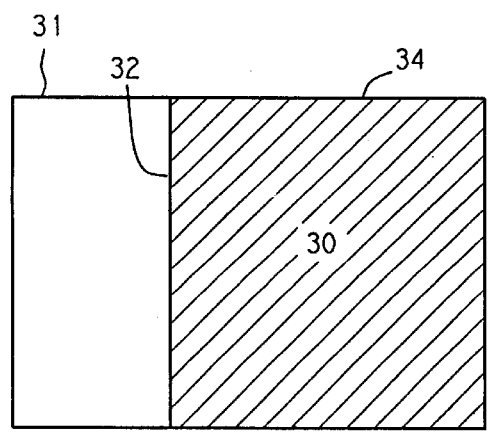

Turning now to FIGS. 12 and 13, some additional adjustments to the up-facing and down-facing boundaries must be made in order to avoid additional redundant definitions of certain areas, with the resultant possibility of over-exposure of these areas. FIG. 13 illustrates a top view of a layer of an object having an up-facing region 30. The thrice-adjusted layer boundary, L[i]''', is referenced with numeral 31, and the adjusted up-facing boundary, U[i]', is referenced with numeral 34. The areas encompassed by the layer boundary and the up-facing boundary meet, but do not overlap, along segment 32. However, if the entire area encompassed by area 30 is exposed (using skin vectors as described in U.S. Pat. No. 5,184,307 to form a transformed area, which abuts right up against segment 32, and in addition, if the entire area enclosed by boundary 31 is transformed (using hatch vectors as described in U.S. Pat. No. 5,184,307 to form a transformed area which also abuts against 32, then the material along this segment will be exposed four separate times, i.e., through exposure of areas enclosed by 31 and 34, and through exposure of layer boundary 31, and up-facing boundary 34. As indicated previously, this over-exposure should be avoided in order to prevent the resultant increase in cure width and cure depth which results. Therefore, adjustments to the up-facing and down-facing borders are useful to prevent this over-exposure. This is accomplished in steps 22 and 23.

An additional and very important result (in terms of system cost) of these adjustments is that they will have the beneficial effect of eliminating the generation of skin vectors for areas too small to actually require skin vectors. Turning to FIG. 14a, for example, the area identified by numeral 35 is assumed to represent either an up or down-facing region which is too small to benefit from the generation of skin vectors. This is so because when the synergistic stimulation traces segments 35a and 35b around the perimeter of the area, this area will be automatically transformed (due to the cure width involved) without necessitating the generation of skin vectors.

The determination of such areas can be accomplished, for example, by moving segment 35a to the right by one-half the cure width, while also moving segment 35b to the left by one-half the cure width, as shown. As will be discussed subsequently, these steps can be accomplished by utilizing, in large measure, the LWC algorithm from step 16. If the result of migrating these segments is the collapse of the region or partial collapse, then this indicates that skin vector generation need not be performed in this region or portion of this region. As shown in FIG. 14b, the migration of the segments collapses the region into line segment 36, indicating that skin vectors need not be generated. The detection of these areas is performed in the next two steps of FIG. 5.

In step 22, an up boundary offset (UBO) is computed for each layer in a similar manner to the computation of the LBO, i.e., by interpolating based on the value of the layer thickness plus an expected overcure amount. This value is used to offset the up-facing boundaries in the manner very similar to that described previously. The primary difference between the use of the UBO and the LBO is that the UBO is not used to form physical boundaries that will be drawn, whereas the LBO is used to form such boundaries. The UBO is used to form boundaries from which the appropriate areas for skinning and/or hatching will be determined. As such, if these areas are reduced to zero or become negative, they are simply not skinned and/or hatched. The LBO, on the other hand, is used to offset the boundaries that will physically be formed when producing a layer of a part. As such, when areas within these boundaries reduce to zero, or become negative after the compensation associated with the LBO, a decision must be made as to whether or not it is appropriate to form the collapsed feature as a single line of cured material or whether it is more appropriate to simply remove such features from further consideration. The most preferred choice may vary from part to part or layer to layer or region of a layer to region of a layer. Therefore, the most appropriate method of making the decision may be to make it a user specified option. This decision may be made on a part by part basis, layer-by-layer basis, or a region of a layer by region of a layer basis. This difference between the use of the LBO and UBO leads to somewhat different processing routines as will be described later.

Next, the adjusted up-facing boundaries U[i]' are adjusted inwards by about one-half the UBO for that layer, UBO[i], to obtain the twice-adjusted up-facing boundaries, U[i]". Note that with the generation of U[i]", the singly adjusted up-facing boundaries U[i]', are still retained. This is because the twice-adjusted boundaries are only kept temporarily for the purpose of generating skin vectors and/or hatch vector, and are not retained for the purpose of generating border vectors. Instead, the singly adjusted boundaries, U[i]', are kept for this purpose.

Then, in step 23, adjusted down-facing boundaries, D[i]', are computed by adjusting for a down-boundary offset, DBO, for that layer. The down boundary offset values for each layer are computed in a manner analogous to the offsets for the up boundaries in step 21 except for generally a smaller depth of cure and small corresponding width of cure, and the adjustment to the down-facing boundaries is made in a similar manner. Again, with the generation of the singly-adjusted boundaries, D[i]', the unadjusted boundaries, D[i], are still retained. This is because the adjusted boundaries are only used for the temporary purpose of generating skin vectors and/or hatch vectors, the unadjusted down-facing boundaries, D[i], being retained for the generation of the border vectors.

Note it is also possible to determine and use an additional offset value to compensate the L'''[i] or the L''[i] boundaries to produce secondary boundaries. The secondary boundaries can then be used for the generation of crosshatch (hatch) or skin (if used), wherein the original L'''[i] or L''[i] would still be used to form the physical boundaries that would enclose the hatch or skin produced from the secondary boundaries.

Finally, in step 24, vectors are generated from the boundary data as follows. First, for each layer, layer boundary vectors (LB) are generated from the thrice adjusted layer boundaries L'''[i]. (This is a simple process and is simply the generation of one or more loops of vectors which trace out the boundaries.) Second, the flat up boundary (FUB) vectors are generated from the adjusted up boundaries U[i]'. Third, layer hatch (LH) vectors are generated from the twice adjusted (not thrice-adjusted) layer boundaries, L[i]", using one of the hatch generation algorithms to be described subsequently. Note that the twice-adjusted boundaries, L[i]", are used; which encompass the up-facing regions but not the down-facing regions (see step 21 in FIG. 5), rather than the thrice-adjusted boundaries, L[i]'''. This is because hatch vectors will have to eventually be generated for both the layer boundary and up boundary regions, and it is more efficient to generate them in one step, rather than in two steps, which would be required if L[i]''' were used here. Although generally found to be unnecessary, separate hatch vectors can be generated for the L'''[i] regions and for the U'[i] regions instead of a single set for the combined L'''[i]and U'[i] regions. This can be done at the cost of producing additional vectors but with the benefit of yielding additional versatility in the process of actually transforming the building material. Note that the generation of hatch vectors for the down-facing regions cannot be combined with the generation of hatch vectors for the layer boundaries since these vectors for the down-facing regions will likely be given different cure depths and possibly completely different processing from that given to the LH, since a uniformly cured, non-over-cured region is desired to be formed. Fourth, the flat down boundary (FDB) vectors are then derived from the unadjusted down-facing boundaries, D[i], generally without any overcuring specified. Fifth, down hatch boundary vectors (NFDH) are formed from the down boundaries, D[i], using one of the hatch generation algorithms to be described subsequently. Sixth, the up fill vectors (FUF) are formed from the twice-adjusted up boundaries U[i]", and, then, the down fill vectors (FDF) are formed from the adjusted down boundaries, D[i]', using one of the skin vector generation algorithms described subsequently.

Note that the algorithm retains some of the vector mnemonics associated with the previous SLICE programs described in Ser. No. 331,644 in order to retain compatibility with the remaining computer programs other than SLICE which run on the PROCESS computer. The correspondence between vector mnemonics, vector description, the borders used to generate the vectors, and the order in which each vector type is generated, and then drawn, is summarized below:

| ORDER | MNEMONIC | DESCRIPTION | DERIVED FROM |
|---|---|---|---|
| 1 | LB | layer boundary | L'''[i] |
| 2 | FUB | up boundary | U'[i] |
| 3 | LH | layer hatch | L''[i] |
| 4 | FDB | down boundary | D[i] |
| 5 | NFDH | down hatch | D[i] |
| 6 | FUF | up fill | U''[i] |
| 7 | FDF | down fill | D'[i] |

Although the above-listed drawing order is preferred, other satisfactory drawing orders may be utilized. An important aspect of selecting the drawing order is to avoid drawing vectors that are not adequately supported by previously-formed portions of the object. If these unattached or loosely attached vectors are drawn prior to drawing other vectors, the transformed material forming the vectors can drift out of position or be distorted out of position before they can be adhered to other vectors. Therefore, it is usually advisable to solidify the material on a given layer in a manner which starts with the supported regions (since these regions will be adhered to the cross-section below) and then solidify the material which extends radially outward from these regions into the unsupported regions. This desired manner of formation can be implemented by comparison of adjacent cross-sections, known cure depths and widths for each vector, and known attributes of the drawing style used and of any curl reduction methods used. The above-described order reflects these considerations. Additionally, it always draws boundaries prior to their associated hatch or fill to insure that the hatch and fill will be constrained by the boundaries even if the hatch and fill should initially be unadhered.

Another possible drawing order is LH, FUF, LB, FUB, FDB, NFOH, and finally FDF. This drawing order creates the LH and FUF before their corresponding boundaries since it can be assumed that both of these vector types are used to transform material which is supported from below by material which was transformed in association with the previous cross-section. Furthermore, this drawing order has the advantage that the boundaries will not be distorted by shrinkage of the hatch and fill as the hatch and fill are formed. Therefore, it may be assumed that the boundaries will ultimately be located in more accurate positions.

The above list of vector types does not contain an up-facing hatch category. As stated previously, this is because the up-facing hatch is included in the LH of the above list. This inclusion has generally been found to be satisfactory, but the up-facing hatch can be separated out into its own category if the need or desire arises. Separating the LH into its own category is a specifiable option in the present software.

IMPLEMENTATION

The implementation of the above embodiment will now be described. FIG. 15 illustrates an overall view of the implementation, which comprises the steps of performing union operations to form boundaries in-step 37, performing line width compensation in step 38, performing difference operations to form non-overlapping boundaries in step 39, and performing skin and hatch retraction and fill and/or hatch vector generation in step 40. All these steps are presently conducted on the SLICE computer (which may be the same as the PROCESS computer), which takes the tesselated triangle formatted object representation as input, and produces vectors as output. The PROCESS computer is one with or is coupled to the SLICE computer for receiving these vectors, and then, responsive to these vectors, directs the beam of synergistic stimulation to trace out the vectors on a working surface of the material.

Figure 16:
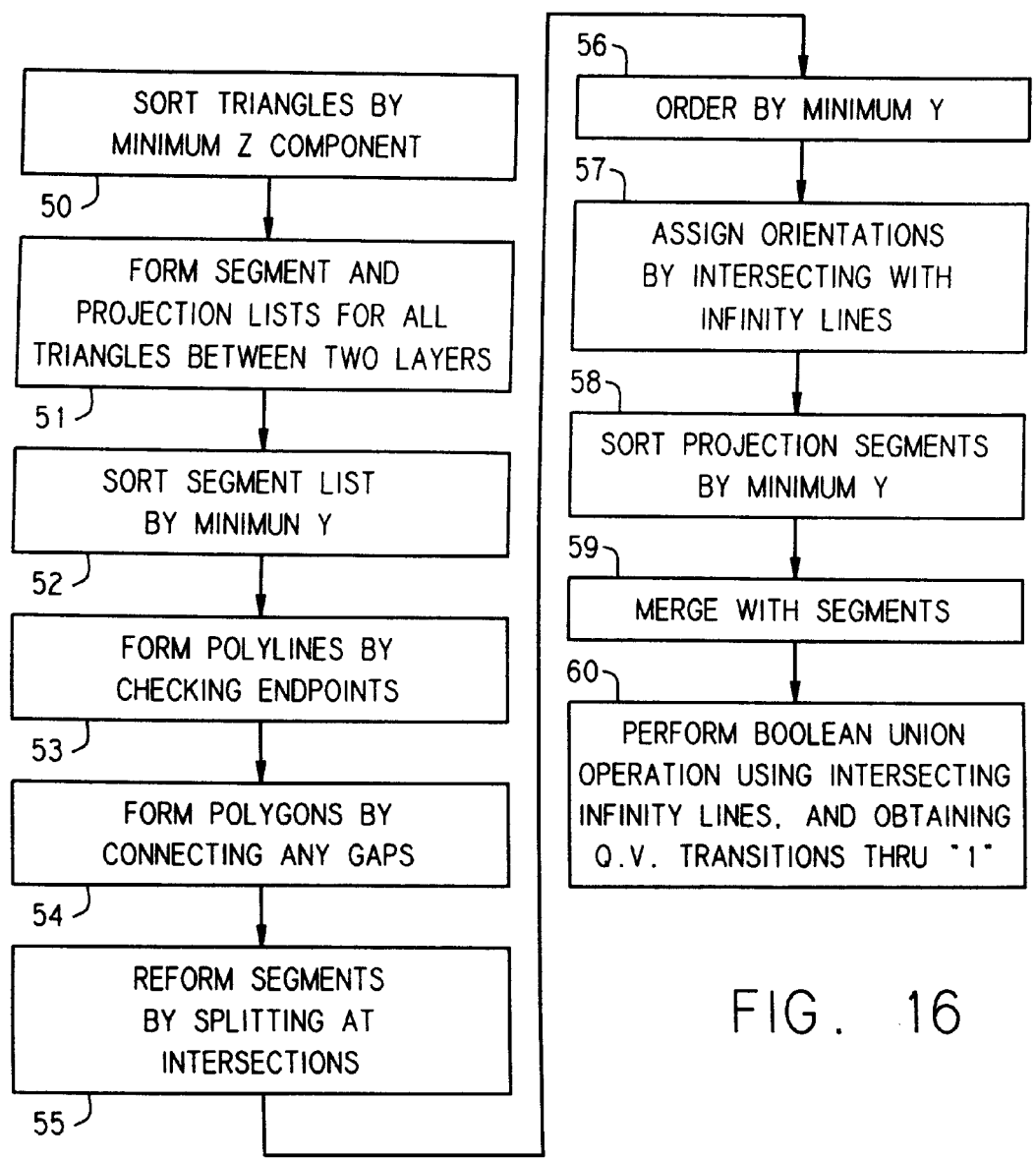
FIG. 16 is a flowchart of the detailed substeps of the method of FIG. 15.

Each of these steps will be addressed in order. The detailed substeps which make up step 37 are illustrated in FIG. 16.

First, in step 50, all the triangles are sorted by the minimum z-component of any of the triangle vertices. The z-axis is assumed to be the slicing axis, which in the first embodiment, is the vertical dimension. Therefore, this step will order the triangles along the slicing axis. It should be noted that the choice of the z-axis is arbitrary, and, assuming a Cartesian coordinate system, the y or x-axis could equally have been used.

Then, in step 51, the triangles are overlayed with a plurality of slicing planes spaced along the z-axis. Then, after consideration of all the triangles between any two successive slicing planes, a segment list is generated, comprising segments generated from the intersections- of all such triangles with the one of the two successive slicing planes having the smaller z-component. In addition, a projection list is generated, comprising segments generated from the projections of triangles, between the two layers, onto the smaller z- component slicing plane, with flat and vertical triangles excluded from consideration. If it is desired not to shift the reproduced object along the z-axis, both these lists are associated with the higher of the two layers after their formation. After the segment and projection segment lists have been formed for a cross-section, segment and projection lists for all the cross-sections are formed. In each instance, the segment and projection lists for a cross-section are formed from the two slicing layers which bound the cross-section. Alternatively, all the segment lists may not be generated. Initially, it is possible to generate such segment lists for the lower succeeding layer, the present layer, and the successive layer. After the appropriate computations are done for the present layer, the vectors for the present layer are stored or executed. The information for the succeeding layer is removed, followed by the layer designation being transferred upward so that was the next successive layer becomes the present layer. The process is then repeated, thereby minimizing memory and storage space usage. Note that the segments in the projection list, upon formation, are ordered in a counter-clockwise orientation, such that in following the directions of the segments which bound a projection, the solid regions are to the left and the hollow regions are to the right of the boundary. Another way of expressing this is that the segments follow the right hand rule, whereby the segments are assumed to encircle solids in a counter-clockwise direction, and to encircle hollow regions in a clockwise orientation.

Unlike the segments in the projection list, however, the segments in the segment list are not oriented upon formation, These segments are oriented in step 57, discussed subsequently.

For a given cross-section, beginning in step 52, the segment list is first operated on to clean it up, and correct for any corrupted input data. The inputted triangles are assumed to completely span the surface of the object, and to abut other triangles only at their vertices. If either or both of these assumptions are violated, the input data representing the triangles may be corrupted. This may manifest itself in the form of gaps or overlaps in the segment list. As discussed below, in step 52 and subsequent steps, these gaps are filled.

In step 52, the segments in the list are ordered according to their minimum y dimension, although the x- dimensions could equally have been used. Then, in step 53, the endpoints of segments are considered in turn by comparing them with the endpoints of successive segments, and if any two endpoints match, the corresponding segments are combined to form "polylines." In step 54, the endpoints of any polylines that have not closed upon themselves to form polygons are considered in turn, and compared with the endpoints of successive unclosed polylines. If gaps are present, segments are created to fill in the gaps, considering the shortest gaps first. The result is to form polygons out of the unclosed polylines. In the closing of polylines into polygons, precautions are taken to avoid vectors which cross over other vectors. At such intersection points, both vectors are split as necessary and unoverlapping polygons are formed or one polygon and a non-overlapping polyline is formed.

In step 55, after any gaps have been filled, the longest possible segments are reformed from the polygons by combining successive collinear or nearly collinear polylines or segments where possible. A characteristic of these longer segments, unlike those used to form the polygons earlier, is that all gaps will have now been removed, and the segments will completely form polygons. Moreover, another characteristic of these longer segments is that they will not be allowed to pass over any other segment. This is accomplished by following the rule to split a segment into multiple segments at an intersection point, to avoid having any two segments cross or to have a segment pass through an intersection point with another segment.

Figure 17A:
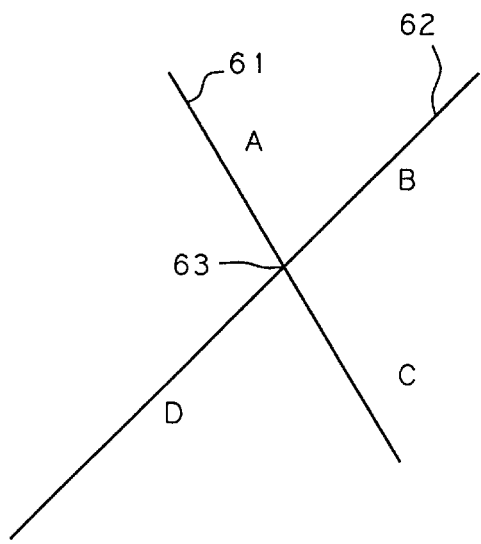
FIGS. 17a–17b illustrate the process of splitting segments at intersection points.
Figure 17B:
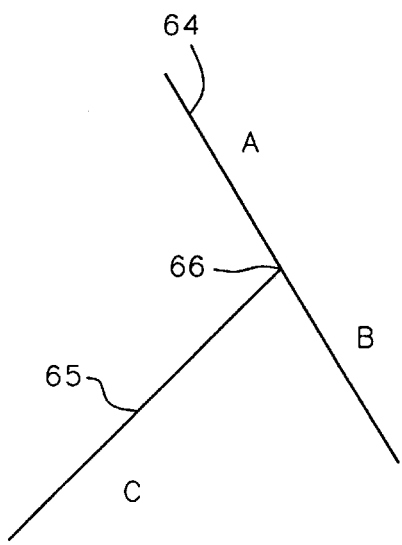

The splitting process is illustrated in FIGS. 17*a* and 17*b*. FIG. 17*a* shows segments 61 and 62 intersecting at point 63. To avoid violating the rule mentioned earlier, the segments are divided up into the four sub-segments A, B, C, and D.

FIG. 17*b* shows another example of splitting segments 64 and 65, which intersect at 66, except that here, the splitting is into three sub-segments, A, B, and C, rather than into four sub-segments.

Turning back to FIG. 16, in step 56, the reformed segments are ordered by their minimum y dimension.

In step 57, orientations are assigned to the segments, since, as discussed previously, unlike the segments in the projection list, these segments have not been assigned orientations. To do so, the segments are first intersected with so-called "infinity" lines (so-called because they are considered to originate at infinity), which are parallel to the x-axis (although the y- or z- axis is equally possible). Then, at each intersection point with a segment, a quantitative volume analysis ("QV analysis") is performed, and, as a result of this analysis, the segment is assigned a corresponding orientation.

To begin the QV analysis, it is assumed that an infinity line always begins in a hollow region, and that every time it intersects a segment, that it is either entering or exiting a solid region. The segments are assumed to be oriented so that to their left is solid and to their right is hollow, that is they are assumed to encircle a solid region by looping around it in a counter-clockwise orientation. This is equivalent to orienting these segments according to the right-hand rule. Again, the left-hand rule is also possible.

The quantitative volume ("QV") associated with an infinity line will vary from one point on the line to another depending on whether that portion of the infinity line is located within a hollow portion, or a solid portion. When the infinity line is in a hollow region, it is assumed to have a QV of 0, and when it is within a solid region of an object, it is assumed to have a QV of 1 (if the infinity line were located within an overlapping solid region of two objects, it would have a QV of 2, and so on). This situation of overlapping solid regions is excluded from this stage of the processing since at this stage hollow and solid regions are being determined by alternating the designation as successive boundary vectors are determined. A different algorithm is possible that could substantially process overlapping solid regions at this phase.

Each segment can only have one orientation associated with it since over its entire length it, by definition and by virtue of the previously-described splitting technique, bound hollow on one side and solid on the other.

The ordered segments are successively overlapped with infinity lines until each segment has been assigned an orientation. Any number of infinity lines can be used, the only provision being that enough be used so that each segment will be assigned an orientation. The first infinity line may be chosen to intersect as many segments as possible. After the orientations for these segments are assigned, another infinity line is intersected with as many remaining segments as possible, orientations are assigned, and the process repeats itself until all segments have been assigned orientations.

Figure 18:
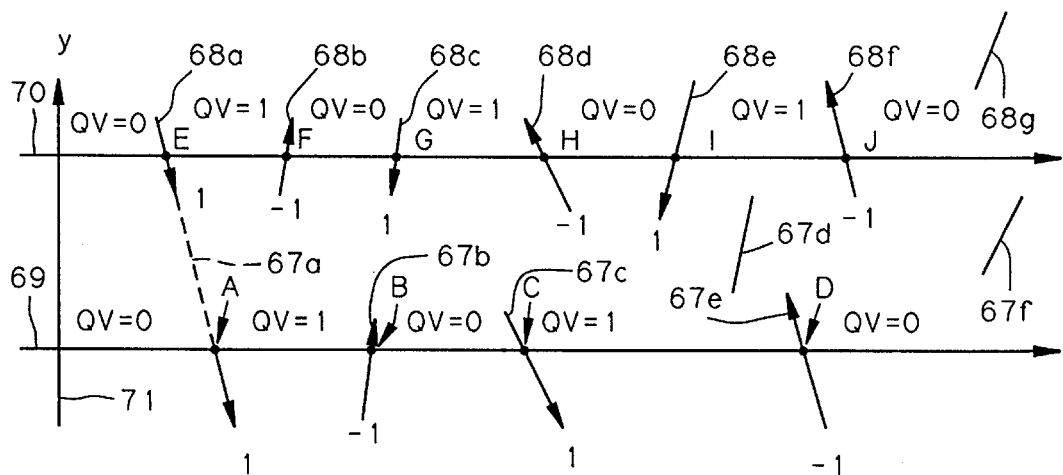
FIG. 18 illustrates the process of assigning orientations to segments.

The above process can be illustrated with the aid of FIG. 18, which shows segments 67*a*–67*f*, and 68*a*–68*g*. These segments all have at least a component parallel to the y axis and they are assumed to be ordered by minimum y, and are therefore illustrated accordingly. The y-axis is designated with numeral 71.

First, an infinity line, designated by numeral 69, is chosen to intersect as many segments as possible. In this case, this 1!b. line overlays segments 67*a*–67*f*. The actual intersections of the segments with the line are designated as A, B, C, and D.

As mentioned earlier, the origin of the infinity line is assumed to be at infinity, which is assumed to be hollow. Therefore, the infinity line at infinity is assumed to have an associated quantitative value of 0. This is indicated on the infinity just prior to the intersection with segment 67*a* at point A. Next, each intersection point along the infinity line is considered in turn, and QV values are successively assigned to each portion of the infinity line after intersection with a segment. If the QV value makes a transition from 0 to 1, this indicates the entry of solid. If it makes a transition from 1 to 0, this indicates the exiting of solid. The successive QV values are as shown in the figure.

Next, assuming an orientation, which indicates solid to the left and hollow to the right, the orientations of the segments are derived from the QV values on the infinity line. If the QV value makes a transition from 0 to 1 across a segment, this indicates that a solid has been entered, and following the right-hand rule, it is assumed that the segment is pointing downwards. Of course, if the QV makes a transition from 1 to 0, this indicates that a solid has been exited, and following the right-hand rule, it is assumed that the segment is pointing upwards. If the segment is pointing downwards, it will be given an orientation of 1, while if it is pointing upwards, it will be given an orientation of −1. The derived orientations are shown in the figure, as numbers below the corresponding segments. An arrow has also been added to each segment to pictorially show its g derived orientation.

Next, another infinity line is drawn, identified by numeral 15 70 in the figure, to intersect another group of segments, identified by numerals 68*a*–68*g* in the figure. The corresponding intersection points are identified as E, F, G, H, I, and J in the figure. Then, the above analysis is repeated, to assign orientations to the intersected segments, which are indicated in the figure.

A consistency check is then performed to determine if a segment assigned an orientation by two different infinity lines has been assigned the same orientation. In FIG. 18, for example, if segments 68a and 67a were part of the same overall segment (which situation is denoted by the broken line connecting these two segments) then a check would be made to ensure that the orientations assigned by the different infinity lines to this segment are the same. This is, in fact, the case in FIG. 18. Additional checks can be performed to ensure that segments in each polygon have been assigned compatible directions.

Figure 19A:
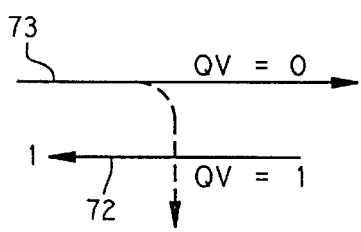
FIGS. 19a–19b illustrate the process of assigning orientations to horizontal segments.
Figure 19B:
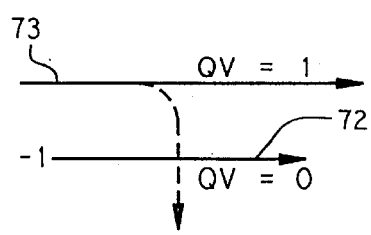

Several special cases will now be considered. The first is illustrated in FIGS. 19a–19b, where the segment 72 to be assigned an orientation is horizontal to the infinity line 73. In this instance, it will be assumed that the infinity line passes through the segment from top to bottom, as shown by the broken line in the figures, even though in reality, the infinity line follows the path indicated by the solid line in the figures, If the QV changes from 0 to 1 as in FIG. 19a, the segment will be assigned an orientation of 1, while if the QV changes from 1 to 0, as in FIG. 19b, the segment will be assigned an orientation of −1.

Another special case is where two or more segments overlap. overlapping segments may be caused by triangles overlapping. This situation may occur as triangle vertices are rounded to slicing layers, as indicated in Ser. No. 331,644.

To handle this situation, an orientation value will be assigned to the overlapping segments as a whole. This value is equal to the sum of the orientations of the individual segments. In addition, a new value, a "biorientation" value, is assigned both to the individual segments and to the overlapping segment groupings. For individual segments, the biorientation value is set to 1. For segment groupings, the biorientation value will be the sum of the biorientations for the individual segments.

Figure 20A:
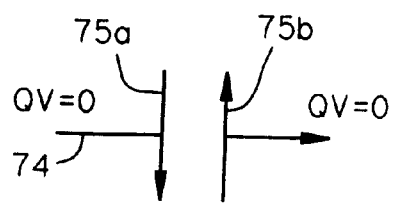
FIGS. 20a–20b illustrate the concept of bigons as representing two overlapping segments.

In FIG. 20a, for example, infinity line 74 is shown as intersecting overlapping vectors 75a and 75b (spaced apart for illustrative purposes only). As shown, the derived orientation for the grouping is 0 since there are only two vectors in the group. As indicated previously, this value is derived from the sum of the two individual orientations, which are 1 and −1, respectively. The biorientation value for the example of FIG. 20a will be 2, which is the sum of the biorientation values for the individual segments. It can be seen that the biorientation value for the grouping is simply a count of the number of segments in the grouping.

Figure 20B:
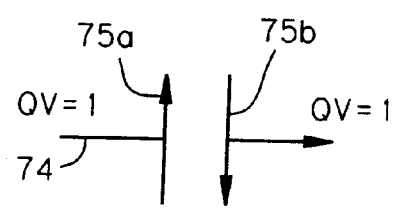

Note that a grouping of two segments is considered to be a construct known as a "bigon," that is a polygon formed from two sides. Therefore, since two overlapping segments form substantially a polygon of two sides, the grouping in FIG. 20a is properly termed a bigon. Presently, the biorientation value for a bigon conveys another piece of information, which is whether the bigon represents a collapsed hollow or solid. At present, a bigon having a positive biorientation value is assumed to represent a collapsed solid. The bigon illustrated in FIG. 20b represents a collapsed hollow. In actuality, at this level of processing, both situations in FIGS. 20a and 20b would be given the same physical orientation. Therefore, although useful for understanding the process, the orientation depicted in FIG. 20b would not really be'created in the present embodiment. All bigons are treated as enclosing a trapped positive area. Therefore, they are considered to enclose their area in a counterclockwise manner. However, at later processing stages, including the union operation to be described shortly, there two situations are treated differently due to the fact the other vectors on the layers inherently indicate that one of the bigons is within a solid region, and the other is within a hollow region. The vectors of FIG. 20a are drawn as a portion of the object whereas the vectors of FIG. 20b are not drawn since they merely represent a double exposure of a particular area.

In the differencing and intersection operations (after a complementing operation) to be described hereinafter, these bigons will be distinguished from one another by having opposite signs being assigned to their biorientation values. This is important, since it provides the ability to retain collapsed features that might otherwise be lost.

The previously depicted infinity lines were straight lines running parallel to the x-axis, with imaginary bends placed in the lines for utilization in determining orientations of segments which run parallel to the x-axis. However, it should be understood that the physically significant features of the lines are that they start at a point of known quantitative volume and that they are continuous. As such, the orientation of each of the vectors in the segment list can be determined by a single curved infinity line that intersects each of the vectors, wherein the infinity line starts at a position of known quantitative volume, and wherein the orientation of the vectors is determined by the upward or downward transition of the quantitative volume between 0 and 1. In addition, the orientation of each vector should be labeled such that the vectors are given a direction which points to the right of the direction (at the point of contact) of the infinity line when the transition is from hollow into solid and to the left when the transition is from solid into hollow.

Figure 21A:
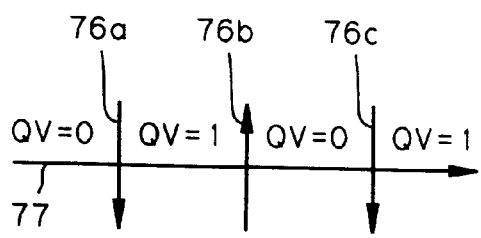
FIGS. 21a–21b illustrates the case of three overlapping segments.
Figure 21B:
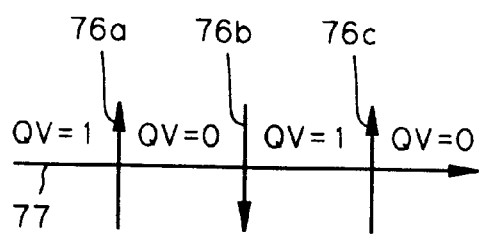

The case of three overlapping segments 76a, 76b, and 76c is illustrated in FIGS. 21a and 21b. The infinity line intersecting the vectors is designated with numeral 77. FIG. 21a illustrates the case where the infinity line enters the grouping of three segments from a hollow, while FIG. 21b illustrates the case where the infinity line enters the grouping of three segments from a solid.

The segments which make up the grouping are shown spaced apart for illustrative purposes only, and the respective changes in the value of QV is shown. Note that in FIG. 21a, the value of the orientation is 1, all in accordance with the sum of the individual orientations, while the orientation value in FIG. 21b is −1.

In both cases, however, the grouping comprises both a collapsed hollow, and a collapsed solid. Therefore, the biorientation value for both cases is assumed to be 3.

This completes the discussion of the particular approach currently used to assign orientations to segments in the first embodiment. Turning back to FIG. 16, in step 58, the projection segments are sorted by minimum y, and then in step 59, merged with the segments in the segment list. Note that the segments in the projection list already have orientations assigned to them, and do not have to have orientations derived for them as per the segments in the segment list. The orientation for the vectors in the projection list is determined in a manner analogous to that used for determining orientation for the near-flat boundary vectors described in previously referenced and incorporated U.S. patent application Ser. No. 331,644. Merging the segments for the two lists together paves the way for taking the union of the areas encompassed by the segments of both sets, which union, as discussed previously, will result in the formation of the layer boundaries.

In step 60, the union operations are performed. To perform the union operation, a series of infinity lines will be run through the segments in the merged list. Then, the QV value will be computed at each intersection point (here, unlike step 57, the QV values are derived from the segment orientations), and any segment where the QV makes a transition from below 1 to a value of 1 or greater, or a transition from above 1 or exactly 1 to less than 1 will be retained. All other segments will be discarded. The retained segments, as will be seen in the discussion below, will form the union of the areas encompassed by the segments in the segment and projection lists.

Figure 22A:
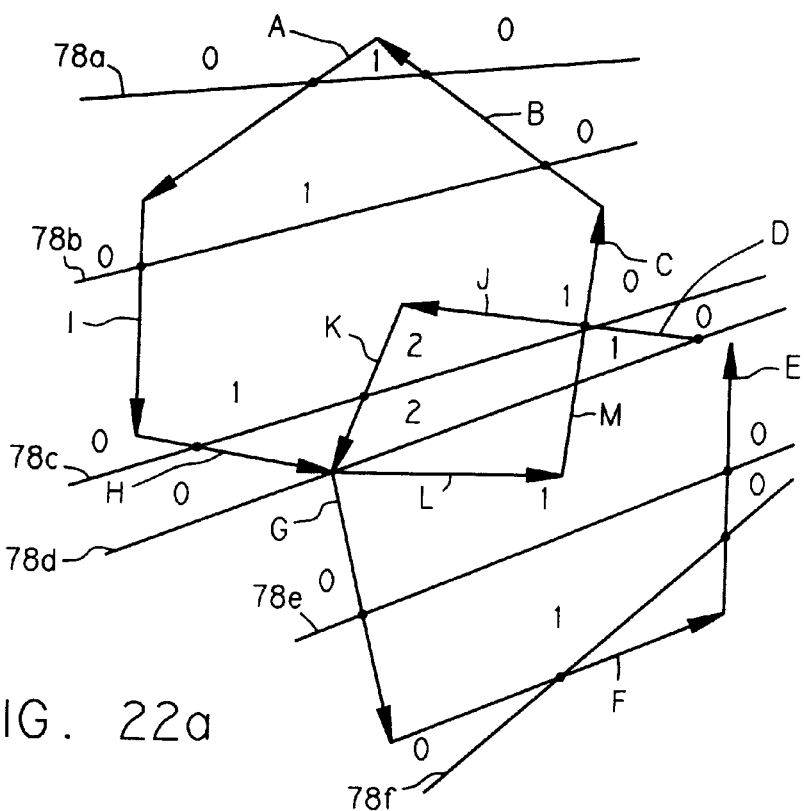
FIGS. 22a–22b illustrate the implementation of the boolean union operation.

This operation is illustrated in FIG. 22*a*, which shows segments forming two loops, one loop assumed to be formed from segments in the segment list, the other assumed to be formed from segments in the projection list. In general, there is at least some overlap (matching vectors) between those in the segment list and those in the projection list.

Figure 22B:
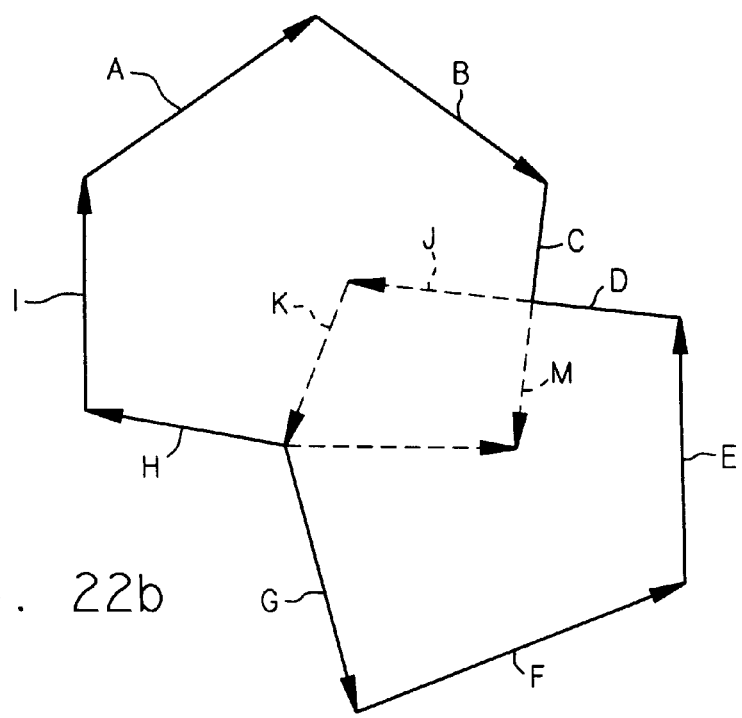

A plurality of infinity lines 78*a*–78*f* are shown intersecting the segments, and after the intersection points have been determined and located, the QV values are determined. The QV values are shown in the figure. Using the retention rule discussed previously, the retained vectors are labelled as A–I. These segments are redrawn for clarity in FIG. 22*b*, with the excluded segments, J–M, shown as dashed lines. As shown, the area encompassed by the retained segments is the union of the two areas shown in FIG. 22*a*. It should be recalled that the decision to retain or remove vectors was based on whether the transition across the vector included quantitative volume changes between at least 0 and 1 inclusive.

For the retained segments, any orientation value greater than 1 is changed to 1, and any orientation value less than −1, is changed to −1. By this process, overlapping segments are effectively discarded. Moreover, the biorientation values for these segments is reset to 1. However, note that some segment groupings will still be retained. These include bigons representing collapsed solids. Bigons representing collapsed holes are discarded. Then, the retained segments are reconnected to form polygons.

Discarding collapsed holes reflects the policy of this embodiment that solid features are considered more important for accurately representing the object than hollow features. To implement this policy, when a bigon is encountered, in the union operation, a new parameter, QV', is defined. To determine QV', the value of the biorientation parameter, rather than the orientation parameter, is added to the QV value just prior to the bigon, and the resulting value analyzed. If the transition from QV to QV' goes from below 1 to 1-or greater, the bigon is retained; otherwise, the bigon is excluded. The orientation parameter is never used since it will be 0, and will never cause a transition in the QV.

Figure 23A:
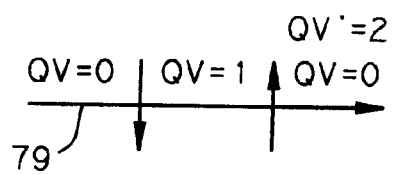
FIGS. 23a–23b illustrate the treatment of bigons in the union operation.
Figure 23B:
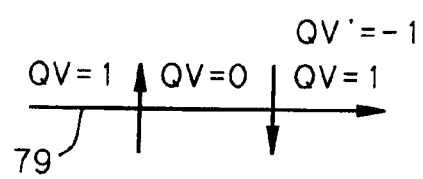

Turning to FIGS. 23*a* and 23*b*, the treatment of bigons in this union operation will be described in greater detail. These figures show bigons being intersected with infinity line 79. The value of QV will be unchanged, as indicated, on either side of the bigon since the orientation parameter is 0, but the value of QV', which is the value of QV with the biorientation parameter added to it, makes a transition compared to the QV value just prior to entering the bigon to 2 (from 0) in FIG. 23*a*. As a result, the bigon is retained. The situation depicted in FIG. 3 is similar to that depicted in FIG. 20*b*. The biorientation of this figure is +2. Therefore, upon crossing the segment, the QV' goes from 1 to 3. Since it does not go through the range 0 to 1, this bigon would therefore be removed. As a result, in the union operation, it is seen that the bigons which form independent structure are kept while the bigons which duplicate structure are removed.

This completes the steps illustrated in FIG. 16.

Figure 24A:
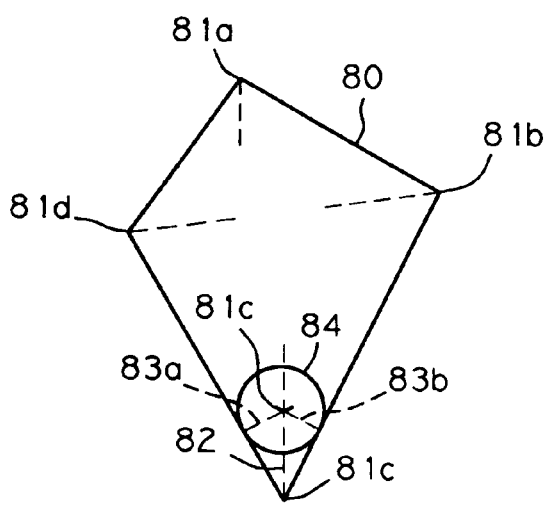
FIGS. 24a–24g illustrate the implementation of line width compensation.

Turning back to FIG. 15, in step 38, line width compensation (LWC) is next performed. First, it should be understood that the layer boundaries for each layer define a polygon, and the first step of LWC is to move the vertex points of each polygon so that the cure width of the material, which forms upon exposure to a beam of the synergistic stimulation,. will be entirely encompassed within the polygon. For each vertex, a path known as a vertex bisector will be formed to define a path for the vertex to migrate along. Each bisector will be situated to bisect the angle formed at each vertex. This step is illustrated in FIG. 24*a*, which shows polygon 80, with vertices 81*a*, 81*b*, 81*c*, and 81*d*. The corresponding vertex bisectors are illustrated by the dashed lines emanating from each vertex. The vertex bisectors form the path along which each vertex will be migrated until the cure width along the border will be entirely encompassed within the border. The cure width of the material which results from the exposure of the material to the beam of the synergistic stimulation is identified by numeral 84. In the following discussion, this will be referred to as the beam trace.

Focusing on vertex 81*c* for the moment, the vertex will be migrated along the bisector to point 81*c*', which is defined as that point at which the beam trace will entirely fit within the confines of the polygon 80.

The beam trace will typically be in the shape of a circle as shown. In this instance, the migration of the vertex point, which is identified by numeral 82 in the figure, will be continued until the shortest distance from the migrated vertex point to the sides of the polygon, which shortest distance is generally along lines which are perpendicular to the sides of the polygon, identified by numerals 83*a* and 83*b* in the figure, are equal to the radius of the beam trace. This situation will generally occur, as illustrated in the figure, only after the vertex point has been migrated by more than the radius along the bisector line.

Each vertex is then adjusted in order.

Figure 24B:
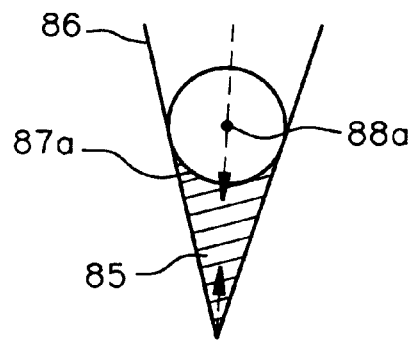

After adjusting the vertices as described above, the LWC algorithm will next perform a series of adjustments in case the vertex point may have been migrated too far. An example of this situation is shown in FIG. 24*b*, where the above approach has given rise to unacceptable migration along the bisector line at a sharp vertex. The extent of this migration is unacceptable since it may cause unacceptable distortion in the final object. For example, the shaded area in FIG. 24*b* represents the distortion in the final object, since this area, although encompassed by the layer boundary 86, will not be exposed. As indicated, this distortion can be substantial.

Therefore, to reduce the distortion which may result in these extreme cases, the LWC algorithm limits the length of migration of any vertex point to a value which is the square root of two times the radius of the beam trace:

$$\mathrm{sqrt}\,(2) \times r$$

Figure 24C:
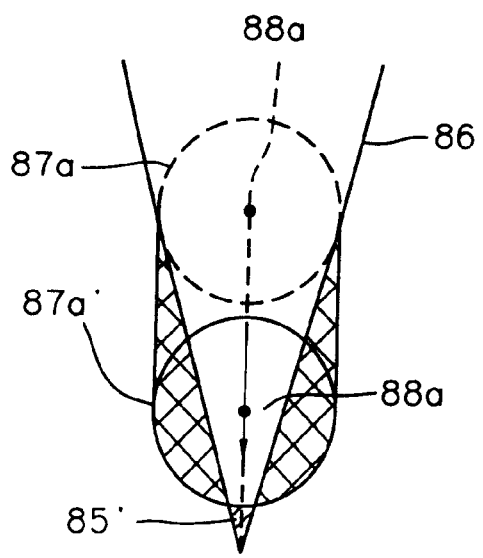

In FIG. 24*c*, for example, in which like elements are referenced with like reference numerals compared to FIG. 24*b*, the migration of the vertex point will be limited to 88*a*', and will not be allowed to proceed to 88*a*, as shown in FIG. 24*b*. When the beam trace is limited to 88*a*', the migration distance 85' is equal to the value specified above. The resultant beam trace will then be 87*a*' instead of 87*a*, as shown in FIG. 24*b*.

Note that this approach still results in some distortion, identified by the cross-hatched areas in FIG. 24c, and in fact even introduces some distortion. However, the intended result of limiting migration is to reduce the resultant distortion from what it was previously, and it has been found that limiting migration accomplishes this result in a wide variety of circumstances, even though distortion is not completely limited. comparing FIGS. 24b and 24c, for example, the total distortion in FIG. 24c, represented by the cross hatched areas, is still less than it was for FIG. 24b.

The LWC algorithm performs another adjustment to prevent undue migration. To perform this adjustment, the LWC algorithm first forms a displacement vector, defined as the vector which points from the original to the migrated vertex point. The LWC algorithm will next double the length of the displacement vector along the bisector line, and if the doubled displacement vector crosses a segment on the polygon, the migrated vertex point is adjusted back towards the original vertex point until the doubled displacement vector just touches the intersected segment.

Figure 24D:
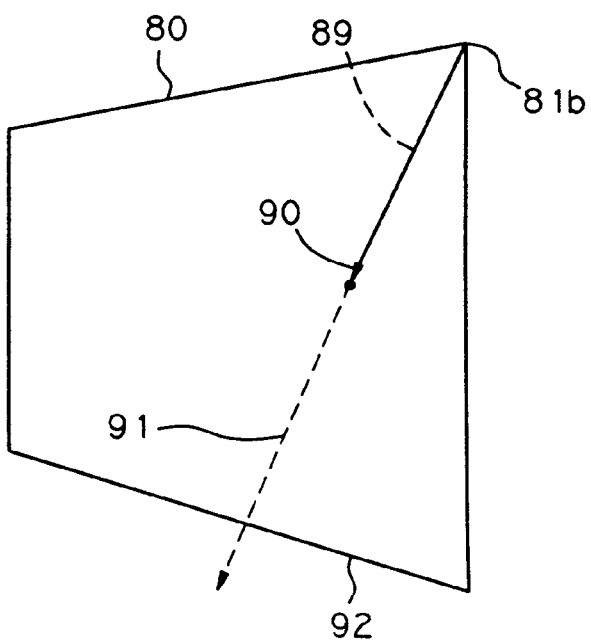
Figure 24E:
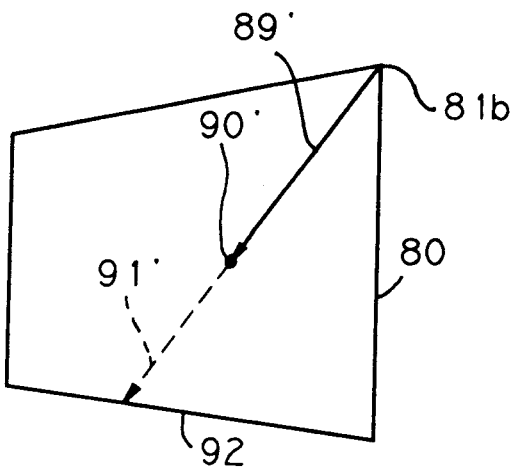

This process is illustrated in FIGS. 24d and 24e, which shows polygon 80 with vertex point 81b, and segment 92. As shown in FIG. 24d, after the vertex-point has been migrated to 90, the displacement vector 89 is doubled to obtain the doubled displacement vector 91 shown in phantom. As shown, the doubled displacement vector intersects segment 92, so as shown in FIG. 24e, the vertex point is migrated back to 90', towards its original location, so that the resulting displacement vector 89', when doubled to obtain vector 91' (shown in phantom), does not intersect, but, in fact, just touches vector 92.

Figure 24F:
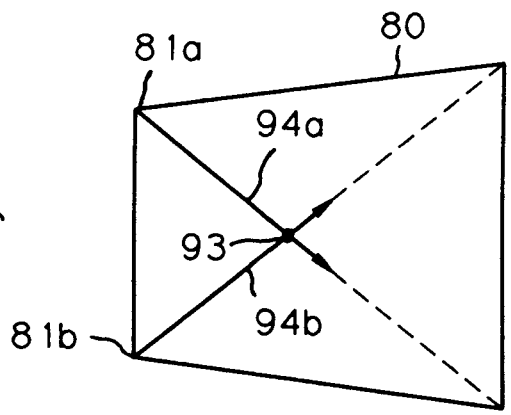

A third adjustment performed by the LWC algorithm is triggered when two displacement vectors cross, as shown in FIG. 24f, which shows displacement vectors 94a and 94b, for vertices 81a and 81b, respectively, crossing at intersection point 93. In this instance, the migrated vertices are moved back to the intersection point 93 so that the resulting displacement vectors do not cross each other.

Figure 24G:
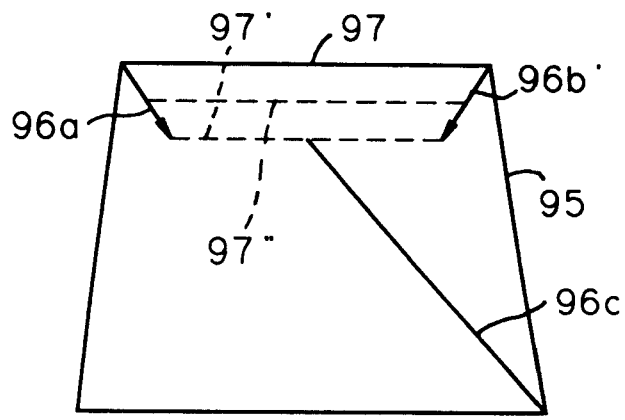

A fourth adjustment is triggered when the displacement vector crosses a compensated segment (a compensated segment is the segment that results from connecting migrated vertices). This situation is illustrated in FIG. 24g, which shows polygon 95, and compensated segment 97'. Segment 97' is obtained by migrating vertex points along displacement vectors 96a and 96b, and then connecting the migrated points. Also shown is displacement vector 96c. This displacement vector has resulted from the migration of a vertex point opposing segment 97', and has intersected the compensated segment 97'. In this instance, the LWC algorithm will move the compensated segment (not the vertex point as per the adjustments above) back towards the original segment it was derived from, keeping it parallel with the original segment, until the cross over is eliminated. In FIG. 24g, the original segment is designated by 97, and the moved compensated segment, designated by identifying numeral 97", is shown in phantom. As shown, the moved compensated segment is parallel with the original segment 97. Alternatively, the compensated segment 97' can be moved back towards the position of the uncompensated segment while simultaneously shortening the displacement vector 96c so that the final segments meet near the middle of the uncompensated region thereby resulting in a better approximation to the most proper locations of the final compensated segment.

After all the vertices has been migrated, they are connected to form the compensated segments. This completes the line width compensation process.

Turning back to FIG. 15, in step 39, a series of boolean intersections are next performed to form the non-overlapping regions U[i]', D[i], and L[i]'". The specific boolean operations which need to be performed are illustrated in FIG. 5, steps 17–21. Each of these steps comprises a boolean subtraction of one area from another or of one set of areas from another set of areas, which, as indicated previously, is equivalent to performing the boolean intersection between one area and the complement of the other. This section will explain the first embodiment of the implementation of the intersection operation. In the following discussion, it is assumed that the two polygons to be differenced are denoted as A and B.

The first step in this implementation is to take the complement of B. This is accomplished simply by breaking up the B polygon into its constituent segments, ordering the segments by their minimum z component, as described earlier, and then reversing, i.e., negating the orientation and biorientation values of each segment. For bigons representing collapsed solids, this step has the effect of turning these bigons into collapsed hollows.

The second step in this implementation is taking the intersection between A and the complement of B. To accomplish this, in a similar manner to that already described for B, polygon A is divided up into its constituent segments, and reordered by minimum z. Then, the list of segments for both A and the complement of B are merged. Upon merging the sets, crossing points of intersecting vectors are determined and the intersecting vectors are split into smaller vectors at these points. A further step then takes place on the merged segments, whereby overlapping segments are used to form segment groupings, such as bigons, which were discussed previously. A special case occurs if a first segment overlaps a second longer segment. In this instance, the second segment will be split up into a third segment of equal length to the first segment, and a fourth segment which is the remainder. The first and third segments are then combined into a bigon.

After the above steps have been accomplished, the merged segments are intersected with a plurality of spaced infinity lines, and the orientations of the segments are then used to derive the QV values associated with various portions of the infinity lines. Only if a segment triggers a transition in the QV value from below 2 through or to the number 2 (through the range of 1 to 2) will the segment be retained. All other segments will be discarded. The result is the boolean difference between the two polygons or sets of polygons.

Figure 25A:
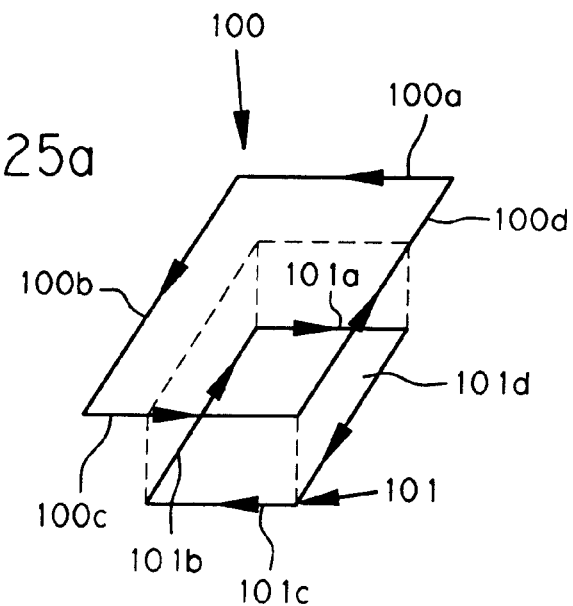
FIGS. 25a–25c illustrate the implementation of the boolean differencing operation.

The above differencing step is illustrated in FIG. 25. FIG. 25a illustrates the two polygons to be intersected, numeral 100 designating polygon A, and numeral 101 designating the complement of polygon B. As illustrated, the segments which make up polygon A, illustrated by reference numerals 100a, 100b, 100c, and 100d, are oriented in a counter-clockwise direction, while the segments which make up the complement of polygon 5, identified by reference numerals, 101a, 101b, 101c, and 101d, are oriented in a clockwise direction, which is reversed from polygon A because of the complementing operation.

Figure 25C:
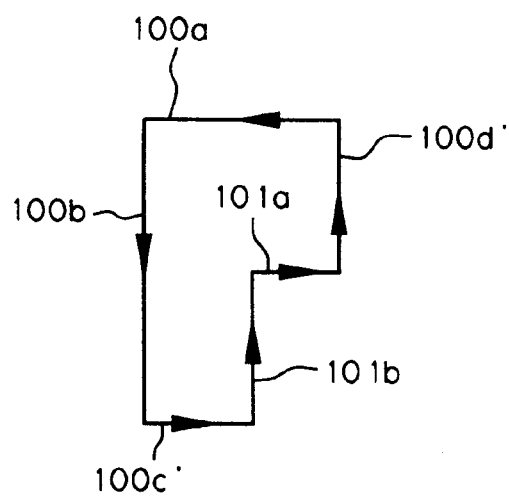
Figure 25B:
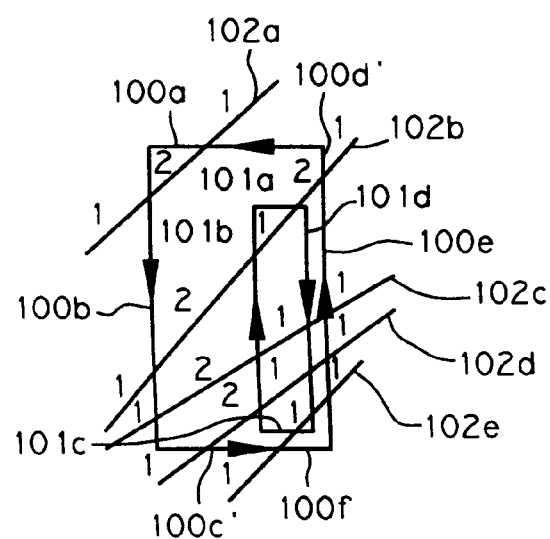

FIG. 25b illustrates these same segments after overlapping segments have been split up to form bigons, after these segments have been ordered by their minimum z component, and then intersected with a plurality of infinity lines which are sufficient in number so that each segment is intersected at least once. For example, segment 10c is split up into segments 100c' and 100f, and then segments 100f and 101c are merged to form a bigon. In addition, segment 100d is split up into segments 100*d'* and 100*e*, and then segments 100*e* and 101*d* are merged to form a bigon. The QV values associated with different portions of the infinity lines are shown directly adjacent to the corresponding portion of the infinity line. Each infinity line is assumed to originate at infinity, but unlike the union operation discussed previously, where the infinity lines were given an initial QV value of 0(consistent with the assumption that they originated in a hollow region), here, each infinity line is given a QV value of one. This is because here, it is assumed these segments originate in a solid region, consistent with taking the complement of B.

Considering infinity line 102*a* first, the QV values associated with this line makes a transition from 1 to 2 as the line passes segment 100*b*, and makes a transition from 2 back to 1 as segment 100*a* is crossed. Therefore, these two segments will be retained. Considering infinity line 102*b* next, the QV values associated with this line makes a transition from 1 to 2 as it crosses segment 100*b*, makes a transition from 2 back to 1 as segment 101*b* is crossed, makes a transition from 1 back to 2 as segment 101*a* is crossed, and then makes a transition from 2 back to 1 as segment 100*d'* is crossed. Therefore, segments 100*b*, 101*b*, 101*a*, and 101*d'* will be retained by virtue of this infinity line. Turning to infinity line 102*c* next, the QV value for this line makes a transition from 1 to 2 as segment 100*b* is crossed, changes from 2 back to 1 as segment 101*b* is crossed, and doesn't make a transition as segments 101*d* and 100*e* are crossed. (Note: These segments actually overlap each other and are shown offset from each other in the figure for illustrative purposes only. Therefore, since these segments overlap each other, and actually form a bigon as will be discussed subsequently, the QV value doesn't change.) Therefore, by virtue of this infinity line, segments 101*d* and 100*e* will be discarded.

It should be noted that the transition across the bigon will actually be more complicated than indicated above, and will take account of the biorientation value of the bigon, as discussed previously. Here, the biorientation value of the bigon will be 0. This is because the biorientation value for 101*d* will be 1, while for 100*e*, it will be −1. The sum of these two values determines the biorientation value of the bigon. Therefore, the value of QV' after exiting the bigon (equal to the QV value just prior to the bigon) added to the bigon biorientation value will be 1. Since the value does not transition through or to 2, the bigon will not be retained.

Considering infinity line 102*d* next, the QV value for this line makes a transition to 2 as it passes through segment 100*c'*, transitions back to 1 through segment 101*b*, and does not change as it passes through segments 101*d* and 100*e*. Moreover, the QV'value for this bigon is still 1. Therefore, by virtue of this infinity line, segment 100*c'* will be retained while decisions regarding the other crossed segments were previously made and remain uncontradicted by the present results (e.g., 101*b* to remain and 101*d* and 100*e* will be removed).

Considering infinity line 102*e* next, the QV value for this line does not make a transition as it passes through segments 100*f* and 101*c*, and also through segments 100*e* and 101*d*. In addition, the biorientation values for both these bigons will be 0. Therefore, the QV' values for these bigons will be 1. Therefore, by virtue of this infinity line, segments 100*f* and 101*c* will be discarded.

The end result is shown in FIG. 25*c*. A comparison with FIG. 25*a* shows that this polygon does, in fact, represent the boolean difference between polygons A and B.

Note that after the intersection operation, if any bigons had been retained, they would be converted back to individual segments. The orientation value for each segment while part of the bigon would be retained, but a biorientation value of 1 would be assigned to each segment.

Turning back to FIG. 15, the next implementation step to be discussed is skin retraction step 40. Skin retraction is performed during the vector generation step 24 in FIG. 5. Basically, in general terms, the net result of skin retraction is the retraction of skin vectors slightly at points where the vectors would otherwise intersect or overlay the borders used to generate these vectors. The benefits of performing skin retraction are to reduce over-exposure of certain areas, also to prevent the filling of areas too small to benefit from skin vectors and to prevent generation of excess skin vectors which must be stored and/or processed resulting in less efficient operation of the system, all of which were described previously.

Skin retraction is performed by adjusting all the borders (up-facing, or down-facing) inwards to create phantom borders while still retaining the original borders. The skin vectors and/or possibly hatch are then generated from the phantom borders using the skin generation algorithm to be discussed subsequently. The original borders are retained, since these, not the phantom borders, will be used to create the border vectors. Skin retraction, or more appropriately hatch retraction can be done in the layer borders L" or on the separate sets of layer borders L'" and up borders U' for the purpose of generating retracted hatch. This may similarly be done, as stated previously for the D borders as well.

The phantom borders are generated from the original borders, after these borders have been substantially line-width compensated, in steps 16, 22, and 23 in FIG. 5.

The adjustments made to the original borders in order to arrive at the phantom borders, is much less elaborate than line width compensation.

Basically, the only step performed is to displace, towards solid area, each border vector by the UBO or LBO value, while keeping each border vector parallel to the original border vector along with a substep of clipping vectors. Once the phantom borders are created, they will be converted into phantom segments. There is no need to split segments since crossing or overlapping segments will be processed properly by the algorithm.

Once the phantom segments have been created, the next steps are to merge them with the original border segments, and then sort the merged segments by the minimum-y dimension. Next, these segments are rotated, if necessary, in preparation of intersecting these segments with a plurality of spaced, parallel, horizontal infinity lines. Next, quantitative volume analysis is successively performed for each skin line to generate the skin vectors. As before, each infinity line is assumed to originate at infinity, which is further assumed to be a hollow, and has a quantitative volume value of zero at infinity. Next, considering each infinity line in turn, the quantitative volume value for each infinity line is incremented by the orientation value of each segment it crosses. When a transition is made from below 2 to or through 2, the generation of a skin vector at the intersection point is begun, and when a transition is made from 2 or above 2 to below 2, the generation of a previously-commenced skin vector is stopped. Note that this operation is very similar to the intersection operation described previously except boundaries are not actually fully determined.

Figure 26A:
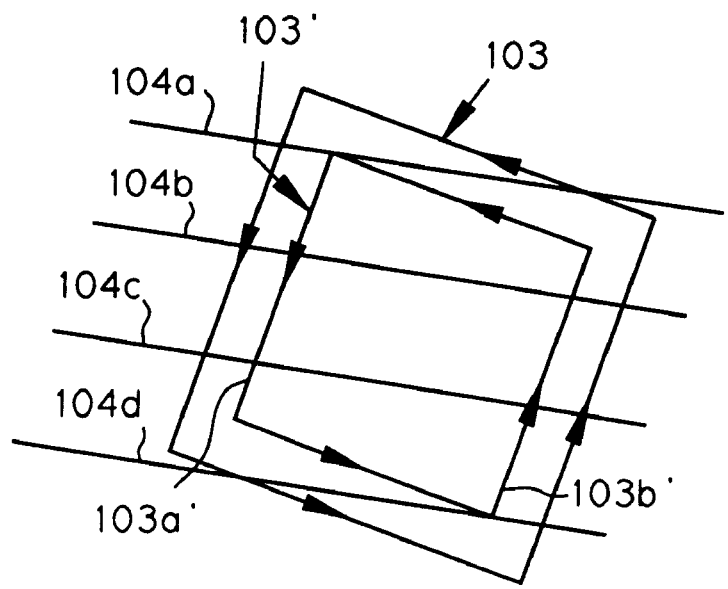
FIGS. 26a–26b illustrate skin vector generation.
Figure 26B:
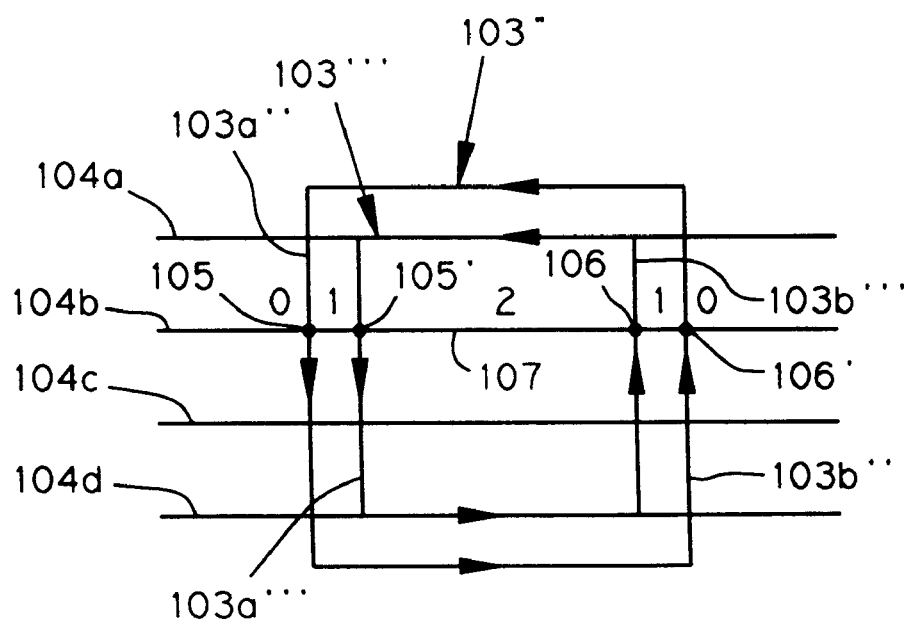

Skin vector generation is illustrated in FIGS. 26*a*–26*c*. FIG. 26*a* illustrates borders 103, and phantom borders 103', which may either be layer or up or down-facing borders, overlayed with infinity lines 104*a*, 104*b*, 104*c*, and 104*d*.

Presently, preferred algorithms for generating hatch and fill only do so by creating vectors parallel to the x-axis.

Therefore, if hatch or skin vectors are to be generated parallel to a direction other than that of the x-axis, the boundary of the area being considered is rotated by an appropriate angle, the appropriate hatch or fill vectors are generated, then both the boundary and hatch or fill are rotated back. This is described further in U.S. Ser. No. 331,644, referenced earlier. This effect is shown in FIG. 26b. The rotated original borders are designated with numeral 103", and the rotated phantom borders are designated with numeral 103'''.

Then, quantitative volume analysis is performed along each of the infinity lines. As indicated previously, all the lines are assumed to originate at infinity, where the quantitative volume number is 0. Then, at each intersection between a line and a segment, the quantitative volume number for the segment is incremented by the orientation value for the segment. Taking infinity line 104b as an example, at intersection point 105, the quantitative volume number for the segment is incremented by the orientation value for segment 103a" (which is 1), to arrive at a quantitative volume of 1. Next, at intersection point 105', the QV value makes a transition to 2. Therefore, at point 105', the generation of hatch vector 107 is begun. Next, at point 106, the orientation number for segment 103b''' (which is −1) is added to quantitative volume number to arrive at a quantitative volume of 1. (As with previous figures, these QV values are indicated on the corresponding portion of the infinity line to which they apply). Since the quantitative volume value has made a transition from 2 or above 2 to below 2, the generation of skin vector 107 is ceased at point 106. Next, at point 106', the QV value makes a transition to 0, which has no effect on the skin vector generation process. This completes the formation of skin vector 107. This analysis is successively performed for each of the infinity lines which intersect the segments.

Next, as shown in FIG. 26c, the border 103' (and the corresponding skin or hatch vectors) is rotated back to its original position, which is designated by numeral 103'. The previously-generated skin vector is also rotated along with the border. The rotated skin vector is identified by reference numeral 107' in the figure. As can be seen, vector 107 is shown retracted from the original border 103.

Note that skin retraction only, and not hatch retraction, is performed in the this embodiment. However, hatch retraction could be performed as well in a similar manner to that described above for skin vector retraction, and is intended to be included within the scope of the subject invention.

Turning back to FIG. 15, in step 40, the rest of the vector types are generated, including border and hatch vectors. The border vectors are simply determined from the border segments, and the hatch vectors are determined from the border vectors in a manner similar to that described above for the generation of skin vectors, with the exception that the spacing of the hatch vectors will typically be wider than that for the skin vectors.

Figure 27A:
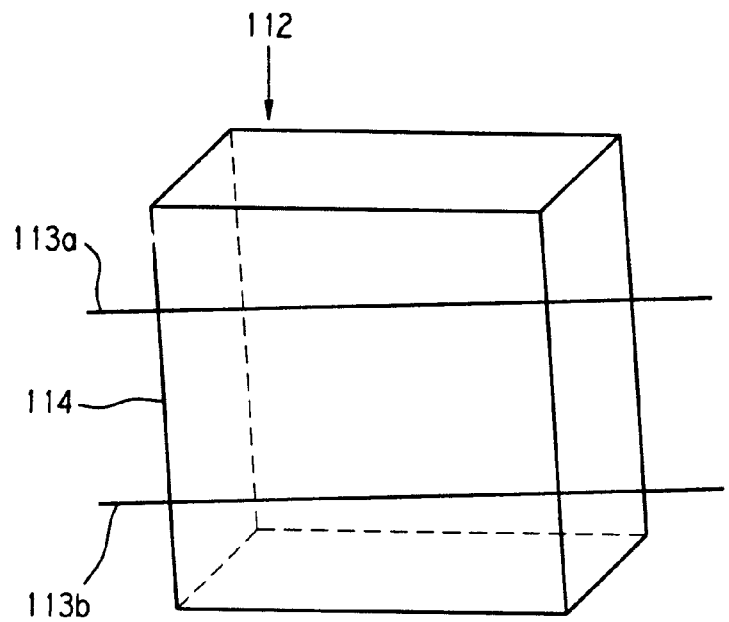
FIGS. 27a–27c illustrate the use of skin retraction to avoid skinning areas too small to benefit from it.
Figure 27B:
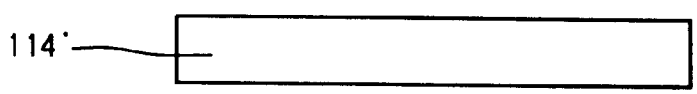
Figure 27C:
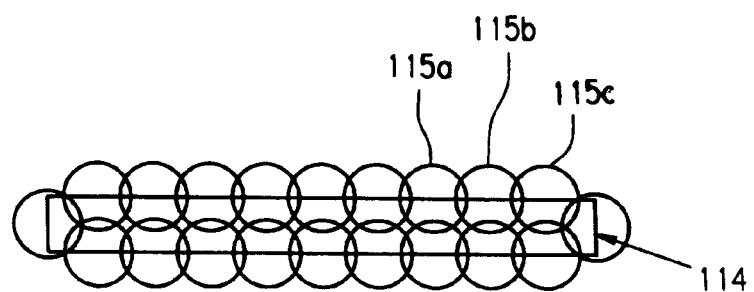

The use of skin retraction to prevent skinning of areas too small to benefit from it is illustrated in FIGS. 27a–27c. FIG. 27a illustrates skewed rectangular box 112, sliced by slicing layers 113a and 113b. Reference numeral 114 references the cross-sections spanned by these two slicing layers, and FIG. 27b illustrates the layer boundary 114' for this cross-section, as viewed from above.

FIG. 27c illustrates this same area after the boundary has been traced by a beam of synergistic stimulation. As illustrated, the beam is typically moved in steps (which are greatly exaggerated), with a delay at each step, and successive beam traces, as the beam successively moves along the border, are identified with beam traces 115a, 115b, and 115c, etc. As shown, the width of each beam trace (in the actual case it would be the width of the relatively smooth line formed by the overlapping beam traces) is such as to completely fill in this area. In this instance, no skin vectors need be generated, This is somewhat analogous to the use of the MSA as described in Ser. No. 331,644, which served a similar purpose in deciding whether to generate skin vectors or not.

The following discussion provides further details about skin retraction. The discussion will be in terms of skin retraction, but will apply equally to hatch retraction.

Skin retraction is accomplished by moving the vertices of up or down-facing borders (already adjusted for line-width compensation while still part of the L border) inwards, then connecting the moved vertices to create phantom borders, and then generating the skin vectors from the merged set of original and phantom borders.

It is accomplished by migrating the vertices along vertex bisectors (as with LWC) until phantom borders drawn from the migrated vertices have been moved inwards by an appropriate amount (about one-half the cure width) from the original borders. If phantom borders from opposing sides touch, or cross over each other, then skin'vector generation will automatically be suppressed in those areas since transitions to 2 or above 2 will not be made. Two illustrative examples are provided in FIGS. 28a–28c.

Figure 28A:
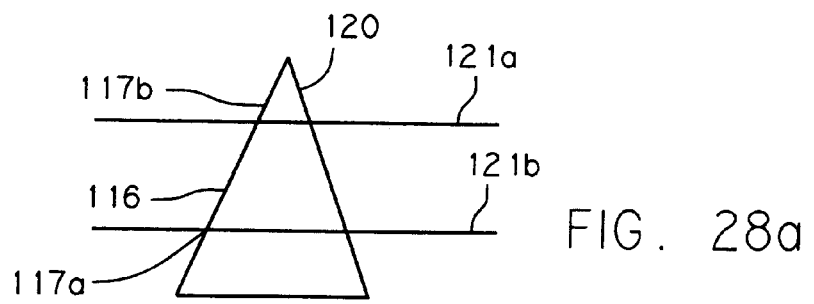
FIGS. 28a–28c illustrate the generation of phantom borders for skin retraction.
Figure 28B:
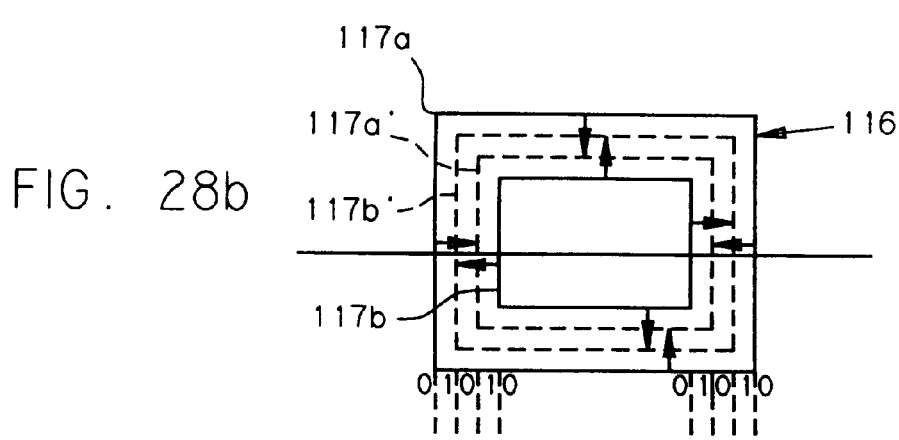

FIG. 28a illustrates a hollow four-sided pyramid 120 (only one side is visible in this sideview) framed by two slicing layers 121a and 121b to form cross-section 116. The layer boundaries for this cross-section are designated by numerals 117a and 117b. FIG. 28b illustrates a top view of these layer borders.

The phantom borders for borders 117a and 117b are shown in phantom (by dashed lines), and identified with identifying numerals 117a' and 117b'. As shown, the phantom borders cross; therefore, no skin vectors are generated. As movement is made along an infinity line which crosses the combined real and phantom borders, the transitions in QV are from 0 to 1 to 0 to 1 to 0 on one side and then 0 to 1 to 0 to 1 to 0 on the opposite side. This is indicated by the series of 0's and 1's at the bottom of the figure. Since no transitions through the range 1 to 2 occur, no skin or hatch is generated.

Figure 28C:
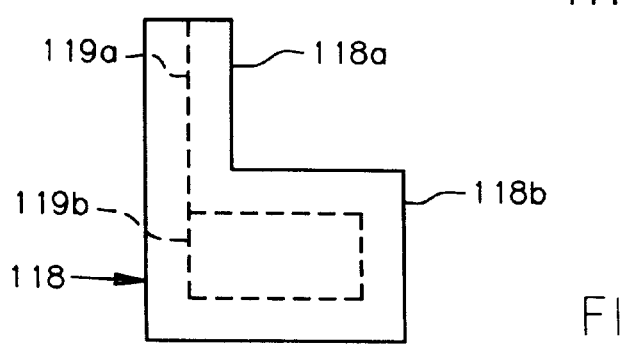

Another example is shown in FIG. 28c, in which the phantom border for border 118 is identified with reference numeral 119. The phantom border 119 comprises phantom borders 119a and 119b. As shown, the phantom borders for the top portion 118a of border 118, have collapsed into phantom border 119a, and are therefore discarded, while the phantom border 119b for the bottom portion 118b of the border 118 have not collapsed, and are therefore retained. As a result, skin vectors will only be generated for the area encompassed by phantom border 119b.

Next, in the creation of phantom borders, several additional steps are performed to further increase resolution and to avoid possible problems. First, the phantom borders at corners, where the angle of the corner is less than 180° as traversed through hollow, are clipped or rounded to further increase resolution, and to avoid the problem of not producing sufficient skin to prohibit possible drainage in the supposedly solid portions of these corners.

Figure 29A:
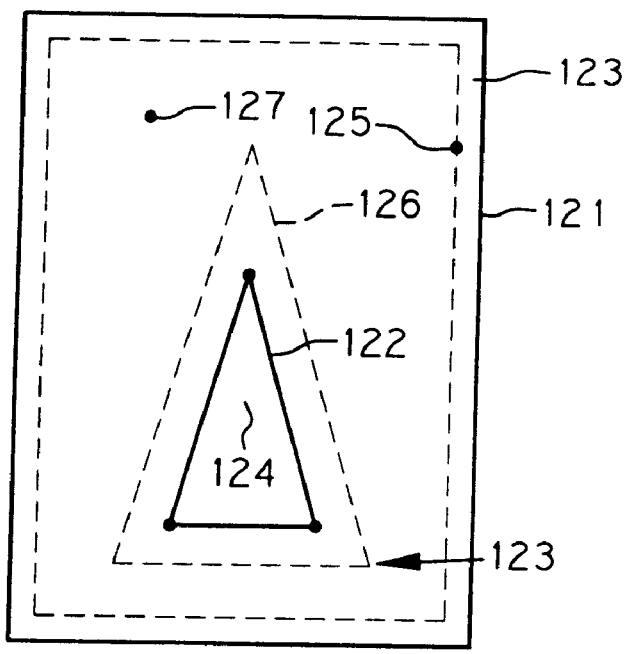
FIGS. 29a–29d and 30a–30d illustrate the clipping of phantom borders at corners.

An example of clipping is shown in FIGS. 29a–29d. FIG. 29a depicts a cross-section of an object along with various real borders and phantom borders that would be produced without utilization of clipping methods. The area 123 between outer boundary 121 and inner boundary 122 is an up-facing area of the layer and the area 124 enclosed by inner boundary 122 is a continuing area. Since area 123 is an up-facing area, skin fill vectors will be generated. However, the skin vectors will be formed in a reduced area 127 which is a subarea of area 123. This sub-area is located between outer phantom border 125 and inner phantom border 126 (drawn in phantom) due to skin retraction as discussed earlier. Phantom borders 125 and 126 are the borders which would be used to determine skin placement if clipping methods are not used. The amount of retraction used in creating phantom boundary 125 from real boundary 121, and phantom boundary 126 from real boundary 122, is typically somewhat less than the cure width associated with curing a vector to a depth equal to that which boundaries 122 and 121 will be cured with.

Figure 29B:
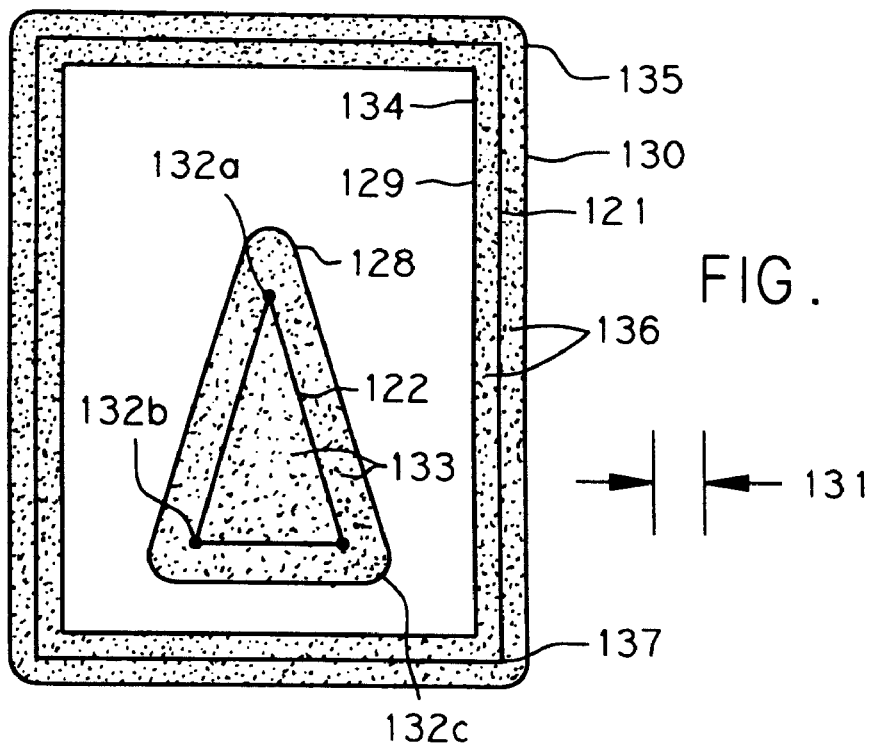

FIG. 29*b* depicts the same cross-section as 29*a* including the real cross-sectional boundaries 122 and 121. Surrounding boundary 122 is contour line 128. Contour line 128 represents the horizontal extent of cure that occurs when boundary 122 is traced with a beam of synergistic stimulation which induces a cure width of dimension 131. A contour which depicts the inner extent of cure when boundary 122 is cured is not shown since the entire area within 122 will be cured due to the size of the area and the width of cure associated with the beam. It can be seen that the extent of cure near vertices 132*a*, 132*b*, and 132*c* does not form sharp corners of cured material, but instead produces curved regions of cured material of radius similar to that of the cure width. The area cured when boundary 122 is exposed is represented by number 133 and is shaded by small dots. In a similar manner, when boundary 121 is exposed, the area 136 (represented by small dashes) between inner contour 134 and outer contour 135 is cured. From considering vertex 137, where two non-collinear boundary vectors meet, it can be seen that on the side of the vectors at the vertex where the angle between the vectors is greater than 180*, the extent of cured material will form a smooth curved surface whereas on the side of the vectors at the vertex where the angle is less than 180°, a sharp corner will be formed.

Figure 29C:
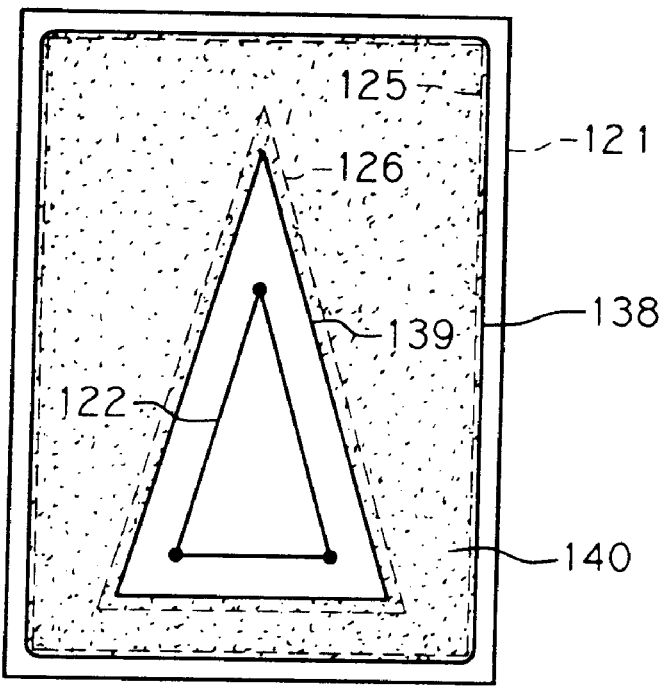

FIG. 29*c* depicts the same cross-section as did FIGS. 29*a* and 29*b*. Real boundaries 121 and 122 are depicted as well as phantom boundaries 125 and 126. Typically, when skin fill is exposed up to a boundary, the cured material associated with the skin fill will extend somewhat beyond the line of the boundary. When clipping methods are not used, skin fill is exposed between phantom boundaries 125 and 126. Contours 138 and 139 depict the extend of cure associated with curing the skin fill vectors up to phantom boundaries 125 and 126, respectively. Therefore, associated with the skin fill is cured material 140, extending between contours 139 and 138. This is depicted in this figure using small dots.

Figure 29D:
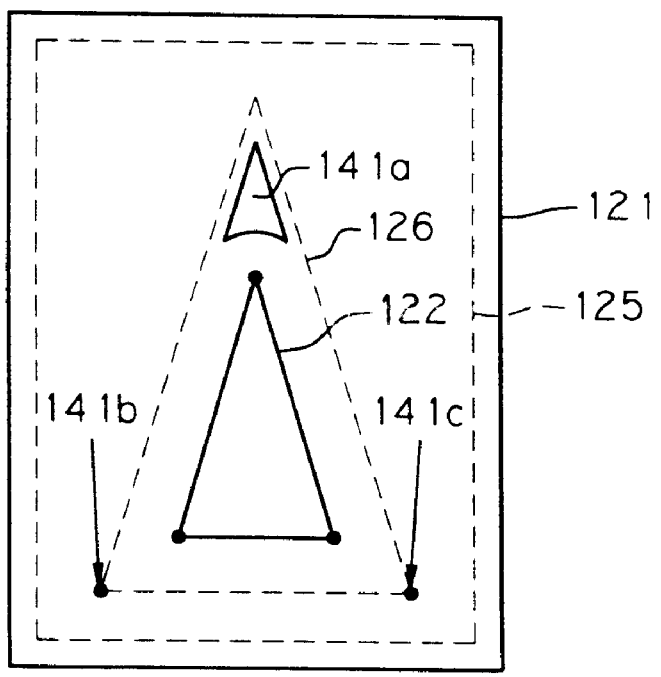

FIG. 29*d* again depicts the same cross-section, but this time, with the cured area described in association with FIGS. 29*b* and 29*c* superimposed. This superposition indicates that there are several regions 141*a*, 141*b*, and 141*c*, within the region that should have been entirely cured, but that did not get cured. Consideration of this Figure as well as the previous three Figures, indicates that when two non-collinear vectors meet, there is an inner and outer edge of cured material associated with the junction, the outer edge being on the side of the vectors where the angle is greater than 180°, while the inner edge is on the side of the vectors where the angle is less than 180°. When curing material along the vectors, the inner edge always forms a sharp point and the outer edge always forms a curved region of transition from one vector to the other. This curved transition region always extends too little along the bisector of the angle, and this lack of extension becomes more severe as the inner angle becomes smaller. Therefore, when one is curing material in association with a portion of an original boundary that contains inner and outer sides, and wherein that portion of the original boundary is being offset in the direction of the outer edge of the boundary so that a secondary (phantom) boundary is formed which is to act as an inner side of a region to be cured, a difference in extent of cure occurs which results in an unexposed region of the part.

Since such uncured regions are undesired, a method of "clipping" has been developed which substantially eliminates the problems of uncured regions, at the cost of possible minor excess exposure in these regions. This method of clipping involves the creation of phantom boundaries that more closely resemble the cure that results from the exposure of the original boundaries. This correction to the phantom boundaries need only occur when the phantom boundary which is being created is offset from the original boundary toward the outer edge of a junction (of two vectors). This is how clipping is implemented in the presently preferred embodiment. Clipping is implemented when the junction is being offset in the direction of its outer edge, that is when the junction is being offset towards the side of the junction which has an angle which is greater than 180°.

It may be conceptually more convenient to literally offset all vectors, and for clipping to occur at all junctions followed by removing any negative areas which may be created. Alternatively, it may be more convenient to literally offset all vectors, recompute the intersection points, and form clipped vectors when an intersection point does not exist due to consecutive vectors no longer intersecting each other after the offset.

Figure 30A:
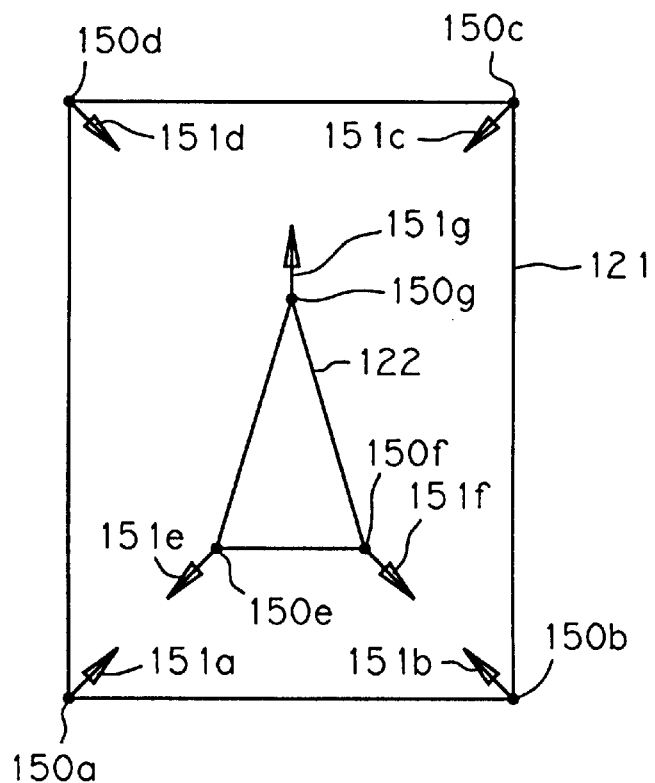
Figure 30B:
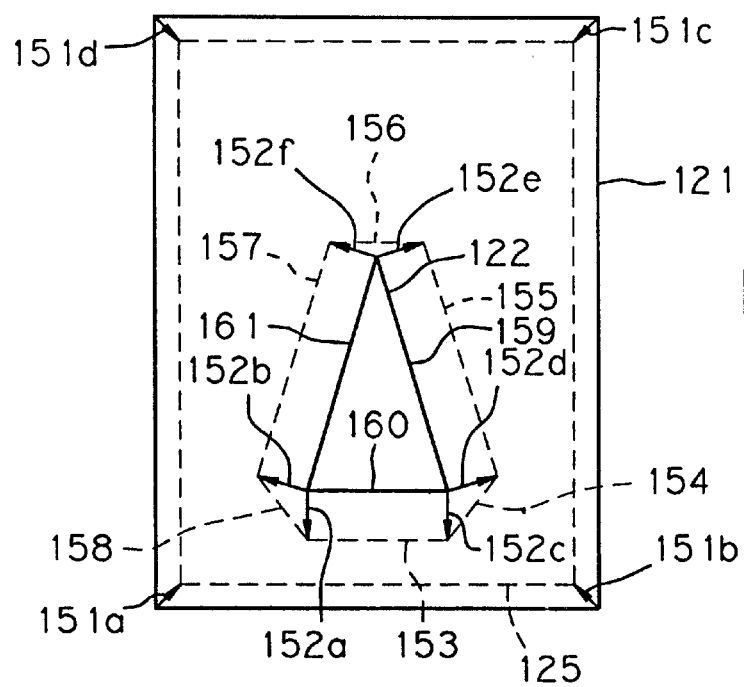
Figure 30C:
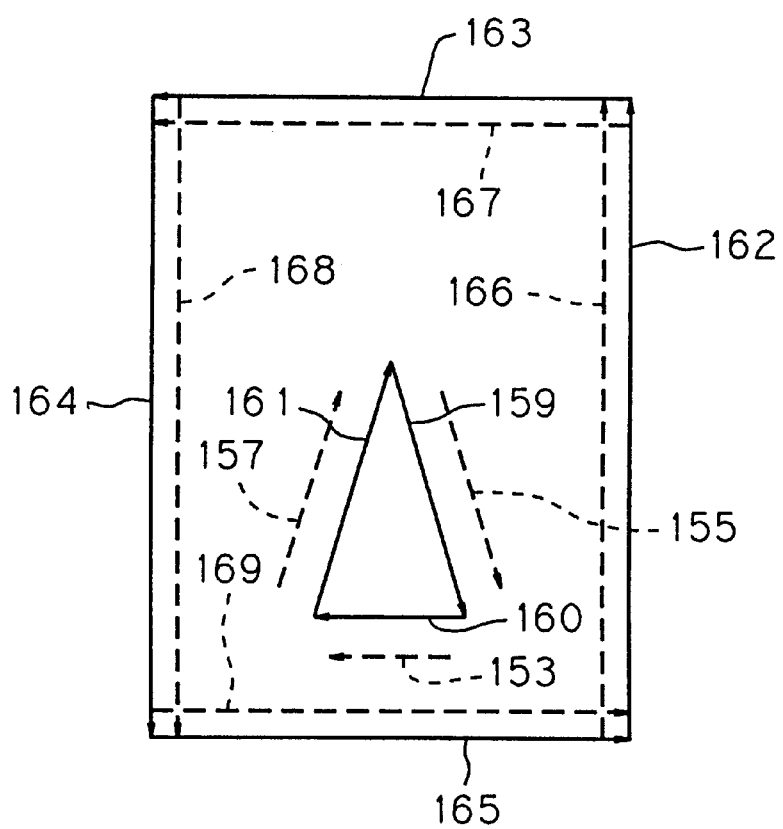
Figure 30D:
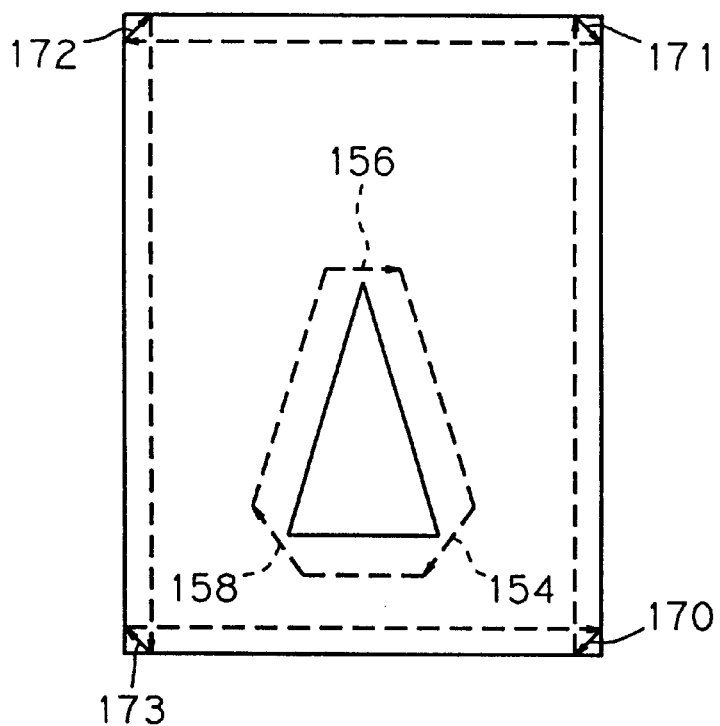
Figure 31B:
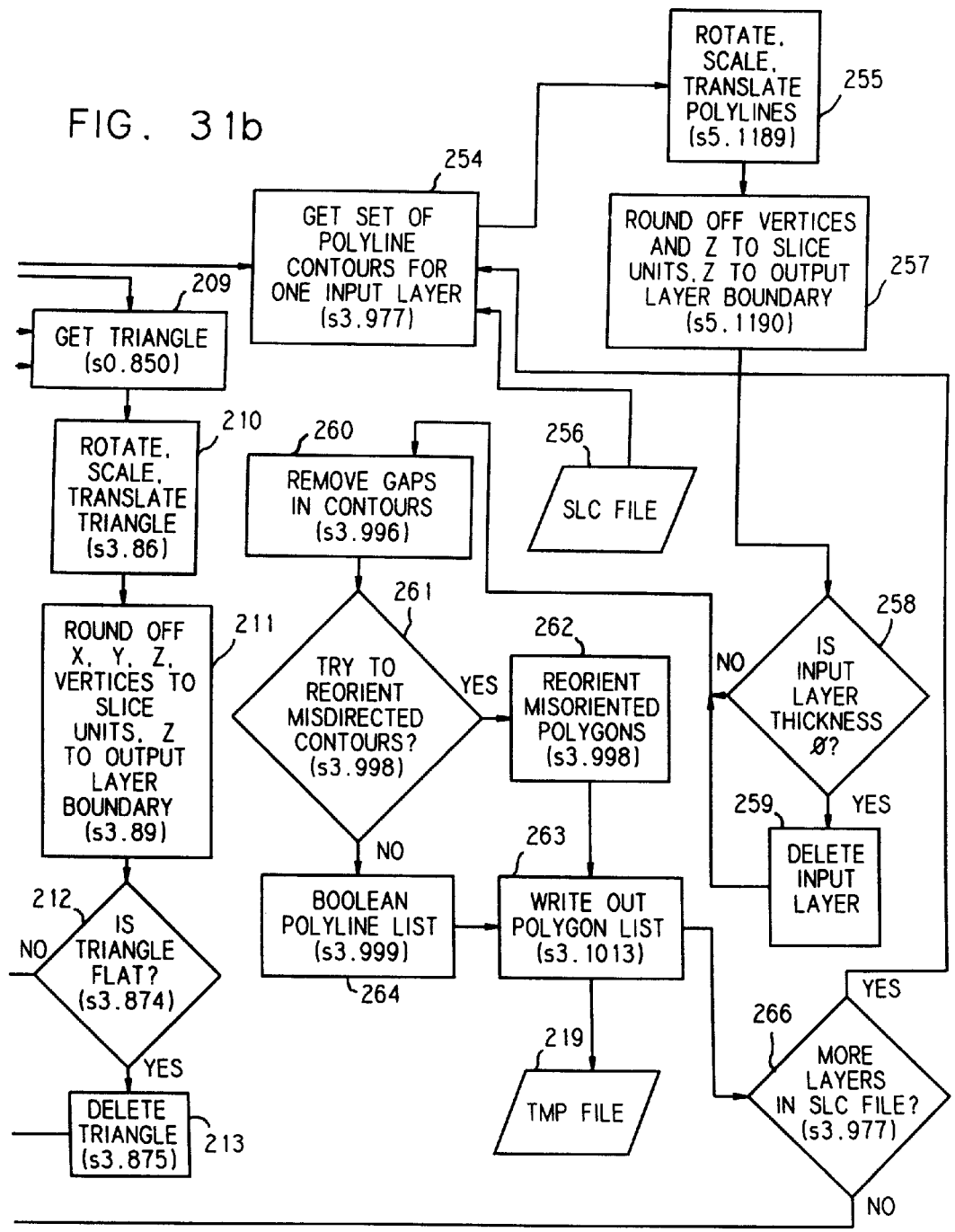
Figure 31C:
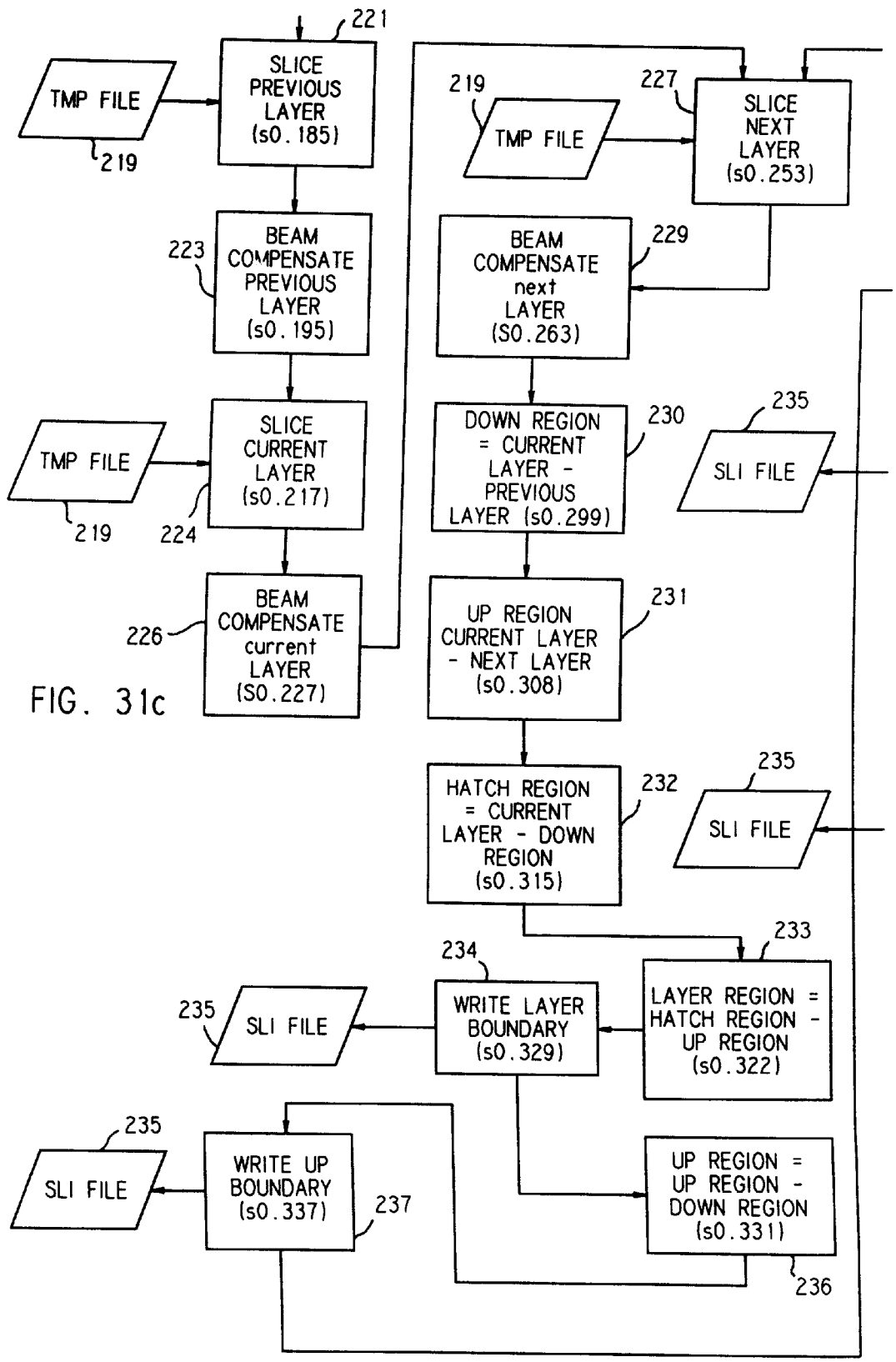
Figure 31D:
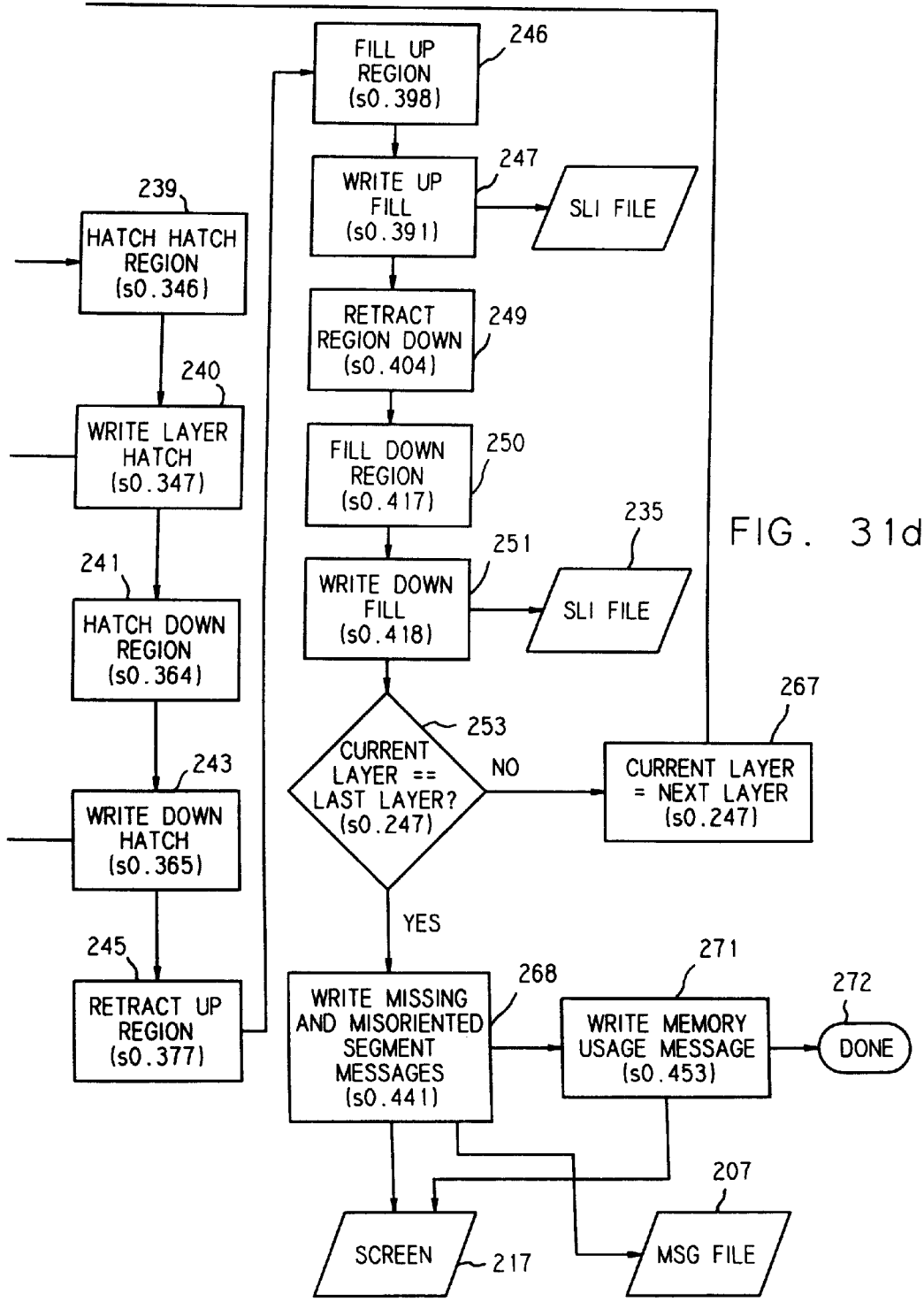

A method of implementing clipping, as applied to the example of FIGS. 29*a*–19*d*, is depicted in FIGS. 30*a* and 30*b*, along with a first alternative being described in FIGS. 30*c* and 30*d*.

FIG. 30*a* depicts the same cross-section as did FIGS. 29*a*–29*d*. Boundaries 121 and 122 are depicted along with vertices 105*a*–150*g* and associated vertex offset vectors 151*a*–151*g*. These offset vectors indicate the direction along which the vertices will be offset to form the phantom boundaries 125 and 126 of FIG. 29*a*. It can be seen that vertices 150*a*–150*d* are offset toward the inner edge of their respective junctions (toward the side which is formed by an angle less than 180°) while vertices 150*e*–150*g* are offset toward the outer edge of their respective junctions (toward the side which is formed by an angle greater than 180°). In this implementation, those vertices which are offset toward the inner edge are offset in a manner analogous to that described for cure width compensation. In other words, the vertex points are moved to the tips of their respective offset vectors. However, the vertices that are to be offset toward the outer edge are not shifted along a single displacement vector. Instead for this embodiment, each of the single angle bisecting displacement vectors 151*e*–151*g* are replaced by two displacement vectors, one associated with and perpendicular to each segment forming the junction. These two new offset vectors continue to indicate an offset to the same side of the junction as did the original offset vector. These new offset vectors are indicated in FIG. 30*b*, in which original offset vector 151*e* has been replaced by offset vectors 152*a* and 152*b*, original offset vector 151*f* has been replaced by offset vectors 152*c* and 152*d*, and original offset vector 151*g* has been replaced by offset vectors 152*e* and 152*f*. These offset vectors are formed by splitting the single vertex point into two vertex points along lines perpendicular to each junction vector individually. It can be seen in the figure that when both ends of a junction (boundary) vector are offset in this manner, this offsetting does not result in a change in length of the vector. Original boundary vectors 159, 160, and 161 become phantom vectors 155, 153, and 157, respectively. However, when a vertex is offset in this way, the original junction vectors are no longer adjacent. Instead, the splitting of the single vertex into two vertices results in the creation of an intermediate segment which connects the two vectors together. Such intermediate phantom segments are depicted in FIG. 30*b* as vectors 154, 156, and 158 for original vertices 150*f*, 150*g*, and 150*e*. These intermediate vectors are called clipping vectors since they clip off a portion of the area which would be incorporated on the inner side of the junctions if the vertices were allowed to offset in the previously described manner. It can be seen, by comparing FIGS. 29*a*, 29*b*, 30*a*, and 30*b*, that the phantom boundary comprising phantom vectors (or segments) 153–158 more closely approximates the outer extent 128 of the region cured when exposing boundary 122 than did the phantom boundary 126 obtained by the previously-described approach. This more accurate approximation forms the phantom boundary which will be used for determining the extent of cure associated with skin fill. Therefore, this more accurate approximation removes the undesirable untransformed regions 141*a*, 141*b*, and 141*c* of FIG. 29*d* that would typically be formed by the non-clipping approach described earlier.

FIGS. 30*c* and 30*d* depict another way of conceptually understanding and implementing clipping methods of skin retraction. Instead of offsetting vertices, all vectors can themselves be shifted perpendicular to themselves by the desired amount. This is indicated in FIG. 30*c* where vectors 159, 160, 161, 162, 163, 164, and 165 are the original vectors which, when offset, produce phantom vectors 155, 153, 157, 166, 167, 168, and 169 which are offset by the proper amount in the proper directions. It can be seen that all vectors retain their original length. Each boundary and phantom vector in the figure also contains an arrow head which indicates its respective orientation. Next, each pair of successive vectors, that no longer adjoin head to tail, have the gap bridged by the creation of an additional vector which is oriented in a manner compatible with the orientation of the pair. Several such bridging vectors are indicated in FIG. 30*d*. Vector 171 bridges vector 166 to 167, 172 bridges 167 to 168, 173 bridges 168 to 169, 170 bridges 169 to 166, 158 bridges 157 to 153, 154 bridges 153 to 155, and 156 bridges 155 to 157. Next, at points where vectors cross-over, they are split into smaller vectors, so that independent polygons can be formed. These polygons are then evaluated to see if they should be retained for use as phantom borders for skin fill production. If a polygon is determined to contain negative area, that is if the quantitative volume associated with it is determined to be negative, it is removed from further consideration as a possible phantom border. On the other hand, if a polygon is determined to contain a quantitative volume with a positive or zero net value, it is retained as a phantom border.

An additional alternative method is to use the approach just described for offsetting entire vectors, followed by the creation of properly oriented bridging vectors for those pairs of successive vectors that no longer touch or cross each other (as described above). This is followed by the determination of intersection points (new vector heads and tails) for those pairs of successive vectors that did crossover each other, which is followed by the splitting of vectors where they crossover each other (this pertains to non-successive vectors), which is followed by the determination of consistently oriented polygons (all vectors in the polygon have compatible orientations). These polygons remain for further processing and removal of inconsistently oriented polygons, (where one or more vectors within a polygon have incompatible orientations), followed by the removal of polygons which contain negative areas. The remaining polygons are used to form the phantom boundaries which are used in determining extent of skin fill.

The computer software used to implement the first embodiment is advantageously written in the C language, and executes on an NEC, Silicon Graphics, or IBM compatible computer or the like. This computer is known as the SLICE computer, and is a component in an overall stereolithography apparatus described in any of the aforementioned co-pending applications, most notably Ser. Nos. 331,644; 365,444; and 428,492. As described in these applications, the SLICE computer is coupled to a PROCESS computer, which, in turn, is coupled to a recoating means, and to scanning means. Alternatively, the SLICE computer and PROCESS computer may be a single computer. The recoating means typically comprises a z-stage elevator, a platform movable by the z-stage elevator in a z-direction, and a doctor blade sweepable in a plane spaced at or above a working surface of the stereolithography material. Recoating occurs by means of the PROCESS computer directing the elevator to lower the platform below the working surface by more than the desired layer thickness, raising the platform so that any excess material is within the path of the blade, and then directing the doctor blade to sweep the excess material away. The scanning means typically comprises x- and y- scanning mirrors for directing a beam of synergistic stimulation along the working surface in x- and y- direction:, respectively. Scanning occurs by means of the PROCESS computer obtaining a vector from the data supplied by the SLICE computer (or alternatively from slicing the object itself and creating the vectors as needed), directing the scanning mirrors to position the beam at the tail of the vector, and then directing the scanning mirrors to move the beam to the head of the vector, at a particular velocity, whereupon the beam traces the vector on the working surface of material, and selectively transforms a desired portion of the material.

The SLICE computer typically receives a formatted object representation from an external source, and then generates the vectors from the formatted object representation. In Ser. No. 331,644, the external source described is a CAD system, which is assumed to have formatted a user-generated object representation in the specified format.

The SLICE computer typically generates the border, hatch, and skin vectors. However, other embodiments are possible. Ser. No. 428,492 describes a "slice on the fly" implementation, whereby the SLICE computer generates the border vectors only, and distributes hatch and skin vector generation to the PROCESS computer. Moreover, the PROCESS or SLICE computers need not be single computers, but can be a multi-processor configuration, in which parallel processing is employed. Ser. No. 428,492 describes a coupled processor configuration whereby one processor generates hatch and skin vectors, another processor performs drift and geometrical correction on the vectors, and a third processor issues positioning commands to the mirror, and monitors this positioning with respect to the desired positions. Also possible is an optical computer embodiment. Although no optical computers are presently available commercially, current research indicates they show promise in performing boolean operations optically. The proceedings of the 10th International Optical Computing Conference of 1983, contains a paper by J. Tanida and Y. Ichioka entitled "Optical Logic Array Processor" which gives further details on this topic. This referenced paper is fully incorporated by reference herein as though set forth in full.

Typically, the SLICE computer specifies the desired layer thickness for each layer, either from user input or from the data obtained from the external source, slices the object representation accordingly, and then passes this data to the PROCESS computer, which in turn directs the recoating means to provide a layer of stereolithography material having the specified layer thickness.

Because of the finite tolerance of the layer recoating process, it may not be possible to obtain a layer of material exactly of the desired layer thickness. Instead, it may only be possible to obtain a thickness which is within a few mils (i.e., 2–3 mils) of the desired thickness.

Therefore, as an alternative to the above, a "recoating on the fly" algorithm is possible (which is to be distinguished from the "slice on the fly" algorithm discussed previously), whereby recoating takes place first, the precise layer thickness is determined, and then the slicing algorithm is executed to slice the next layer representation out of the object representation, using this previously-determined layer thickness. The advantage of doing so is to ensure exact correspondence between the assumed layer thickness (which determines the exposure of the synergistic stimulation to be used to trace the layer) with the actual layer thickness. If the assumed value of thickness is greater than the actual value, then the present layer will be overcured by more than the desired amount into the previous layer, which can lead to associated distortion problems. If the assumed value of thickness is less than the actual value, then the present layer will be overcured by less than the desired amount into the next layer, which can lead to associated adherence problems. Exact correspondence between these two values will eliminate these two problems. Additionally, if a recoating method is used which is not self-compensating, as was the previously-described embodiment, then any slight error in thickness may continue to build up from layer to layer resulting in a final part whose vertical dimensions are out of tolerance.

A second and most preferred embodiment of the subject invention will now be described. This embodiment is very similar to the first embodiment. Therefore, only those aspects of the second embodiment which are deviations from the first embodiment will be emphasized.

As an overview of these deviations, a significant aspect of this embodiment is the ability to accept, as input, border representations of a three-dimensional object as opposed to just a tesselated triangle formatted object representation as per the previous embodiment. As a result, this embodiment can accept input directly from a CAT Scan system or the like, which provides input in the form of a plurality of spaced, cross-sectional scans of a three-dimensional object. Each of these cross-sectional scans will include information descriptive of the borders of each scan, and this is the information which this embodiment requires. of course, this embodiment retains compatibility with the tesselated triangle formatted object representation as per the first embodiment, which is provided by most commercial CAD systems, Another deviation of this embodiment is the orientation values assigned to the segments. In the previous embodiment, all segments were oriented according to the right hand rule, and segments pointing downwards were assigned an orientation value of 1, while those pointing upwards were assigned an orientation value of −1. In this embodiment, this is reversed, with upward-pointing segments being assigned an orientation value of 1, and downward-pointing segments being assigned an orientation value of −1. Then, to compute the QV value along the infinity lines, at the intersection points with the segments, in the course of performing a union operation, intersection operation, hatch generation, or skin generation, the orientation values are subtracted from the QV value just prior to intersecting the segment, instead of being added to this QV value as per the previous embodiment. Therefore, the target transition values for all these operations can remain the same.

Another important aspect of this embodiment is its ability to slice larger stl files with less or no use at all of virtual memory. In this embodiment, an stl file is read, the triangles are sorted by their minimum z values, and the sorted triangle data is output to a temporary file. Then, the SLICE program only brings into memory the triangle data pertaining to a desired range of layers as opposed to holding the whole stl file in memory during the processing. After processing the various layers that a particular triangle pertains to, the triangle is discarded from memory. This reading in of only necessary triangles results in two significant benefits: (1) More memory is left available for the slicing process thereby reducing the need for memory swapping to the hard disk, and also resulting in faster slice times for files that would have required memory swapping; and (2) the need for maintaining large quantities of memory is reduced thereby reducing the cost of the computer system.

Various alternative schemes can be used that lead to various additional advantages. The first of these alternatives is to not create a sorted stl file but to instead create a table, by scanning the stl file, that contains information on how many triangles are associated with each layer. Then, each time additional triangle data is needed, the file can be scanned and triangles loaded into memory until the proper number of them have been loaded. This has somewhat of a disadvantage in processing time over the previous approach but has the advantage of not requiring hard disk space to store an extra (sorted) stl file.

A second alternative or set of alternatives is with regard to loading in as much of the stl file as possible but avoiding the need to utilize time-consuming virtual memory. The amount of memory needed to process a given layer is, to a large extent, based on the number of triangles that contribute to vector formation on that layer. Therefore, an embodiment can be used where the number of triangles associated with the necessary process for each layer can be determined. This information can then be matched to the estimated amount of additional memory needed to process the triangular data into vectors. Then, the optimum amount of input data can be read in at the optimum times in order to minimize the number of disk accesses and to maximize memory use thereby minimizing the slicing time associated with large files. For some files, these techniques will not only optimize the slicing process, but they may be necessary to ensure the ability to slice extremely large files with a reasonably priced and sized computer.

Additional features of the presently preferred embodiment are discussed in Appendix A. Some of these features, especially those associated with the large variety of user specifiable parameters, make the SLICE program extremely powerful and versatile.

This completes an overview of the major deviations. A flowchart of the second embodiment, provided in FIGS. 31a–d will now be discussed.

In this embodiment, functionality is provided in the form of computer software, executing on the SLICE computer.

This program is also designed to be executable on the PROCESS computer as well. At present, the computer software is known as SCHLEISS, and comprises seven modules, known as S0.C to S6.C. A user's manual for SCHLEISS is provided in Appendix A, and a program listing is provided in Appendix B. The major functions performed by each module are listed in the header information contained at the beginning of the computer listing for that module, and are also provided at pp. 5–18, 20–29, and 81–118 of Appendix A. Module S0.C is the first module to be executed, and is the major module dictating the sequence in which all the remaining modules are invoked. The flowchart provided in FIGS. 31a–31d is keyed primarily to lines in the listing of S0.C.

Turning to FIGS. 31a–31d, the elliptically shaped polygons represent starting and stopping points of SCHLEISS, the rectangular-shaped polygons all represent process steps, the diamond polygons all represent decision points, and the trapezoidal-shaped polygons all represent input or output files. As indicated previously, for each process step, the flowchart indicates the particular SCHLEISS module, and the line number within that module, where that particular process step is executed.

In step 200, the SCHLEISS program is started. In step 201, the memory manager is initialized. Briefly, the memory manager allocates and deallocates memory in response to requests by the various SCHLEISS functions. The specific functions performed by the memory manager are provided on pp. 82–83 of Appendix A.

In step 202, the time counter is initialized. Briefly, this counter is incremented as the execution of the program progresses, and is. used to keep track of and possibly record the execution times of the various SCHLEISS functions. The specific SCHLEISS routines to keep track of this timing are listed on pp. 83–84 of Appendix A.

In step 203, SCHLEISS obtains the specifications for slicing from the user. The specific SCHLEISS routines for obtaining this information are provided on pp. 86–88 of Appendix A.

As indicated, the user information is obtained from both command line 204 and from arg file 205. The specific parameters which can be specified in the command line, as well as the required format for the command line, are listed on pp. 32–33 of Appendix A. Another vehicle available to a user for specifying parameters is the arg file 205. The parameters that can be specified in the arg file, and the required format for this file, are set forth on pp. 41–42 of Appendix A.

In step 206, SCHLEISS writes out the user-specified parameters to both msg file 207, and screen 217. The screen is the output screen for viewing by the user, while the msg file is simply a file where this information is stored. In step 206, the same information written out to the msg file is written out to the screen. Pages 57–60 provide more detail about the format of the msg file and the screen.

In step 208, a query is made as to the type of input. As indicated previously, the input may either be in the form of triangles, or alternatively, may be in the form of border representations known as polylines.

The situation where triangles are input will be considered first. In step 209, the triangles are obtained from stl file 216. The format of the stl file is described at pp. 46–48 of Appendix A.

In step 210, the triangles are rotated, scaled, or translated according to the user-specified parameters. This step is described in more detail at pp. 54–56 of Appendix A.

Next, in step 211, the x, y, and z coordinates of all triangle vertices are rounded to slice units, and in addition, the z coordinates of all vertices are rounded to the nearest slicing plane. Only the z coordinates are so rounded since the z-axis is the assumed slicing axis. This step is referred to on pp. 7 and 120 of Appendix A.

Then, in step 212, a query is made to determine which triangles are flat triangles. Then, in step 213, all flat triangles are deleted. Flat triangles are deleted, since they are redundant to the other triangles in terms of creating layer boundaries.

In step 214, a query is made as to whether any triangles remain in the stl file. If so, a loop is made back to step 209, and steps 209–214 are repeated until no further triangles are available.

In step 215, as discussed previously with respect to the first embodiment, the triangles are sorted by the minimum z coordinate of any of their vertices.

In step 218, the sorted triangles are written out to tmp file 219. The format of the tmp file is described on pp. 54–56 of Appendix A.

In step 220, the "current layer" indicator is initialized to the first layer to slice. In the current implementation, this is the first layer of the object which is comprised of data obtained from between the first and second slicing planes. The created cross-sectional data is then associated with the z value of the upper slicing plane.

In step 221, the previous layer, i.e., region below the first slicing plane (which yields data) is sliced yielding the null set of vectors.

Slicing is done in the manner described previously with respect to the first embodiment, to obtain a net layer boundary comprising intersections between the triangles in the tmp file 219 and the two slicing planes bounding the layer. Slicing is also described at p. 69 of Appendix A.

In step 223, this boundary is beam compensated in the manner described previously with respect to the first embodiment. This step is additionally described at p. 74 of Appendix A.

Then, in steps 224 and 226, the current layer is sliced and compensated using the triangles in tmp file 219, to form a boundary for the current layer utilizing intersections between the triangles and the slicing planes bounding the layer.

Next, in steps 227 and 229, the next layer is sliced and beam compensated to provide a beam-compensated boundary for the next layer in the manner previously described with respect to the first embodiment. These compensated boundaries are the singly adjusted layer boundaries, L[i]', discussed previously.

Next, in step 230, any down-facing region associated with the current layer is computed by taking the boolean difference, in the manner described previously with respect to the first embodiment, between the layer boundaries for the current layer and the previous layer. This step is briefly discussed at p. 58 of Appendix A. The boolean difference operation is additionally described on pp. 70–72 of Appendix A. These boundaries are used to generate the FDB vectors previously described with respect to the first embodiment.

In step 231, any up-facing region for the current layer is computed, in the manner described previously with respect to the first embodiment, by taking the boolean difference between the current layer boundary and the next layer boundary.

In step 232, the hatch region for the current layer is computed as the boolean difference between the current layer boundary and the boundary for the down-facing regions.

In step 233, the layer boundaries are compensated by removing any down-facing regions and any up-facing regions from the area encompassed by the hatch boundary. This is accomplished by taking the boolean difference between the hatch region and the up region. These layer boundaries are the thrice-adjusted layer boundaries, L[i]''', discussed previously, and are used to generate the L[i]''', vectors also previously described.

In step 234, the LB vectors for the current layer are written out to sli file 235. The format of the sli file is set forth on pp. 61–68 of Appendix A.

In step 236, any up-facing boundaries are adjusted to remove any down-facing regions encompassed by these boundaries. This step is performed in order to prevent the down-facing regions from getting over-cured. These boundaries are the adjusted up-facing boundaries, U[i]', discussed previously, and are used to generate the FUB vectors. In step 237, the FUB vectors are written out to sli file 235.

In step 239, the hatch region is hatched in the manner described previously. Hatching is also discussed on p. 73 of Appendix A. Hatching results in the LH vectors described previously. In step 240, the LH vectors for the hatch region are written out to the sli file.

In step 241, the down-facing regions are hatched. These regions are hatched separately from the rest of the layer boundary so they will not be overcured. This step results in the NFDH vectors described previously.

In step 243, the NFDH vectors are written out to sli file 235.

In step 245, the up-facing boundaries for the up-facing regions on the current layer are retracted in the manner described previously. This step is also discussed on p. 75 of Appendix A.

In step 246, the fill vectors for the retracted up-facing boundaries are generated in the manner described previously. This results in the FUF vectors described previously. This step is also described on p. 73 of Appendix A.

In step 247, the FUF vectors are written out to sli file 235.

In step 249, the down-facing boundaries are retracted in the manner described previously. This step results in the adjusted down-facing boundaries, D[i]', described earlier.

In step 250, the fill vectors (the FDF vectors) for the down-facing regions are generated in the manner described previously, and in step 251, these vectors are written out to sli file 235.

In step 253, a query is made to determine if the current layer is the last layer in the stl file. If not, in step 267, the "current layer" indicator is set to the next layer, and steps 227, 229–234, 236–237, 239–241, 243, 245–247, 249–251, and 253, previously described, are repeated for this layer.

When all layers have been processed, in step 268, messages regarding missing or misoriented segments are written out to the output screen 217, and to msg file 207. The format of the msg file is provided on pp. 58–60 of Appendix A. The output screen is discussed on p. 57 of Appendix A.

In step 271, memory usage messages are written out to the screen and msg files. An example of these messages are shown on pp. 58–60 of Appendix A.

In step 272, the process is considered completed.

Turning back to step 208, the case where the inputted data is already in the form of layer boundaries will now be described. As indicated, the input data should be in the form of polylines, described in more detail on pp. 49–53 of Appendix A. These are obtained from slc file 256.

In step 254, the polylines for a given layer are obtained, and in step 255, these polylines are rotated, scaled, and translated according to user-specified parameters, in a similar manner to that described previously for the triangles.

In step 257, in a manner similar to that described previously for the triangles, the polyline vertices are rounded to sli units, and the z-component of each vertex is rounded to the nearest slice layer.

In steps 258–259, all polylines having an inputted layer thickness of 0 are deleted, since these layers represent layers which have collapsed upon rounding, and which therefore, are redundant.

In step 260, any gaps in the polyline contours are filled by generating additional segments to fill in the gaps, and in step 261, a user-specified flag is checked to see if misdirected segments are to be reoriented. If so, in step 262, one attempt is made to reorient any misdirected segments in a polyline contour. This can be detected, since all segments within a polyline contour are expected to obey the right hand rule, whereby segments in a contour enclosing a solid do so in a counter-clockwise direction, while segments in a contour enclosing a hollow do so in a clockwise direction. For example, if all segments in a contour except one follow a counter-clockwise oriented loop, these segments are assumed to enclose a solid, and the direction of the one segment will be changed to be consistent with the others.

If the user-specified flag is not set, a jump is made to step 264. In this step, adjusted segments are combined as much as possible. This step is described on pp. 70–72 of Appendix A.

In step 263, the polylines are written out to tmp file 219. The format of the tmp file is described on pp. 54–56 of Appendix A.

In step 266, a query is made as to whether any additional layers exist in the sli file. If so, steps 254, 255, 257–264, and 266, described previously, are repeated for each layer in the sli file.

Then, a jump is made to step 220, and the same process described previously, beginning with step 220, is performed using the tmp file 219.

The above completes a description of a flowchart of the implementation of the second embodiment. Next, some additional aspects of Appendix A will be described.

Pages 44–45 describe the use of the mat file. Pages 70–72 describe the segment operations which are available in the software. Page 73 describes the operations available in the software for performing hatch and fill generation. Pages 76–80 describe error tests available in the software. Page 119 describes differences between a recent version of the software and a previous version.

Pages 81–118 provide a functional description of SCHLEISS modules S0.C to S6.C, i.e., it lists the major functions provided in each module, Again, the actual listing of the software is provided in Appendix B.

Another file, SMAKE, when executed, calls SCHIRIS.MAK, which, in turn, approximately combines S0.C to S6.C, and S.H.

In the previously-described embodiments, the resulting object will be oversized compared to the original representation of the object. In essence, the oversizing is not in the vertical dimension of the object formed, it is basically in the horizontal dimensions of the object formed. However, whenever a horizontal dimension is cured in excess, a corresponding one layer thickness will result in the region of excess where there should have been a cure thickness of something less than one layer thickness. As described previously, the accuracy of reproduction of an oversized object can be increased substantially by sanding off the discontinuities between layers in the regions of the object, whose design did not specify such discontinuities (corresponding to sloped regions in the original design).

Objects formed by this oversized style basically have at least a portion, on each layer, of their surface that match the envelope of the object representation while the other portions of the surface of the formed object extend the solid portions of the object beyond the envelope.

There are other styles that lead to other sized objects, wherein these other sized objects have advantages in terms of object buildability, or in terms of object accuracy. One such embodiment forms undersized objects that are in essence opposite to the oversized objects previously described. Such an undersized style is disclosed in previously referenced U.S. patent application Ser. No. 331,644. Objects formed by this undersized style basically have at least a portion, on each layer, of their surface that match the envelope of the object representation while the other portions of the surface of the formed object do not extend the solid portions of the object up to the envelope. A basic form of this style can be easily implemented by a slight modification to the earlier described embodiments of the present invention. The modification involves a change in the information and boolean operations used to form the initial layer boundaries for a given cross-section. These layer boundaries L[i] are derived by finding the intersection of the area of the S[i−1]+ borders with the area of the S[i]− borders. In this embodiment, the projection information is not used. After formation of all of the L[i] boundaries, the previously-described operations are used to determine the "+," "−", and new layer boundaries for each layer. This undersized embodiment is particularly useful when discontinuities are to be filled in. This filling in can be done by application of a post-processing technique which fills the discontinuities with material and transforms this material to become part of the final object. Alternatively, and more preferably, this filling in of discontinuities can be performed on a layer-by-layer basis as the object is being formed. Techniques for, and advantages of methods for achieving such coatings are described in previously-referenced, concurrently filed U.S. patent application Ser. No. 07/605,979, now U.S. Pat. No. 5,209,878.

Another style produces objects which are more undersized than those of the previous embodiment. This style is used to build objects whose maximum solid extent does not result in the appropriately registered reproduced object and object representation envelope contacting each other. This type of sized object is useful when, after formation, the entire surface of the object is to be coated, even in areas that do not contain discontinuities, with a material (e.g., paint, powder coating, metallic coating). So that the surface of the coated object will more closely match the envelope of the object representation, the entire surface of the object must be retracted into the solid regions. This building style can be implemented by the techniques of the present invention. It requires layer comparisons (especially differencing) to offset the down-facing and up-facing features away from their original positions by the appropriate amount (this amount should be approximated by an integral number of layer thicknesses) so that the down-facing and up-facing portions of the object do not contact the object envelope. It also requires a form of LWC or boundary retraction so that horizontal solid portions of the layers can be retracted away from the object envelope.

A style calling for an averaged sized object can also be implemented based on the techniques of the present invention. This implementation involves the use of additional slicing planes which are located, one each, midway between the slicing planes used to define the positions of triangle vertices of the object representation. The initial layer boundaries L[i] are determined from intersections of the intermediate (midpoint) slicing planes with the triangles that form the representation of the object. These initial layer boundaries are processed according to the teaching previously disclosed to determine up-facing, down-facing, and net layer regions for each cross-section of the object. These initial layers boundaries are conceptually associated with the higher of the two original slicing planes which bound the vertical extent of the layer. After determination of the various net regions associated with each cross-section (or layer), an object can be formed which will be of average size as compared to the objects built by the undersized and oversized styles previously described. In other words, the discontinuities which form due to the object being reproduced on a layer-by-layer basis, wherein the layers have finite thickness, are formed half extending beyond the envelope of the object and the other half falling short of the envelope.

Figure 32A:
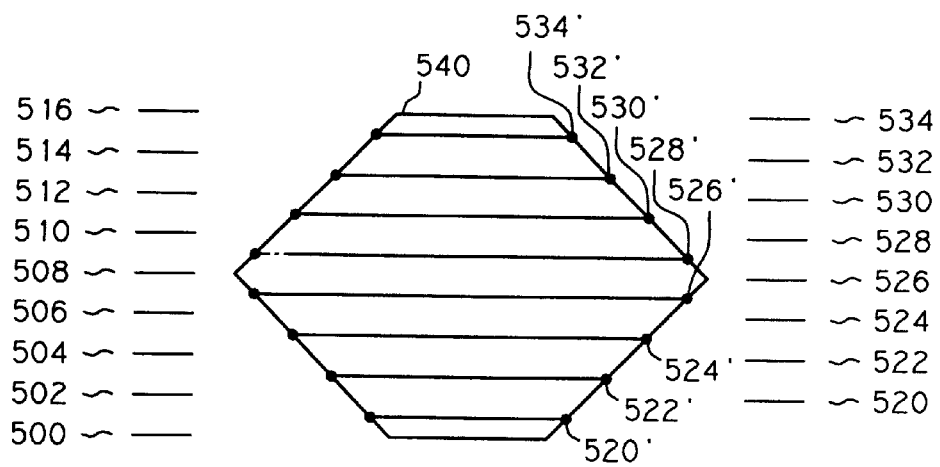
FIGS. 32a–32d illustrate the use of various building styles with the subject invention.
Figure 32B:
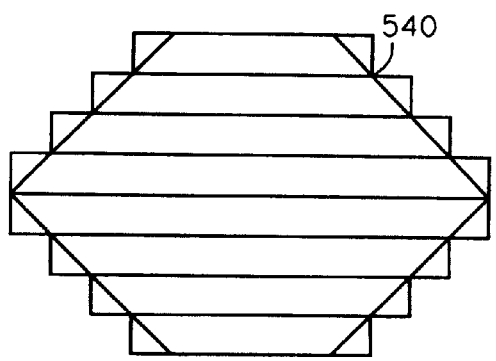
Figure 32C:
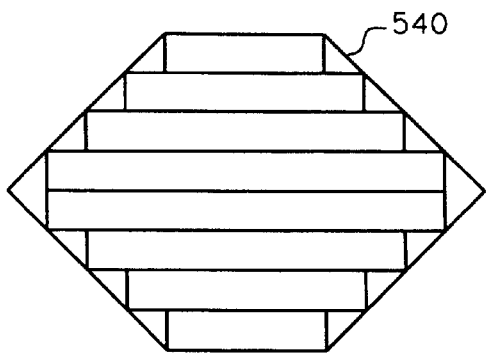
Figure 32D:
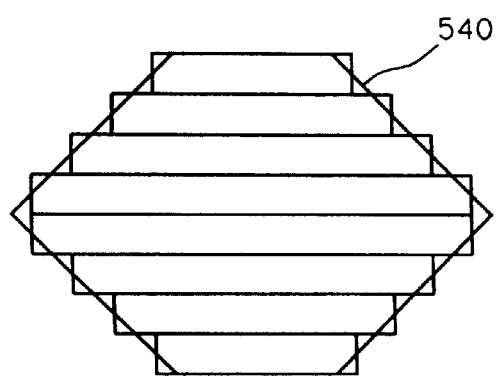

FIG. 32a depicts a two dimensional view, the two dimensions being the vertical dimension and one horizontal dimension of an object envelope 540 of an object which is to be formed by stereolithography. Planes 50, 502, 504, 506, 608, 510, 512, 514, and 516 depict the vertical position of the slicing planes which bound the vertical extent of each layer to be formed and define the possible vertical locations that triangle vertices can be rounded to, whereas slicing planes 520, 522, 524, 526, 528, 530, 532, and 534 define the vertical dimension from which intersection segments with the triangles will be obtained. The data obtained from slicing plane 520 will be associated with slicing plane 502, since it represents the average positions of the cross-sectional information between slicing planes 50 and 502. Similar up-shifting of data obtained from the other intermediate slicing planes will occur. FIG. 32b depicts the same object envelope 540 superimposed over layers of the object formed using an oversized building style. FIG. 32c depicts the same object envelope 540 superimposed over layers of the object formed using an undersized building style. FIG. 32d depicts the same object envelope 540 superimposed over layers of the object formed using an average sized building style. Examination of these figures indicate why each style was so named. The oversized style is useful when post-processing involves material removal techniques; the undersized style is useful when post-processing or layer-by-layer processing involves filling techniques; and the average size style is useful when it is desired to have reasonably high accuracy without any additional processing.

CURE WIDTH COMPENSATION

As previously-described, if any cure width compensation is desired it can be implemented prior to the determination of the three independent regions of a layer. Alternatively, it may be implemented after the three independent regions are determined, thereby allowing different compensation values for each region. However, when following this alternative approach it is necessary to compensate the boundaries properly. When following this alternative approach, all the LB[i] vectors are compensated inward (normal compensation). The DB[i] and UB[i] vectors that were derived, as per the subject invention, from comparing the uncompensated layer boundary for a present layer to the uncompensated boundaries of the previous and next layers, respectively, should be compensated outward (reverse compensation). The DB[i] and UB[i] vectors that comprise boundaries of the present layer (before separation into three regions) are compensated inward, and the UB[i] vectors that are derived from the DB[i] vectors of the present layer (prior to compensation) are compensated inward. The amount of compensation of these vectors may differ according to the sources from which they are derived. LB[i] vectors are compensated by an amount A[i]. UB[i] and DB[i] vectors, which are derived from the uncompensated boundary of the next or previous layer, are compensated by the amount A[i]. UB[i] and DB[i] vectors, which are derived from the uncompensated boundaries of the present layer, are compensated by an amount B[i] and C[i] respectively. UB[i] vectors which are derived from the DB[i]vectors of the present layer are compensated by an amount C[i]. This compensation can be done by shifting the vectors and recalculating end points or by shifting the end points initially. The value A[i] represents one-half the width of cure associated with curing of the LB[i] vectors, B[i] represents one-half the width of cure associated with the curing of the UB[i] vectors, and c[i] represents one-half the width of cure associated with the DB[i]vectors. Since many methods utilizing the techniques of layer comparison (especially those of the concurrently-filed applications) might lead to extreme variations in cure depth (and associated cure width) this alternative approach is most preferred so that individual regions can be more accurately compensated.

These principles can be illustrated with reference to FIGS. 33a–33f, in which like elements are referenced with like reference numerals.

Figure 33A:
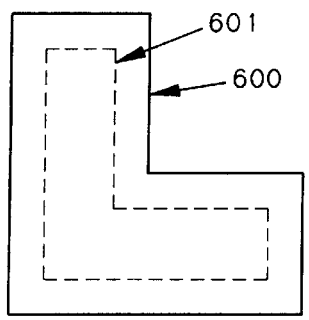
FIGS. 33a–33f illustrate an embodiment of cure width compensated to be utilized in conjunction with the subject invention.
Figure 33B:
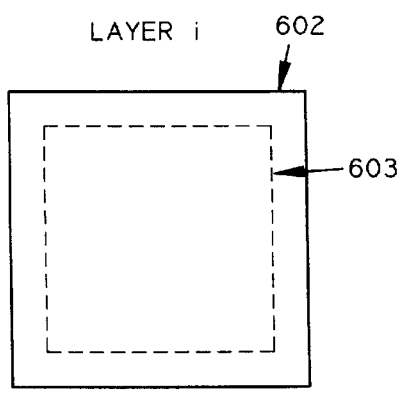
Figure 33C:
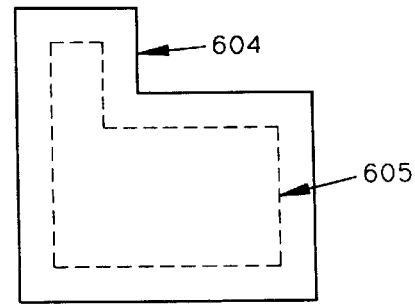

FIGS. 33a–33c illustrate the uncompensated layer boundaries, identified with reference numerals 60, 602, and 604, for layers i−1, i, and i+1, respectively, and the compensated layer boundaries, identified with reference numerals 601, 603, and 605, respectively, for these layers.

Figure 33D:
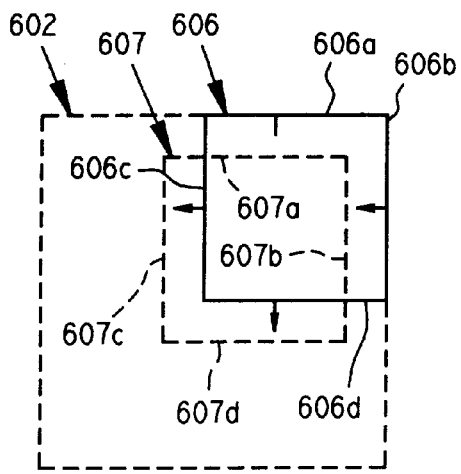

FIG. 33d illustrates compensating the vectors that make up the down-facing boundary for layer i. The uncompensated down-facing boundary is identified with numeral 606, and the desired compensated down-facing boundary is illustrated with numeral 607. As indicated, the vectors in the uncompensated down-facing boundary that do not touch the uncompensated layer boundary from the previous layer, identified with numerals 606a and 606b, are compensated inward to obtain compensated vectors 607a and 607b. By contrast, the vectors in the uncompensated down-facing boundary that do touch the uncompensated layer boundary from the previous layer, identified with numerals 606c and 606d in the figure, are compensated outward to obtain compensated vectors 607c and 607d.

Figure 33E:
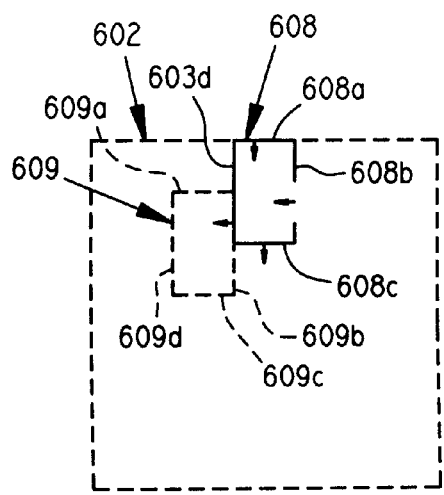

Turning to FIG. 33e, the compensation of the net up-facing vectors is illustrated. The uncompensated net up-facing boundary for layer i is identified with numeral 608, while the desired compensated boundary is illustrated with numeral 609. As indicated, the uncompensated net up-facing vectors which do not touch the uncompensated layer boundary from the previous layer, identified with numerals 608a and 608b in the figure, are compensated inward to obtain compensated vectors 609a and 609b, respectively. By contrast, the uncompensated net up-facing vectors which do touch the uncompensated layer boundary from the previous layer, identified with numerals 608c and 608d in the figure, are compensated outward to obtain compensated vectors 609c and 609d, respectively.

Figure 33F:
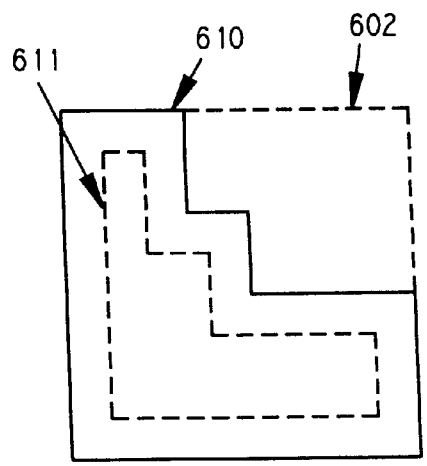

Turning to FIG. 33f, the uncompensated net layer boundary for layer i, identified with numeral 610, is compensated inward to obtain compensated net layer boundary 611.

While embodiments and applications of this invention have been shown and described, it should be apparent to those skilled in the art that many more modifications are possible without departing from the inventive concepts herein. The invention, therefore, is not to be restricted, except in the spirit of the appended claims.

What is claimed is:

1. A method for forming a desired layer representation of a three-dimensional object from initial layer representations of the three-dimensional object, for use in forming the object on a layer-by-layer basis, comprising:

supplying an initial layer representation of a first layer of the object;

supplying an initial layer representation of a second layer of the object, the second layer being spaced above the first layer;

forming a desired layer representation for a first selected one of the first and second layers, including performing a Boolean operation between the initial layer representation of the first selected one and the initial layer representation of a second selected one of the first and second layers, the second selected one being different from the first selected one; and supplying the desired layer representation for use in forming the first selected one of the first and second layers of the three-dimensional object.

2. A method according to claim 1, wherein the Boolean operation comprises forming a Boolean difference between the initial layer representation of the first selected one and the initial layer representation of a second selected one of the first and second layers, the second selected one being different from the first selected one.

3. A method according to claim 1, wherein the Boolean operation comprises forming a Boolean union between the initial layer representation of the first selected one and the initial layer representation of a second selected one of the first and second layers, the second selected one being different from the first selected one.

4. A method according to claim 1, wherein the Boolean operation comprises forming a Boolean intersection between the initial layer representation of the first selected one and the initial layer representation of a second selected one of the first and second layers, the second selected one being different from the first selected one.

5. A method according to claim 1, wherein the Boolean operation comprises forming a Boolean complement of one of the first and second initial layer representations different from the first selected one to form a modified layer representation, and performing a subsequent Boolean operation between the modified layer representation and the initial layer representation of the first selected one.

6. A method for forming a desired layer representation of a three-dimensional object from initial layer representations of the three-dimensional object, for use in forming the object on a layer-by-layer basis, comprising:

supplying an initial layer representation of a first layer of the object;

supplying an initial layer representation of a second layer of the object, the second layer being spaced above the first layer;

supplying an initial layer representation of a third layer of the object, the third layer being spaced above the second layer;

forming a modified representation for the second layer, including performing at lease one Boolean operation between the initial layer representations of the first, second and third layers;

forming a desired layer representation for the second layer from the modified representation of the second layer; and supplying the desired layer representation for use in forming the second layer of the three-dimensional object.

7. A method according to claim 6, wherein the modified representation is a non-outward-facing layer representation for the second layer, and the at least one Boolean operation comprises forming a Boolean intersection between the initial layer representations of the first, second and third layers.

8. A method according to claim 6, wherein the modified representation is an outward-facing layer representation for the second layer, and the at least one Boolean operation comprises forming a Boolean intersection between the initial layer representation of the first layer and the initial layer representation of the third layer, and then forming a Boolean difference between the Boolean intersection and the initial layer representation of the second layer.

9. An apparatus for forming a desired layer representation of a three-dimensional object from initial layer representations of the three-dimensional object, for use in forming the object on a layer-by-layer basis, comprising:

means for supplying an initial layer representation of a first layer of the object;

means for supplying an initial layer representation of a second layer of the object, the second layer being spaced above the first layer;

means for forming a desired layer representation for a first selected one of the first and second layers, including means for performing a Boolean operation between the initial layer representation of the first selected one and the initial layer representation of a second selected one of the first and second layers, the second selected one being different from the first selected one; and means for supplying the desired layer representation for use in forming the first selected one of the first and second layers of the three-dimensional object.

10. An apparatus according to claim 9, wherein the means for performing a Boolean operation comprises means for forming a Boolean difference between the initial layer representation of the first selected one and the initial layer representation of a second selected one of the first and second layers, the second selected one being different from the first selected one.

11. An apparatus according to claim 9, wherein the means for performing a Boolean operation comprises means for forming a Boolean union between the initial layer representation of the first selected one and the initial layer representation of a second selected one of the first and second layers, the second selected one being different from the first selected one.

12. An apparatus according to claim 9, wherein the means for performing a Boolean operation comprises means for forming a Boolean intersection between the initial layer representation of the first selected one and the initial layer representation of a second selected one of the first and second layers, the second selected one being different from the first selected one.

13. An apparatus according to claim 9, wherein the means for performing a Boolean operation comprises means for forming a Boolean complement of one of the first and second initial layer representations different from the first selected one to form a modified layer representation, and means for performing a subsequent Boolean operation between the modified layer representation and the initial layer representation of the first selected one.

14. An apparatus for forming a desired layer representation of a three-dimensional object from initial layer representations of the three-dimensional object, for use in forming the object on a layer-by-layer basis, comprising:

means for supplying an initial layer representation of a first layer of the object;

means for supplying an initial layer representation of a second layer of the object, the second layer being spaced above the first layer;

means for supplying an initial layer representation of a third layer of the object, the third layer being spaced above the second layer;

means for forming a modified representation for the second layer, including means for performing at least one Boolean operation between the initial layer representations of the first, second and third layers;

means for forming a desired layer representation of the second layer from the modified representation of the second layer; and means for supplying the desired layer representation for use in forming the second layer of the three-dimensional object.

15. An apparatus according to claim 14, wherein the modified representation is a non-outward-facing layer representation for the second layer, and the means for performing at least one Boolean operation comprises means for forming a Boolean intersection between the initial layer representations of the first, second and third layers.

16. An apparatus according to claim 14, wherein the modified representation is an outward-facing layer representation for the second layer, and the means for performing at least one Boolean operation comprises means for forming a Boolean intersection between the initial layer representation of the first layer and the initial layer representation of the third layer, and means for then forming a Boolean difference between the Boolean intersection and the initial layer representation of the second layer.

17. A method according to claim 1, further comprising:

performing line width compensation on the desired layer representation to obtain a compensated desired layer representation; and supplying the compensated desired layer representation for use in forming the first selected one of the first and second layers of the three-dimensional object.

18. A method according to claim 2, further comprising performing line width compensation on the desired layer representation to obtain a compensated desired layer representation; and supplying the compensated desired layer representation for use in forming the first selected one of the first and second layers of the three-dimensional object.

19. A method according to claim 3, further comprising performing line width compensation on the desired layer representation to obtain a compensated desired layer representation; and supplying the compensated desired layer representation for use in forming the selected one of the first and second layers of the three-dimensional object.

20. An apparatus according to claim 9, further comprising means for performing line width compensation on the desired layer representation to obtain a compensated desired layer representation; and means for supplying the compensated desired layer representation for use in forming the first selected one of the first and second layers of the three-dimensional object.

21. An apparatus according to claim 10, further comprising:

means for performing line width compensation on the desired layer representation to obtain a compensated desired layer representation; and means for supplying the compensated desired layer representation for use in forming the first selected one of the first and second layers of the three-dimensional object.

22. An apparatus according to claim 11, further comprising:

means for performing line width compensation on the desired layer representation to obtain a compensated desired layer representation; and means for supplying the compensated desired layer representation for use in forming the first selected one of the first and second layers of the three-dimensional object.

* * * * *